United States Patent
Sone et al.

(10) Patent No.: US 10,818,705 B2
(45) Date of Patent: Oct. 27, 2020

(54) METHOD FOR MANUFACTURING A FIELD EFFECT TRANSISTOR, METHOD FOR MANUFACTURING A VOLATILE SEMICONDUCTOR MEMORY ELEMENT, METHOD FOR MANUFACTURING A NON-VOLATILE SEMICONDUCTOR MEMORY ELEMENT, METHOD FOR MANUFACTURING A DISPLAY ELEMENT, METHOD FOR MANUFACTURING AN IMAGE DISPLAY DEVICE, AND METHOD FOR MANUFACTURING A SYSTEM

(71) Applicant: RICOH COMPANY, LTD., Tokyo (JP)

(72) Inventors: Yuji Sone, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Ryoichi Saotome, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 622 days.

(21) Appl. No.: 15/457,582

(22) Filed: Mar. 13, 2017

(65) Prior Publication Data

US 2017/0271381 A1 Sep. 21, 2017

(30) Foreign Application Priority Data

Mar. 18, 2016 (JP) .................. 2016-055243
Mar. 18, 2016 (JP) .................. 2016-055244
Mar. 8, 2017 (JP) .................. 2017-044427

(51) Int. Cl.
*H01L 27/12* (2006.01)
*H01L 21/02* (2006.01)
(Continued)

(52) U.S. Cl.
CPC ....... *H01L 27/1288* (2013.01); *G09G 3/2092* (2013.01); *H01L 21/02164* (2013.01);
(Continued)

(58) Field of Classification Search
CPC ............. H01L 27/1288; H01L 27/1248; H01L 27/1255; H01L 27/1225; H01L 21/02164;
(Continued)

(56) References Cited

U.S. PATENT DOCUMENTS 8,309,956 B2    11/2012   Arai et al.
9,112,039 B2    8/2015   Ueda et al.
(Continued)

FOREIGN PATENT DOCUMENTS

CN         1835256 A      9/2006
JP       2007-158146      6/2007
(Continued)

OTHER PUBLICATIONS

U.S. Appl. No. 15/032,192, filed Oct. 23, 2014.
(Continued)

*Primary Examiner* — Livius R. Cazan
(74) *Attorney, Agent, or Firm* — Oblon, McClelland, Maier & Neustadt, L.L.P.

(57) ABSTRACT

A method for manufacturing a field effect transistor including a gate-insulating layer, an active layer, and a passivation layer. The method includes a first process of forming the gate-insulating layer; and a second process of forming the passivation layer. At least one of the first process and the second process includes: forming a first oxide containing an alkaline earth metal and at least one of gallium, scandium, yttrium, and a lanthanoid; and etching the first oxide by use of a first solution containing at least one of hydrochloric, acid, oxalic acid, nitric acid, phosphoric acid, acetic acid, sulfuric acid, and hydrogen peroxide water.

20 Claims, 27 Drawing Sheets

(51) Int. Cl.
    *H01L 21/475*     (2006.01)
    *H01L 21/4757*     (2006.01)
    *H01L 29/786*     (2006.01)
    *H01L 29/66*     (2006.01)
    *G09G 3/20*     (2006.01)

(52) U.S. Cl.
    CPC .. *H01L 21/02178* (2013.01); *H01L 21/02554* (2013.01); *H01L 21/475* (2013.01); *H01L 21/47573* (2013.01); *H01L 27/1225* (2013.01); *H01L 27/1248* (2013.01); *H01L 27/1255* (2013.01); *H01L 29/66969* (2013.01); *H01L 29/7869* (2013.01); *G09G 2310/0264* (2013.01)

(58) Field of Classification Search
    CPC ......... H01L 21/02178; H01L 21/02554; H01L 21/475; H01L 21/47573
    See application file for complete search history.

(56) References Cited

U.S. PATENT DOCUMENTS

| | | | |
|---|---|---|---|
| 2004/0188385 | A1 | 9/2004 | Yamada et al. |
| 2006/0197102 | A1* | 9/2006 | Ogihara ............... G03G 15/326 257/99 |
| 2012/0104385 | A1 | 5/2012 | Godo et al. |
| 2012/0248451 | A1 | 10/2012 | Sone et al. |
| 2014/0339537 | A1 | 11/2014 | Bae |
| 2015/0349138 | A1 | 12/2015 | Sone et al. |
| 2016/0013215 | A1 | 1/2016 | Ueda et al. |
| 2016/0042947 | A1 | 2/2016 | Nakamura et al. |
| 2016/0190329 | A1 | 6/2016 | Matsumoto et al. |
| 2016/0267873 | A1* | 9/2016 | Saotome ............. H01L 29/7869 |

FOREIGN PATENT DOCUMENTS

| | | |
|---|---|---|
| JP | 2009-200506 | 9/2009 |
| JP | 2011-151370 | 8/2011 |
| JP | 5515281 | 6/2014 |
| JP | 2014-225627 | 12/2014 |
| JP | 2015-111653 | 6/2015 |
| TW | 201234593 A1 | 8/2012 |

OTHER PUBLICATIONS

May 15, 2018 Taiwanese official action (and English translation thereof) in connection with corresponding Taiwanese patent application No. 106108357.

Combined Chinese Office Action and Search Report dated Nov. 12, 2019 in Chinese Patent Application No. 201710153480.9 (with English translation), citing document AO therein, 13 pages.

* cited by examiner

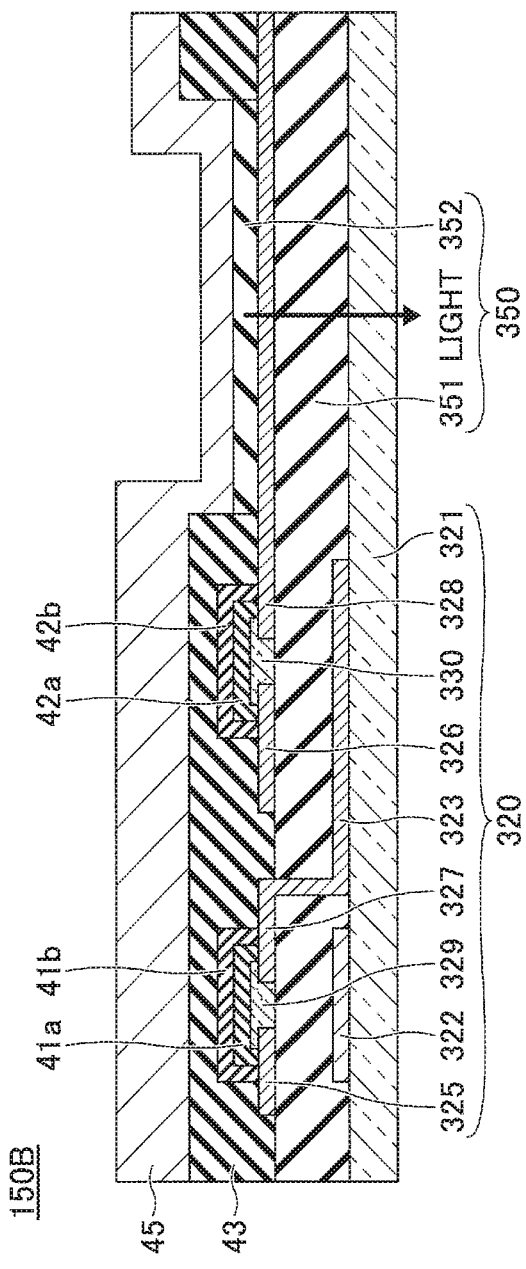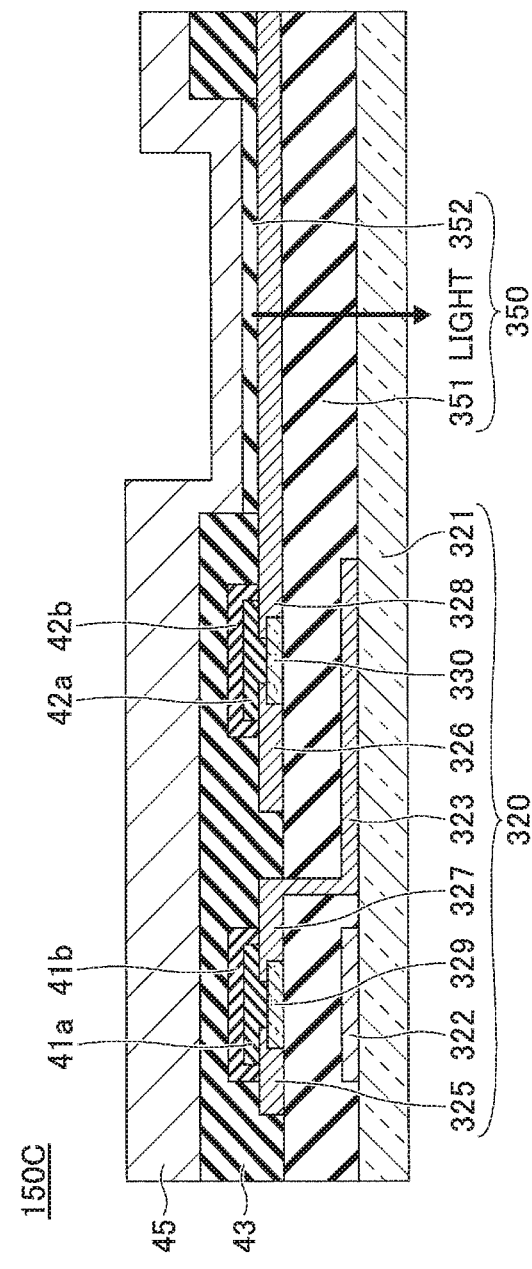
FIG.22A
FIG.22B

LIGHT

METHOD FOR MANUFACTURING A FIELD EFFECT TRANSISTOR, METHOD FOR MANUFACTURING A VOLATILE SEMICONDUCTOR MEMORY ELEMENT, METHOD FOR MANUFACTURING A NON-VOLATILE SEMICONDUCTOR MEMORY ELEMENT, METHOD FOR MANUFACTURING A DISPLAY ELEMENT, METHOD FOR MANUFACTURING AN IMAGE DISPLAY DEVICE, AND METHOD FOR MANUFACTURING A SYSTEM

CROSS-REFERENCE TO RELATED APPLICATIONS

The present application claims the benefit of priority under 35 U.S.C. § 119 of Japanese Patent Applications No. 2016-055243, filed Mar. 18, 2016, No. 2016-055244, filed Mar. 18, 2016, and No. 2017-044427, filed Mar. 8, 2017, the contents of which are incorporated herein by reference in their entirety.

BACKGROUND OF THE INVENTION

1. Field of the Invention

The present disclosure relates to methods for manufacturing a field effect transistor, methods for manufacturing a volatile semiconductor memory element, methods for manufacturing a non-volatile semiconductor memory element, methods for manufacturing a display element, methods for manufacturing an image display device, and methods for manufacturing a system.

2. Description of the Related Art

A field-effect transistor (FET) is a kind of semiconductor devices that controls the electric current between a source electrode and a drain electrode by applying a voltage to a gate electrode to provide a gate for the flow of electrons or holes depending on an electric field of a channel.

FETs are used as switching elements and amplifying elements due to their properties. Since an FET shows a small gate current and has a flat profile, it can be easily manufactured or integrated compared to a bipolar transistor. Therefore, FETs are now an indispensable element in an integrated circuit used in electronic devices.

Conventionally, a silicon-based insulating layer had been widely used for a gate-insulating layer of an FET. However, in recent years, with an increasing demand for more advanced integration and lower energy consumption of an FET, a technique has been studied to employ a so-called high-k insulating film, which has far higher dielectric constant than a silicon-based insulating film, for forming a gate-insulating layer. For example, an FET and semiconductor memory having a gate-insulating layer formed by oxide containing alkaline earth metal and an element selected from among gallium (Ga), scandium (Sc), yttrium (Y), and a lanthanoid has been disclosed (see, for example, Japanese Unexamined Patent Application Publication No. 2011-151370).

In addition, oxide containing alkaline earth metal and a rare earth element (i.e. Sc, Y, a lanthanoid) has reliable barrier performance. Thus, an FET provided having a passivation layer formed by oxide containing alkaline earth metal and a rare earth element has been disclosed (see, for example, Japanese Unexamined Patent Application Publication No. 2015-111653).

SUMMARY OF THE INVENTION

One aspect of the present invention provides a method for manufacturing a field effect transistor including a gate-insulating layer, an active layer, and a passivation layer. The method includes a first process of forming the gate-insulating layer; and a second process of forming the passivation layer. At least one of the first process and the second process includes: forming a first oxide containing an alkaline earth metal and at least one of gallium, scandium, yttrium, and a lanthanoid; and etching the first oxide by use of a first solution containing at least one of hydrochloric acid, oxalic acid, nitric acid, phosphoric acid, acetic acid, sulfuric acid, and hydrogen peroxide water.

BRIEF DESCRIPTION OF THE DRAWINGS

FIGS. 22A and 22B are (second) cross-sectional views for explaining configurations of organic EL display elements according to the eleventh embodiment and methods for manufacturing the organic EL display elements according to the eleventh embodiment;

DESCRIPTION OF THE EMBODIMENTS

Figure 1:
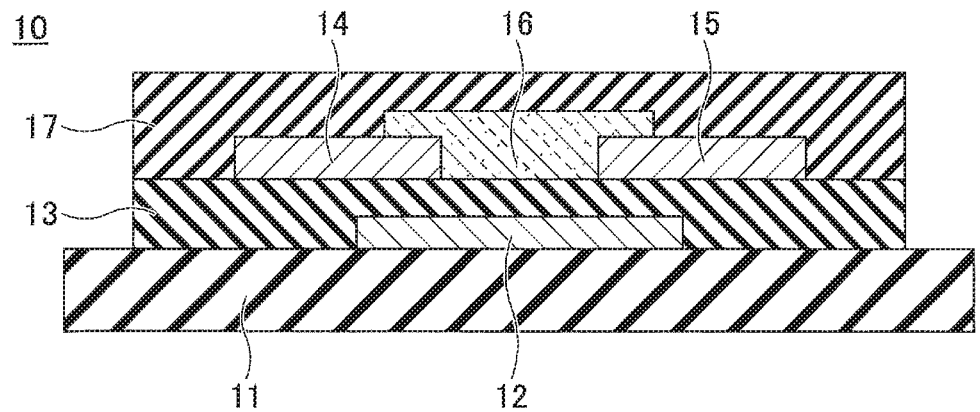
FIG. 1 is a cross-sectional view illustrating an example of an FET according to a first embodiment.

With respect to methods for performing patterning on oxide containing alkaline earth metal and an element selected from among Ga, Sc, Y, and a lanthanoid, a photolithography process with dry-etching has been disclosed in Japanese Unexamined Patent Application Publication No. 2011-151370. However, dry-etching is not preferable in terms of usage of dangerous gas, damage to the environment, costs for required apparatuses, etc. Therefore, for performing patterning, a photolithography process with wet-etching is preferred.

By the way, by use of hydrofluoric-acid-based etchant, it is possible to perform wet-etching on a silicon-based insulating film (e.g. $SiO_2$ and SiON), which has been conventionally in wide use for a gate-insulating layer and a passivation layer. However, there have been no reports regarding solution to be successfully used for performing wet-etching on oxide containing alkaline earth metal and a rare earth element. Therefore, in a case where a gate-insulating layer or a passivation layer is formed by oxide containing alkaline earth metal and an element selected from among Ga, Sc, Y, and a lanthanoid, it has been difficult to perform patterning in a photolithography process with wet-etching.

Therefore, for processes for manufacturing an FET having a gate-insulating layer or a passivation layer formed by oxide containing alkaline earth metal and an element selected from among Ga, Sc, Y, and a lanthanoid, it is desired that a gate-insulating layer or a passivation layer is formed in a photolithography process with wet-etching.

The object of the present invention is to perform patterning, by use of wet-etching, on a layer formed by a first oxide containing an alkaline earth metal and at least one of Ga, Sc, Y, and a lanthanoid, in methods for manufacturing an FET having a gate-insulating layer and/or a passivation layer formed by the first oxide.

According to the technique disclosed in the present application, it is possible to perform patterning, by use of wet-etching, on a layer formed by a first oxide containing an alkaline earth metal and at least one of Ga, Sc, Y, and a lanthanoid, in methods for manufacturing an FET having a gate-insulating layer and/or a passivation layer formed by the first oxide.

The following description explains embodiments of the present invention, with reference to accompanying drawings. In each of the drawings, the same constituent elements may be assigned the same reference symbols, so as to omit duplicate explanations.

Inventors of the present invention have found that it is possible to perform etching on a first oxide containing Element-A (i.e. alkaline earth metal) and Element-B (i.e. at least one of Ga, Sc, Y, and a lanthanoid), by bringing the first oxide into contact with a first solution including at least one of hydrochloric acid, oxalic acid, nitric acid, phosphoric acid, acetic acid, sulfuric acid, and hydrogen peroxide solution. Each of the following embodiments stands on the above knowledge of the inventors.

First Embodiment

[Configuration of FET]

FIG. 1 is a cross-sectional view illustrating an example of an FET according to the first embodiment. According to FIG. 1, an FET 10 is a bottom-gate/bottom-contact FET including a substrate 11, a gate-electrode 12, a gate-insulating layer 13, a source-electrode 14, a drain-electrode 15, an active layer 16, and a passivation layer 17. Note that, the FET 10 is a typical example of a semiconductor device according to the present invention.

Further, the passivation layer according to the present invention is a layer having a function to separate/protect at least an active layer (i.e. a semiconductor layer) from moisture, oxygen, hydrogen, etc., in the atmosphere. Additionally, not only an active layer, the passivation layer may have a function to protect other constituent elements (e.g. a gate-insulating layer, a source-electrode, a drain-electrode, a gate-electrode, etc.) of an FET. One function of the passivation layer according to the present invention is to protect an FET (or at least a part of an FET) from material of layers to be formed on the FET and to protect an FET (or at least a part of an FET) in processes for forming the layers.

Furthermore, the passivation layer of an FET is considered to be one of constituent elements of the FET, no matter where the passivation layer is formed; even though the passivation layer is physically apart from the other constituent elements of the FET via, for example, an EL element, etc. That is to say, for example, a passivation layer formed after forming an EL element, etc., a passivation layer formed in proximity to an interlayered insulating film, etc., are considered to be a passivation layer of an FET.

Furthermore, the passivation layer may be referred to as a protection layer.

The FET 10 includes the gate-electrode 12 formed on the substrate 11, which has insulating property, and includes the gate-insulating layer 13 formed so as to cover the gate-electrode 12. Furthermore, the source-electrode 14 and the drain-electrode are formed on the gate-insulating layer 13, and the active layer 16 is formed so as to partially cover the source-electrode 14 and the drain-electrode 15. The source-electrode 14 and the drain-electrode 15 are formed at a predetermined distance via the active layer 16, which turns into a channel region. Furthermore, the passivation layer 17 is formed, over the gate-insulating layer 13, so as to cover the source-electrode 14, the drain-electrode 15, and the active layer 16. The following description further explains each of the constituent elements of the FET 10.

Note that, in the first embodiment, as a matter of convenience, the surface of the FET 10 formed by the passivation layer 17 is referred to be on the top side, or one side, whereas the surface of the FET 10 formed by the substrate 11 is referred to be on the bottom side, or another side. In addition, the surface of each element facing the passivation layer 17 is referred to as a top surface, or one surface, whereas the surface of each element facing the substrate 11 is referred to as a bottom surface, or another surface. Note that, the FET 10 may be used upside-down, and may be arranged at an arbitrarily selected angle. In addition, a planar view is a way of viewing an object from a position in a normal direction to the top surface of the substrate 11. Further, a planar shape is a shape of an object viewed from a position in the normal direction to the top surface of the substrate 11.

There is no specific limitation regarding shapes, configurations, and sizes of the substrate 11; a shape, configuration, and size of the substrate 11 may be selected properly in accordance with an intended purpose. There is no specific limitation regarding material for the substrate 11; material may be selected properly in accordance with an intended purpose. For example, material for the substrate 11 may be glass base material, ceramic base material, plastic base material, film base material, etc.

There is no specific limitation regarding glass base material; glass base material may be selected properly in accordance with an intended purpose. For example, glass base material may be alkali-free glass, silica glass, etc. Furthermore, there is no specific limitation regarding plastic base material and film base material; plastic base material and film base material may be selected properly in accordance with an intended purpose. For example, plastic base material and film base material may be polycarbonate (PC), polyimide (PI), polyethylene terephthalate (PET), polyethylene naphthalate (PEN), etc.

The gate-electrode 12 is formed on a predetermined region of the substrate 11. The gate-electrode 12 is an electrode to which a gate-voltage is applied. There is no specific limitation regarding material for the gate-electrode 12; material for the gate-electrode 12 may be selected properly in accordance with an intended purpose. For example, material for the gate-electrode 12 may be metal such as aluminum (Al), platinum (Pt), palladium (Pd), gold (Au), silver (Ag), copper (Cu), zinc (Zn), nickel (Ni), chromium (Cr), tantalum (Ta), molybdenum (Mo), or titanium (Ti), and may be an alloy of such metal or blended material containing such metal, etc. Further, the material for the gate-electrode 12 may be conductive oxide such as indium oxide, zinc oxide, tin oxide, gallium oxide, or niobium oxide, and may be a complex compound of such conductive oxide or blended material containing such conductive oxide, etc. Further, the material for the gate-electrode 12 may be an organic conductor such as polyethylenedioxythiophene (PEDOT) or polyaniline (PANI), etc. There is no specific limitation regarding average film thickness of the gate-electrode 12; film thickness may be selected properly in accordance with an intended purpose. However, preferable film thickness is in a range of 10 nm or more and 1 μm or less, and more preferably is in a range of 50 nm or more and 300 nm or less.

The gate-insulating layer 13 is a layer disposed between the gate-electrode 12 and the active layer 16, to insulate the gate-electrode 12 from the active layer 16. There is no specific limitation regarding average film thickness of the gate-insulating layer 13; film thickness may be selected properly in accordance with an intended purpose. However, preferable film thickness is in a range of 50 nm or more and 3 μm or less, and more preferably is in a range of 100 nm or more and 1 μm or less.

The source-electrode 14 and the drain-electrode 15 are formed on the gate-insulating layer 13. The source-electrode 14 and the drain-electrode 15 are formed at a predetermined distance apart. The source-electrode 14 and the drain-electrode 15 are electrodes for passing an electric current in response to application of a gate-voltage to the gate-electrode 12. Note that, wires connecting to the source-electrode 14 and the drain-electrode 15 may be formed on the same layer, together with the source-electrode 14 and the drain-electrode 15.

There is no specific limitation regarding material for the source-electrode 14 and drain-electrode 15; material for the source-electrode 14 and drain-electrode 15 may be selected properly in accordance with intended purposes. For example, the material for the source-electrode 14 and drain-electrode 15 may be metal such as Al, Pt, Pd, Au, Ag, Cu, Zn, Ni, Cr, Ta, Mo, or Ti, and may be an alloy of such metal or blended material containing such metal.

Further, the material for the source-electrode 14 and drain-electrode 15 may be conductive oxide such as indium oxide, zinc oxide, tin oxide, gallium oxide, or niobium oxide, and may be a complex compound of such conductive oxide or blended material containing such conductive oxide. Further, the material for the source-electrode 14 and drain-electrode 15 may be an organic conductor such as PEDOT or PANI. There is no specific limitation regarding average film thickness of the source-electrode 14 and the drain-electrode 15; film thickness may be selected properly in accordance with intended purposes. However, preferable film thickness is in a range of 10 nm or more and 1 μm or less, and more preferably is in a range of 50 nm or more and 300 nm or less.

The active layer 16 is formed, on the gate-insulating layer 13, so as to partially cover the source-electrode 14 and the drain-electrode 15. The active layer 16 between the source-electrode 14 and the drain-electrode 15 turns into a channel region. There is no specific limitation regarding average film thickness of the active layer 16; film thickness may be selected properly in accordance with an intended purpose. However, preferable film thickness is in a range of 5 nm or more and 1 μm or less, and more preferably is in a range of 10 nm or more and 0.5 μm or less.

There is no specific limitation regarding material for the active layer 16; material for the active layer 16 may be selected properly in accordance with an intended purpose. For example, the material for the active layer 16 may be an oxide semiconductor such as polycrystalline silicon (p-Si), amorphous silicon (a-Si), or In—Ga—Zn—O, and may be an organic semiconductor such as pentacene. Among such materials, an oxide semiconductor is preferred, in view of stability of the boundary of the gate-insulating layer 13 and the first passivation layer 17.

The passivation layer 17 is formed, over the gate-insulating layer 13, so as to cover the source-electrode 14, the drain-electrode 15, and the active layer 16. There is no specific limitation regarding average film thickness of the passivation layer 17; film thickness may be selected properly in accordance with an intended purpose. However, preferable film thickness is in a range of 50 nm or more and 3 μm or less, and more preferably is in a range of 100 nm or more and 1 μm or less. Note that, although the planar figure of the passivation layer 17 corresponds to that of the gate-insulating layer 13 in FIG. 1, the planar figure of the passivation layer 17 is not limited to as such. For example, the planar figure of the passivation layer 17 may be smaller than that of the gate-insulating layer 13. Further, the planar figure of the passivation layer 17 may be larger than that of the gate-insulating layer 13, so that the passivation layer 17 covers the side surfaces of the gate-insulating layer 13.

At least one of the gate-insulating layer 13 and the passivation layer 17 is formed by oxide. Oxide used in embodiments (hereinafter referred to as "first oxide") contains Element-A (i.e. alkaline earth metal) and Element-B (i.e. at least one of Ga, Sc, Y, and a lanthanoid), and may contain other elements, if needed. Alkaline earth metal contained in the first oxide may be one kind, and may be two or more kinds.

Alkaline earth metal may be berylium (Be), magnesium (Mg), calcium (Ca), strontium (Sr), barium (Ba), radium (Ra).

a lanthanoid may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu).

The first oxide is preferred to be paraelectric amorphous oxide. Paraelectric amorphous oxide is stable in the atmosphere, and capable of steadily forming an amorphous structure in a large composition range. However, the first oxide may partly contain crystalline material.

It is preferable, for improving properties of a transistor, that the gate-insulating layer 13 is formed by amorphous material. In a case where the gate-insulating layer 13 is formed by crystalline material, leakage current caused by grain boundaries is difficult to be reduced, which may lead to deterioration in properties of a transistor.

Furthermore, it is necessary that the gate-insulating layer 13 is formed by paraelectric material, in order to reduce hysteresis with respect to a transferring property of a transistor. Except for particular cases where, for example, a transistor is used as a memory, etc., existence of hysteresis is commonly undesirable for a device having a transistor for a switching property.

Paraelectric material is dielectric material other than piezoelectric, pyroelectric, or ferroelectric material. In other words, paraelectric material is dielectric material that is not polarized by pressure or is not intrinsically polarized in the absence of an external electric field. Furthermore, piezoelectric, pyroelectric, and ferroelectric material are supposed to be crystalline, for appearance of properties. That is to say, the gate-insulating layer 13 formed by amorphous material is inevitably paraelectric.

Alkaline earth metal oxide easily reacts with moisture, carbon dioxide, etc., in the atmosphere and is easily converted into hydroxide or carbonate. Therefore, alkaline earth metal oxide is not suitable for being applied to an electronic device by itself. Furthermore, simple oxide such as Ga, Sc, Y, or a lanthanoid easily crystalizes, which causes a problem concerning leakage current. However, the first oxide containing Element-A (i.e. alkaline earth metal) and Element-B (i.e. at least one of Ga, Sc, Y, and a lanthanoid) is capable of steadily forming a paraelectric amorphous film in the atmosphere in a large composition range, and therefore is suitable for the gate-insulating layer 13.

Ce has a valence of 4, which is exceptional among lanthanoids, and forms a crystal of a perovskite structure in combination with alkaline earth metal. Therefore, Element-B is preferred not to be Ce, for obtaining an amorphous phase.

Although a crystal phase in a spinel structure, etc., may exist with respect to oxide containing alkaline earth metal and Ga, such a crystal is deposited only in a high temperature (i.e. more than 1000° C. in general), compared to a crystal in a perovskite structure. Furthermore, as existence of a stable crystal phase has not been reported with respect to oxide containing alkaline earth metal and Sc, Y, or a lanthanoid, crystal deposition from an amorphous phase hardly occurs even though a subsequent step is performed in high temperature. Furthermore, with respect to oxide containing alkaline earth metal and Ga, Sc, M, or a lanthanoid, an amorphous phase is more stable when the oxide is constituted by three or more kinds of metal elements.

In terms of producing a high dielectric constant material, the composition ratio of elements such as Ba, Sr, Lu, and La is preferred to be increased. Furthermore, the first oxide may be used for material for the passivation layer 17, because of having reliable barrier performance against moisture, oxygen, etc., in the atmosphere.

Furthermore, the first oxide is preferred to contain Element-C (i.e. a third element), which is at least one of Al, Ti, zirconium (Zr), hafnium (Hf), niobium (Nb), and Ta, in order to further stabilize an amorphous phase and improve thermal stability, thermal resistance, and density.

There is no specific limitation regarding the composition ratio of Element-A (i.e. alkaline earth metal) and Element-B (i.e. at least one of Ga, Sc, Y, and a lanthanoid) contained in the first oxide; the composition ratio may be selected properly in accordance with an intended purpose. However, the composition ratio is preferred to be in a range as described below.

The composition ratio (Element-A:Element-B) of Element-A (i.e. alkaline earth metal) and Element-B (i.e. at least one of Ga, Sc, Y, and a lanthanoid) contained in the first oxide is preferred to be: 10.0 mol % or more and 67.0 mol % or less: 33.0 mol % or more and 90.0 mol % or less, in terms of oxide (e.g. BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$).

There is no specific limitation regarding the composition ratio of Element-A (i.e. alkaline earth metal), Element-B (i.e. at least one of Ga, Sc, Y, and a lanthanoid) and Element-C (i.e. at least one of Al, Ti, Zr, Hf, Nb, and Ta) contained in the first oxide; the composition ratio may be selected properly in accordance with an intended purpose. However, the composition ratio is preferred to be in a range as described below.

The composition ratio (Element-A:Element-B: Element-C) of Element-A (i.e. alkaline earth metal), Element-B (i.e. at least one of Ga, Sc, Y, and a lanthanoid), and Element-C (i.e. at least one of Al, Ti, Zr, Hf, Nb, and Ta) contained in the first oxide is preferred to be; 5.0 mol % or more and 22.0 mol % or less: 33.0 mol % or more and 90.0 mol % or less: 5.0 mol % or more and 45.0 mol % or less, in terms of oxide (e.g. BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $Al_2O_3$, $TiO_2$, $ZrO_2$, $HfO_2$, $Nb_2O_5$, and $Ta_2O_5$).

The proportion of oxides (e.g. BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $Al_2O_3$, $TiO_2$, $ZrO_2$, $HfO_2$, $Nb_2O_5$, and $Ta_2O_5$) constituting the first oxide may be calculated through an analysis of cationic elements included in oxide by means of a fluorescent X-ray analysis, an electron probe micro analyzer (EPMA), inductively coupled plasma atomic emission spectrometry (ICP-AES), etc.

In a case where the gate-insulating layer 13 is formed by the first oxide, there is no specific limitation regarding material for the passivation layer 17. For example, an inorganic oxide film such as $SiO_2$, SiON, or SiN may be used. Similarly, in a case where the passivation layer 17 is formed by the first oxide, there is no specific limitation regarding material for the gate-insulating layer 13. For example, an inorganic oxide film such as $SiO_2$, SiON, or SiN may be used. However, the first oxide may be used for both of the gate-insulating layer 13 and the passivation layer 17. In such a case, the boundary of the gate-insulating layer 13 and the first passivation layer 17 is more stable, and therefore the gate-insulating layer 13 and the first passivation layer 17 are likely to have more reliable properties.

[Method for Manufacturing the FET]

The following description explains a method for manufacturing the FET illustrated in FIG. 1. FIGS. 2A through 3C are drawings illustrating examples of steps for manufacturing the FET according to the first embodiment.

Figure 2A:
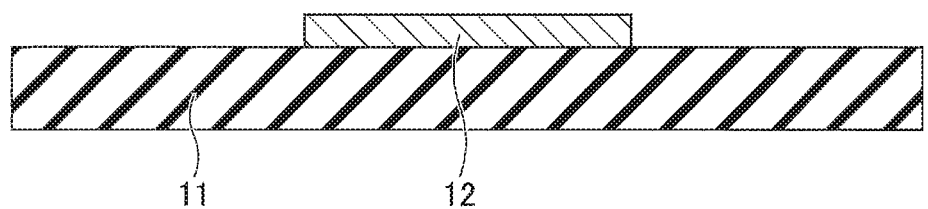
FIGS. 2A through 2D are (first) drawings illustrating examples of steps for manufacturing the FET according to the first embodiment.

First, at a step illustrated in FIG. 2A, the substrate 11 is prepared. Subsequently, a conductive film is formed on the substrate 11 by means of a vacuum vapor deposition method, etc., and then patterning is performed on the conductive film by means of photolithography and etching, in order to form the gate-electrode 12 in a predetermined shape. For cleaning surfaces and improving adhesion of the substrate 11, a pre-process such as oxygen plasma cleaning, ultra-violet (UV) ozone cleaning, or UV irradiation cleaning is preferred to be performed before forming the gate-electrode 12. As described above, material and thickness of the substrate 11 and the gate-electrode 12 may be selected properly.

There is no specific limitation regarding methods for forming the gate-electrode 12; the method may be selected properly in accordance with an intended purpose. For example, film formation may be performed by means of a sputtering method, a vacuum vapor deposition method, a dip-coating method, a spin-coating method, a die-coating method, etc., and then patterning may be performed by means of photolithography. For another example, film formation may be performed by means of a printing process such as inkjet printing, nanoimprinting, or gravure printing, so that a desired shape is directly formed.

Figure 2B:
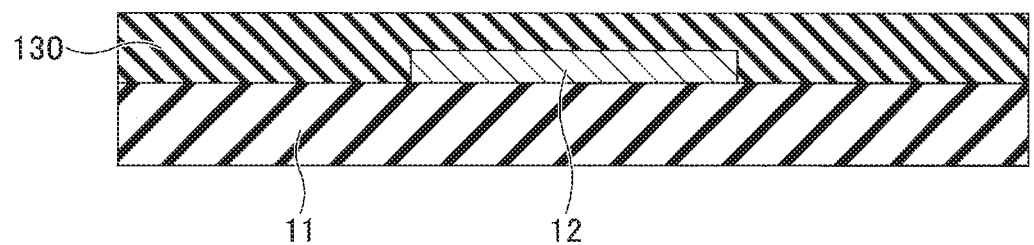

Then, at a step illustrated in FIG. 2B, an insulating layer 130 (i.e. a layer to be ultimately formed into the gate-insulating layer 13) is formed over the substrate 11, so as to cover the gate-electrode 12. There is no specific limitation regarding methods for forming the gate-insulating layer 130; a method may be selected properly in accordance with an intended purpose. For example, film formation may be performed by means of a vacuum process such as a sputtering method, a pulse laser deposition (PLD) method, a chemical vapor deposition (CVD) method, and an atomic layer deposition (ALD) method, or by means of a solution process such as a dip-coating method, a spin-coating method, and a die-coating method. For another example, film formation may be performed by means of a printing process such as inkjet printing, nanoimprinting, and gravure printing. Material and thickness of the insulating layer 130 is as explained in the description regarding the gate-insulating layer 13.

Figure 2C:
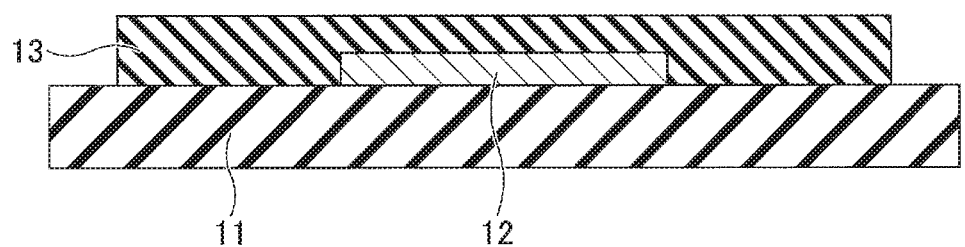

Then, at a step illustrated in FIG. 2C, patterning is performed on the insulating layer 130, which is formed over the substrate 11, by means of photolithography and wet-etching, so as to form the gate-insulating layer 13 in a predetermined shape. Specifically, first, an etching-mask is formed on the insulating layer 130. There is no specific limitation regarding the etching-mask. For example, the etching-mask may be formed by performing spin-coating, pre-baking, exposing, developing, and postbaking on resist material in general. For another example, a metal-pattern or an oxide-pattern formed by means of a photolithography process may be used for a mask.

After the mask is formed, the gate-insulating layer 13 is formed by performing etching on the insulating layer 130. It is possible to perform etching on the first oxide constituting the gate-insulating layer 13 by bringing the oxide into contact with solution (hereinafter referred to as "first solution") containing at least one of hydrochloric acid, oxalic acid, nitric acid, phosphoric acid, acetic acid, sulfuric acid, and hydrogen peroxide water. Specifically, the etching method may be soaking the first oxide in the first solution containing at least one of hydrochloric acid, oxalic acid, nitric acid, phosphoric acid, acetic acid, sulfuric acid, and hydrogen peroxide water, or may be dripping the first solution containing at least one of oxalic acid, nitric acid, phosphoric acid, acetic acid, sulfuric acid, and hydrogen peroxide water onto the first oxide, and then spinning the substrate 11, etc.

Concentration of hydrochloric acid is preferred to be in a range of 0.001 mol/L or more and 6 mol/L or less, and more preferably in a range from 0.01 mol/L or more and 1 mol/L or less. Concentration of oxalic acid is preferred to be in a range of 0.1% or more and 10% or less, and more preferably in a range of 1% or more and 5% or less. Concentration of nitric acid is preferred to be in a range of 0.1% or more and 40% or less, and more preferably in a range of 1% or more and 20% or less. Concentration of phosphoric acid is preferred to be in a range of 1% or more and 90% or less, and more preferably in a range of 10% or more and 80% or less. Concentration of acetic acid is preferred to be in a range of 0.1% or more and 80% or less, and more preferably in a range of 1% or more and 50% or less. Concentration of sulfuric acid is preferred to be in a range of 0.1% or more and 50% or less, and more preferably in a range of 1% or more and 20% or less. Concentration of hydrogen peroxide water is preferred to be in a range of 0.1% or more and 20% or less, and more preferably in a range from 1% or more and 10% or less. Among solution of the above components, hydrochloric acid and mixed solution containing phosphoric acid and nitric acid are preferable because of high resolvability to the first oxide.

After the insulating layer 130 is formed into the gate-insulating layer 13 by means of etching, the mask is removed. There is no specific limitation regarding a step for removing the mask. For example, the mask may be soaked in solution that dissolves the mask, in order to be removed.

Figure 2D:
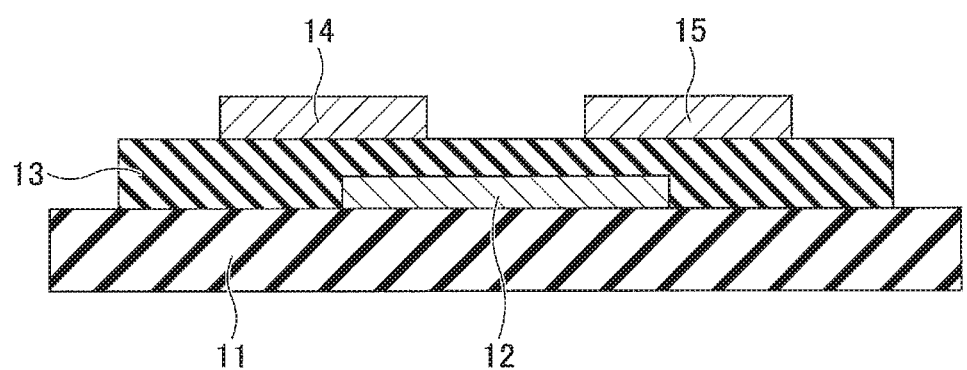

Then, at a step illustrated in FIG. 2D, the source-electrode 14 and the drain-electrode 15 having predetermined shapes are formed on the gate-insulating layer 13. For cleaning surfaces and improving adhesion of the gate-insulating layer 13, a pro-process such as oxygen plasma cleaning, UV ozone cleaning, or UV irradiation cleaning is preferred to be performed before forming the source-electrode 14 and the drain-electrode 15.

There is no specific limitation regarding methods for forming the source-electrode 14 and the drain-electrode 15; a method may be selected properly in accordance with intended purposes. For example, film formation may be performed in a sputtering method, a vacuum vapor deposition method, a dip-coating method, a spin-coating method, a die-coating method, etc., and then patterning may be performed by means of photolithography. For another example, film formation may be performed by means of a printing process such as inkjet printing, nanoimprinting, and gravure printing, so that desired shapes are directly formed. Material and thickness of the source-electrode 14 and the drain-electrode 15 may be properly selected, as described above.

Figure 3A:
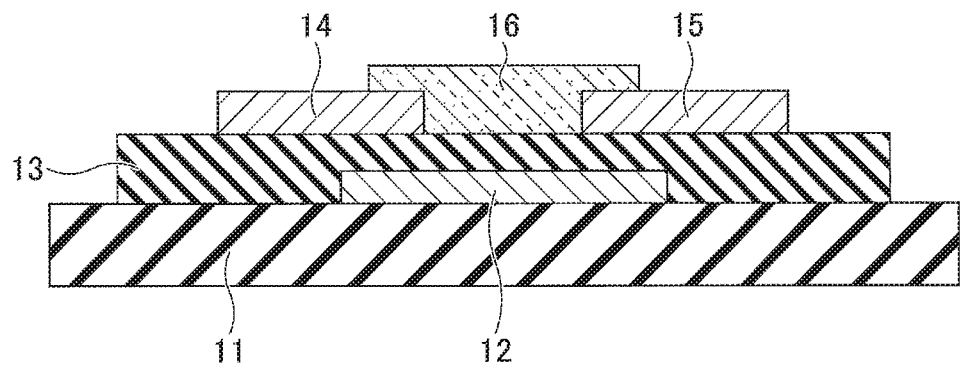
FIGS. 3A through 3C are (second) drawings illustrating examples of steps for manufacturing the FET according to the first embodiment.

Then, at a step illustrated in FIG. 3A, the active layer 16 having a predetermined shape is formed on the gate-insulating layer 13. There is no specific limitation regarding methods for forming the active layer 16; a method may be selected properly in accordance with an intended purpose. For example, film formation may be performed in a sputtering method, a vacuum vapor deposition method, a dip-coating method, a spin-coating method, a die-coating method, etc., and then patterning may be performed by means of photolithography. For another example, film formation may be performed in a printing process such as inkjet printing, nanoimprinting, and gravure printing, so that a desired shape is directly formed. Material and thickness of the active layer 16 may be properly selected, as described above.

Figure 3B:
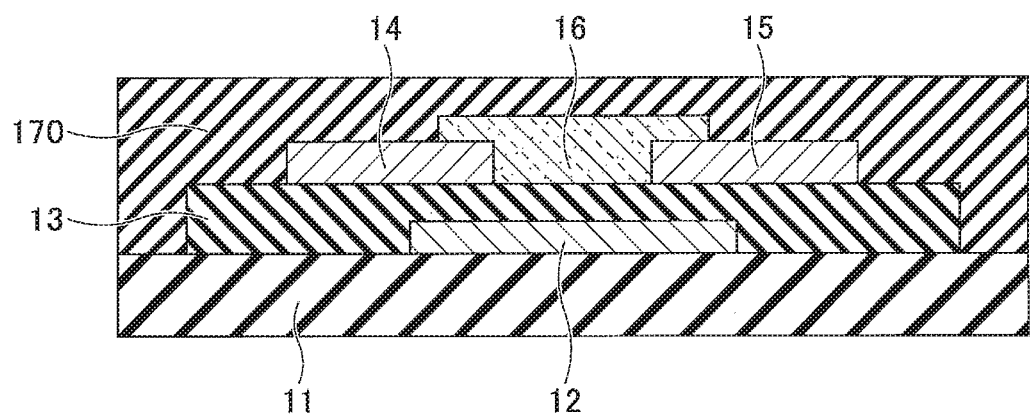

Then, at a step illustrated in FIG. 3B, an insulating layer 170 (i.e. a layer to be ultimately formed into the passivation layer 17) is formed over the substrate 11 and the gate-insulating layer 13, so as to cover the source-electrode 14, the drain-electrode 15, and the active layer 16. There is no specific limitation regarding methods for forming the insulating layer 170; a method may be selected properly in accordance with an intended purpose. For example, film formation may be performed in a vacuum process such as a sputtering method, a PLD method, a CVD method, or an ALD method, or may be performed in a solution process such as a dip-coating method, a spin-coating method, or a die-coating method. For another example, film formation may be performed in a printing process such as inkjet printing, nanoimprinting, and gravure printing. Material and thickness of the insulating layer 170 is as explained in the description regarding the passivation layer 17.

Figure 3C:
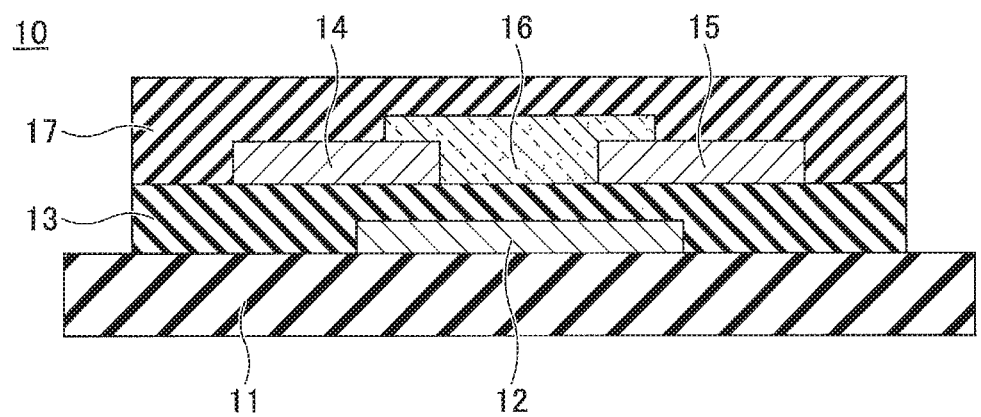

Then, at a step illustrated in FIG. 3C, patterning is performed on the insulating layer 170, which is formed over the substrate 11 and the gate-insulating layer 13, by means of photolithography and wet-etching, so as to form the passivation layer 17 in a predetermined shape. A specific method is the same as the method for forming the insulating layer 130 into the gate-insulating layer 13 illustrated in FIG. 2C.

Through the above steps, a bottom-gate/bottom-contact FET 10 may be manufactured.

As described above, according to the first embodiment, at least one of the gate-insulating layer 13 and the passivation layer 17 is formed by the first oxide containing Element-A (i.e. alkaline earth metal) and Element-B (i.e. at least one of Ga, Sc, Y, and a lanthanoid). Furthermore, for patterning the first oxide into a predetermined shape, wet-etching is performed by use of the first solution containing at least one of hydrochloric acid, oxalic acid, nitric acid, phosphoric acid, acetic acid, sulfuric acid, and hydrogen peroxide water.

It is possible to preferably form the gate-insulating layer 13 and the passivation layer 17 by means of wet-etching using the first solution. Here, conventional dry-etching, which involves problems relating to usage of dangerous gas, damage to the environment, costs for required apparatuses, etc., need not be performed.

Furthermore, usage of the first oxide for the gate-insulating layer 13 enables driving of the FET with low voltage (or low energy consumption), because dielectric constant of the first oxide is in a range of 6 to 20, which is higher than that of an $SiO_2$ film. Furthermore, usage of the first oxide for the passivation layer 17 enables producing a highly reliable FET, because the first oxide has a high barrier performance.

That is to say, usage of the first oxide for at least one of the gate-insulating layer 13 and the passivation layer 17 and usage of wet-etching on the first oxide enable producing a high quality (i.e. with low energy consumption and high reliability) FET with low cost, high safety, and little damage to the environment.

Modifications of the First Embodiment

The following description regarding modifications of the first embodiment explains an example of an FET having a different layer configuration, compared to the first embodiment. Note that, in the description of the modifications of the first embodiment, explanation of the same configuration already explained in the above description may be omitted.

Figure 4A:
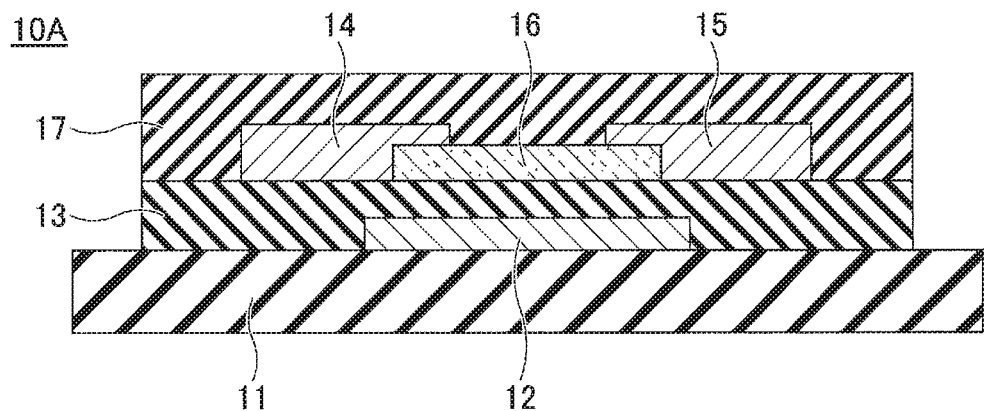
FIGS. 4A through 4C are cross-sectional views illustrating examples of FETs according to modifications of the first embodiment.
Figure 4B:
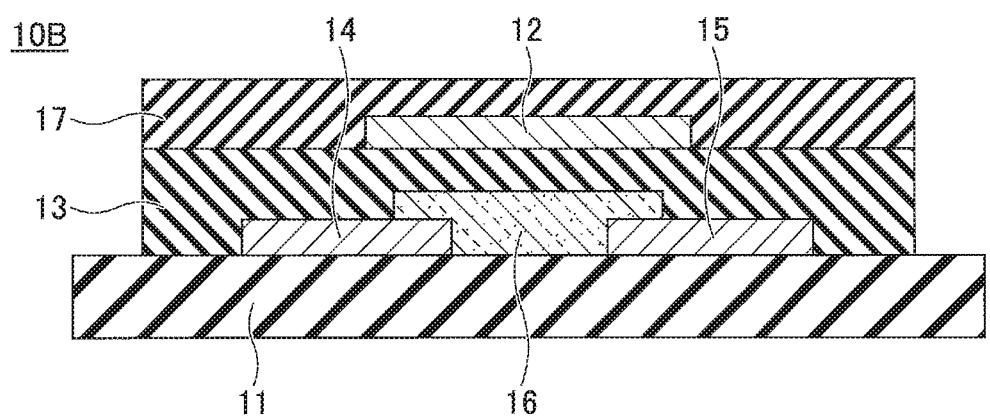
Figure 4C:
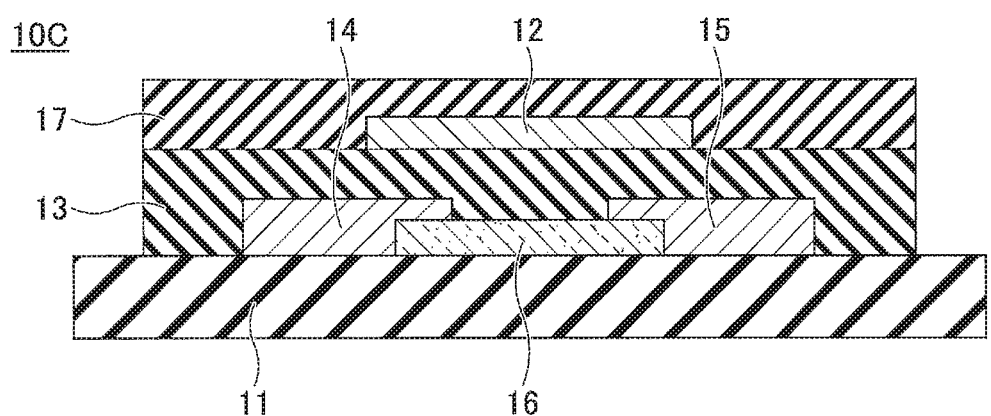

FIGS. 4A through 4C are cross-sectional views illustrating examples of the FETs according to the modifications of the first embodiment. The FETs illustrated in FIGS. 4A through 4C are typical examples of a semiconductor device according to the present invention.

An FET 10A illustrated in FIG. 4A is a bottom-gate/top-contact FET. The FET 10A includes the gate-electrode 12 formed on the substrate 11, which has insulating property, and includes the gate-insulating layer 13 formed so as to cover the gate-electrode 12. Furthermore, the active layer 16 is formed on the gate-insulating layer 13, and the source-electrode 14 and the drain-electrode 15 are formed partially on the active layer 16 at a predetermined distance via the active layer 16, which turns into a channel region. Furthermore, the passivation layer 17 is formed over the gate-insulating layer 13 so as to cover the source-electrode 14, the drain-electrode 15, and the active layer 16.

An FET 10B illustrated in FIG. 4B is a top-gate/bottom-contact FET. The FET 10B includes the source-electrode 14 and the drain-electrode 15 formed on the substrate 11, which has insulating property, and includes the active layer 16 formed so as to partially cover the source-electrode 14 and the drain-electrode 15. Furthermore, the gate-insulating layer 13 is formed so as to cover the source-electrode 14, the drain-electrode 15, and the active layer 16, and the gate-electrode 12 is formed on the gate-insulating layer 13. Furthermore, the passivation layer 17 is formed over the gate-insulating layer 13 so as to cover the gate-electrode 12.

An FET 10C illustrated in FIG. 4C is a top-gate/top-contact FET. The FET 10C includes the active layer 16 formed on the substrate 11, which has insulating property, and includes the source-electrode 14 and the drain-electrode 15 formed partially on the active layer 16 at a predetermined distance via the active layer 16, which turns into a channel region. Furthermore, the gate-insulating layer 13 is formed so as to cover the source-electrode 14, the drain-electrode 15, and the active layer 16, and the gate-electrode 12 is formed on the gate-insulating layer 13. Furthermore, the passivation layer 17 is formed over the gate-insulating layer 13 so as to cover the gate-electrode 12.

As described above, there is no specific limitation regarding the layer configuration of the FET according to the present invention; one can arbitrarily select a configuration among the configurations as illustrated in FIGS. 1 through 4C, in accordance with intended purposes. With respect to the FETs 10A, 10B, and 10C, illustrated in FIGS. 4A through 4C, at least one of the gate-insulating layer 13 and the passivation layer 17 is formed by the first oxide, and the gate-insulating layer 13 and the passivation layer 17 may be manufactured by means of a similar method as used for the FET 10. Therefore, with respect to the FETs 10A, 10B, and 10C, the present invention provides similar advantageous effects as provided to the FET 10.

Second Embodiment

Figure 5:
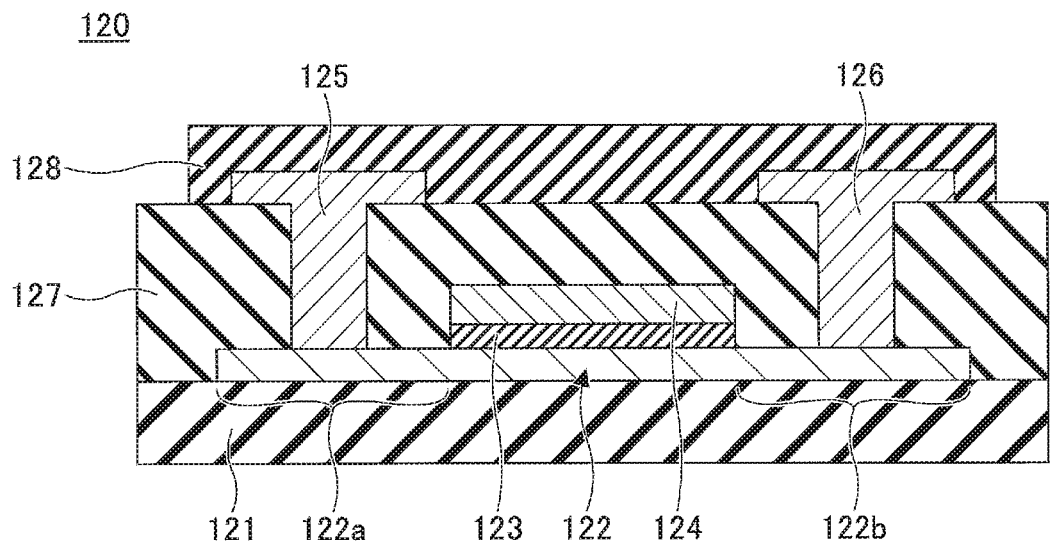
FIG. 5 is a cross-sectional view illustrating an example of an FET according to a second embodiment.

The following description regarding the second embodiment explains a method for manufacturing an FED as illustrated in FIG. 5. Note that, in the description regarding the second embodiment, explanation of the same configuration already explained in the above embodiment may be omitted.

FIG. 5 is a cross-sectional view illustrating an example of an FET according to the second embodiment. The FET illustrated in FIG. 5 is a typical example of a semiconductor device according to the present invention.

An FET 120 illustrated in FIG. 5 is a top-gate/self-aligned FET. The FET 120 includes an active layer 122 formed on a substrate 121, which has insulating property, a gate-insulating layer 123 formed on the active layer 122, and a gate-electrode 124 formed on the gate-insulating layer. Furthermore, the FET 120 includes an interlayered insulating film 127 formed so as to cover the substrate 121, the active layer 122, and the gate-electrode 124. Note that a region 122a is a source-region and a region 122b is a drain-region. Furthermore, a source-electrode 125 and a drain-electrode 126 are formed on the interlayered insulating film 127. The source-electrode 125 and the drain-electrode 126 are connected with the active layer 122 via through-holes formed on the interlayered insulating film 127. Furthermore, a passivation layer 128 is formed so as to cover the interlayered insulating film 127, the source-electrode 125, and the drain-electrode 126.

With respect to the top-gate/self-aligned FET 120, it is possible to lower parasitic capacitance more than in the configurations illustrated in FIGS. 1, 4A, 4B, and 4C, because of absence of regions (i.e. overlap regions) where the gate-electrode 124 overlaps the source-electrode 125 and the drain-electrode 126. Therefore, the FET 120 may perform faster operation.

The same oxide as used for at least one of the gate-insulating layer 13 and the passivation layer 17 in the first embodiment may be used for at least one of the gate-insulating layer 123 and the passivation layer 128.

In a case where the first oxide is used for the gate-insulating layer 123, there is no specific limitation regarding material for the passivation layer 128. For example, an inorganic oxide film such as $SiO_2$, SiON, or SiN may be used.

Similarly, in a case where the first oxide is used for the passivation layer 128, there is no specific limitation regarding material for the gate-insulating layer 123. For example, an inorganic oxide film such as $SiO_2$, SiON, or SiN may be used. However, the first oxide may be used for both of the gate-insulating layer 123 and the passivation layer 128. In such a case, the boundary of the gate-insulating layer 123 and the passivation layer 128 is more stable, and therefore the gate-insulating layer 123 and the passivation layer 128 are likely to have more reliable properties.

The substrate 121, the active layer 122, the gate-electrode 124, the source-electrode 125, and the drain-electrode 126 may be formed, for example, by the same material as used for the substrate 11, the active layer 16, the gate-electrode 12, the source-electrode 14, and the drain-electrode 15, respectively.

Furthermore, there is no specific limitation regarding material for the interlayered insulating film 127. For example, an inorganic oxide film such as $SiO_2$, SiON, or SiN may be used.

[Method for Manufacturing the FET]

Next, the following description explains a method for manufacturing the FET 120. Although the following description explains the method for manufacturing an FET having the gate-insulating layer 123 the passivation layer 128 both formed by the first oxide, the FET 120 is not limited to as such.

First, the active layer 122, the gate-insulating layer 123, and the gate-electrode 124 are formed on the substrate 121. For example, formation steps are as follows: on the substrate 121, film formation of the active layer 122 is performed; then film formation of the gate-insulating layer 123 is performed; then film formation of the gate-electrode 124 is performed; and then etching of the gate-electrode 124 and the gate-insulating layer 123 is performed in order, by means of photolithography.

The same process as in the first embodiment may be used for film formation of the gate-insulating layer 123 and the gate-electrode 124. A mask used in the etching process on the gate-electrode 124 may be used as a mask for the etching process on the gate-insulating layer 123, or the pattern of the gate-electrode 124 itself may be used as the mask.

Furthermore, the process may be simplified by performing etching on the gate-insulating layer 123 and the gate-electrode 124 at one time, in a case where the gate-electrode 124 is formed by material that is suitable for wet-etching by use of the first solution containing at least one of hydrochloric acid, oxalic acid, nitric acid, phosphoric acid, acetic acid, sulfuric acid, hydrogen peroxide water. For example, etching may be performed on the gate-electrode 124 and the gate-insulating layer 123 at one time, in a case where the gate-electrode 124 is formed to be a single layer of Al, Al alloy, Mo, or Mo alloy, or to be laminated layers of Al, Al alloy, Mo, and Mo alloy, and where mixed solution containing nitric acid, phosphoric acid, and acetic acid is used as etchant.

Furthermore, film formation and patterning of the gate-electrode 124 may be performed after film formation and patterning of the gate-insulating layer 123 are performed on the substrate 121.

Then, the interlayered insulating film 127 is formed. There is no specific limitation regarding material and processes. For example, material for forming the interlayered insulating film 127 may be insulating material such as SiON or $SiO_2$, and a process for forming the interlayered insulating film 127 may be a vacuum deposition method such as a CVD method or a sputtering method. There is no specific limitation regarding patterning methods as well. For example, a desired pattern may be obtained by means of photolithography, etc., and a through-hole may be formed, as needed.

Before forming the interlayered insulating film 127, argon (Ar) plasma processing, etc., may be performed for lowering resistivity of the source-region 122a and the drain-region 122b as illustrated in FIG. 5.

Then, the source-electrode 125 and the drain-electrode 126 are formed. The source-electrode 125 and the drain-electrode 126 are formed over the through-holes provided on the interlayered insulating film 127, and connected to the active layer 122 (i.e. the source-region 122a and the drain-region 122b). The same process as in the first embodiment may be used for a process for forming the source-electrode 125 and the drain-electrode 126.

Lastly, the passivation layer 128 is formed. Material and processes are the same as those for the gate-insulating layer 13 according to the first embodiment. Through the above steps, the FET 120 is manufactured.

As described above, usage of the first oxide for at least one of the gate-insulating layer 123 and the passivation layer 128 and usage of a low-cost patterning process, in which wet-etching is performed on the first oxide, enable producing a high quality (i.e. with low energy consumption and high reliability) FET, similarly to the first embodiment.

Third Embodiment

The following description regarding the third embodiment explains an example of an organic EL display element. Note that, in the description of the third embodiment, explanation of the same configuration already explained in the above description may be omitted.

[Configuration of the Organic EL Display Element]

Figure 6:
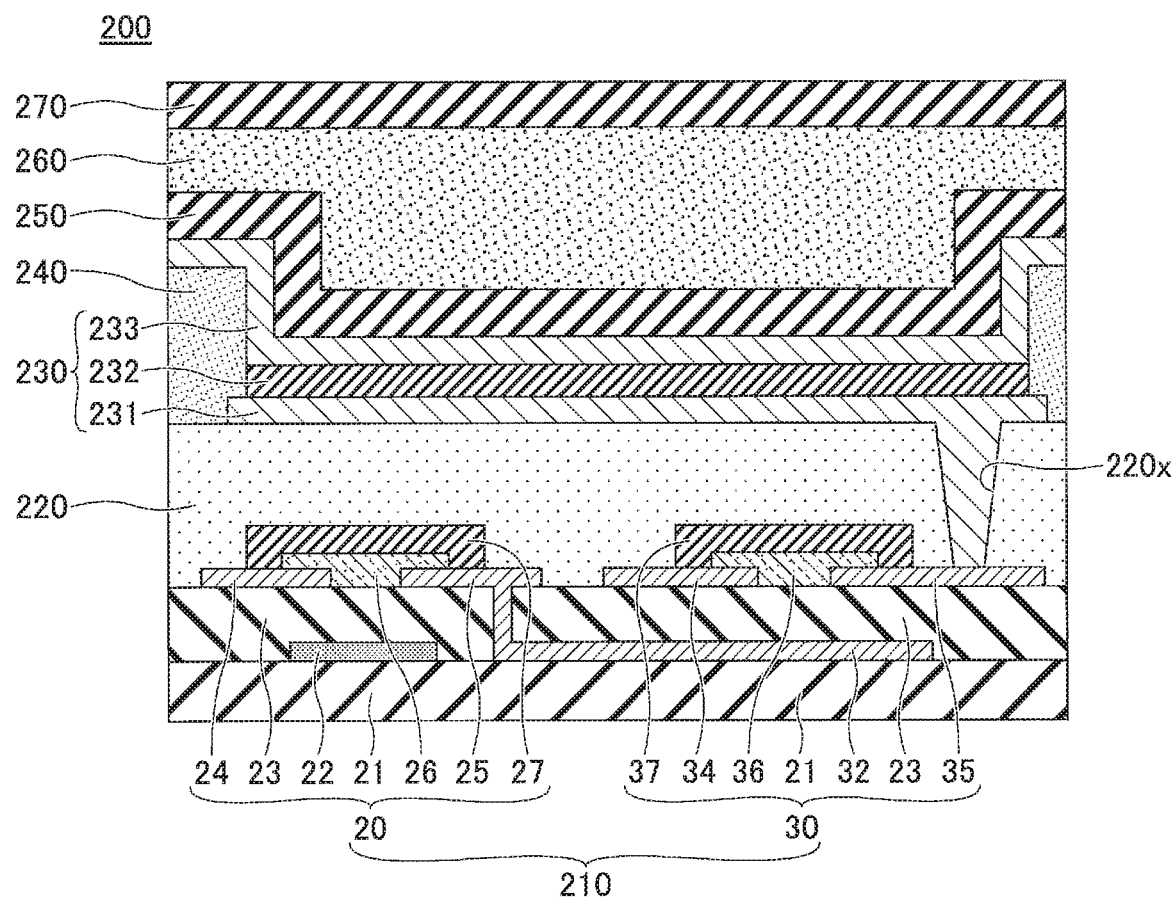
FIG. 6 is a cross-sectional view for explaining a configuration of an organic electro luminescence (EL) display element according to a third embodiment and a method for manufacturing the organic EL display element according to the third embodiment.

FIG. 6 is a cross-sectional view for explaining a configuration of an organic EL display element 200 according to the third embodiment and a method for manufacturing the organic EL display element 200 according to the third embodiment. According to FIG. 6, the organic EL display element 200 includes a drive-circuit 210, an interlayered insulating film 220, an organic EL element 230, partition-walls 240, a sealing layer 250, an adhesive layer 260, and an opposed insulating substrate 270.

The drive-circuit 210 is constituted by a first FET 20 and a second FET 30. The first FET 20 includes, on a substrate 21, which is an insulating substrate, a first gate-electrode 22, a gate-insulating layer 23, a first source-electrode 24, a first drain-electrode 25, a first active layer 26, and a first passivation layer 27. Furthermore, the second FET 30 includes, on the substrate 21, a second gate-electrode 32, the gate-insulating layer 23, a second source-electrode 34, a second drain-electrode 35, a second active layer 36, and a second passivation layer 37. For at least one of the gate-insulating layer 23, the first passivation layer 27, and the second passivation layer 37, the same oxide as used for at least one of the gate-insulating layer 13 and the passivation layer 17 in the first embodiment may be used.

The drive-circuit 210 has a two-transistor/one-capacitor structure, where the first drain-electrode 25 provided on the first FET 20 and the second gate-electrode 32 provided on the second FET 30 are connected via a through-hole formed on the gate-insulating layer 23. Note that, in FIG. 6, a capacitor is formed between the second gate-electrode 32 and the second source-electrode 34, although there is no specific limitation regarding where to form capacitors. That is to say, capacitors with proper sizes and arrangement may be formed, as needed.

The interlayered insulating film 220 is formed so as to cover the first FET 20 and the second FET 30 provided on the drive-circuit 210. On the interlayered insulating film 220, the organic EL element 230 and the partition-walls 240 are formed.

The organic EL element 230 is a light-control element that includes a lower-electrode 231, an organic EL layer 232, and an upper electrode 233. The lower-electrode 231 of the organic EL element 230 is connected to the second drain-electrode 35 of the second FET 30, via a through-hole 220x formed on the interlayered insulating film 220.

Figure 7:
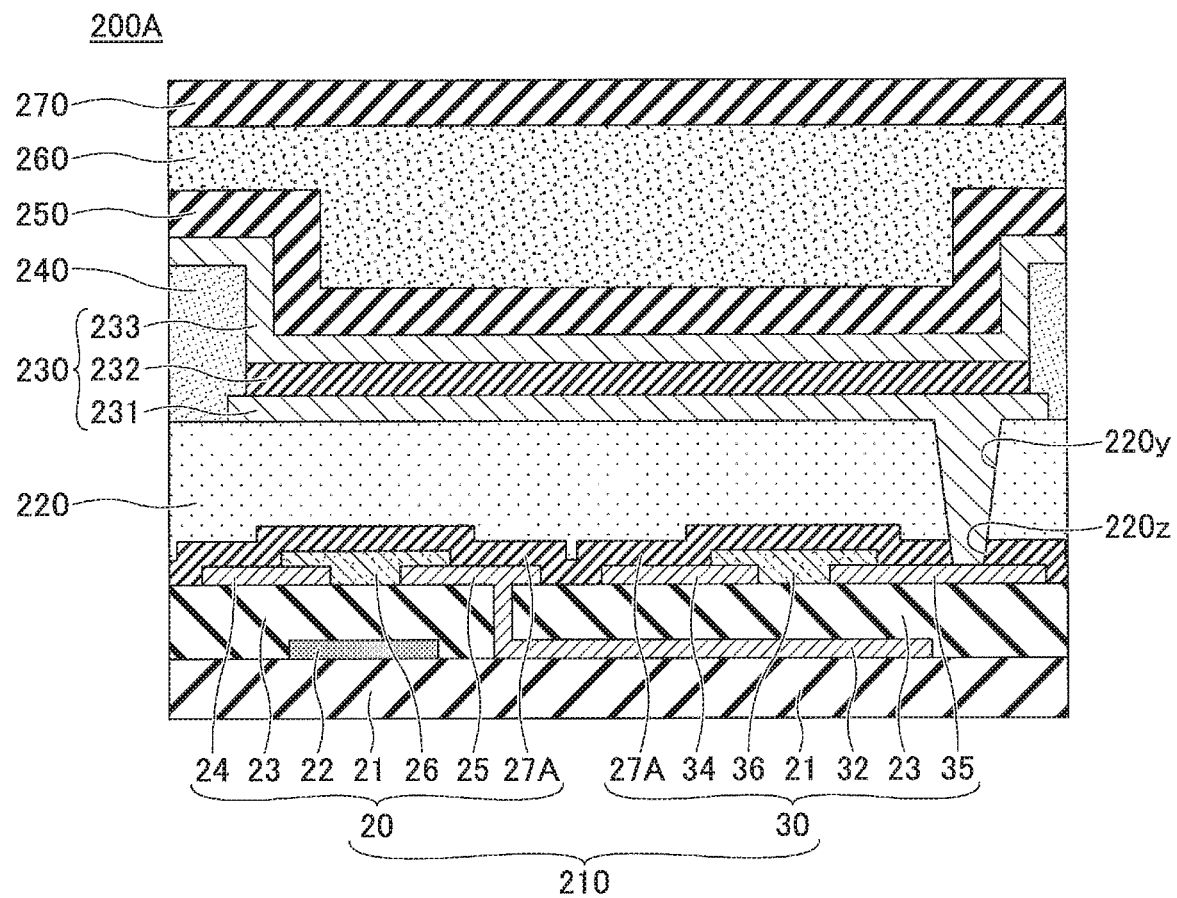
FIG. 7 is a cross-sectional view for explaining a configuration of an organic EL display element according to a modification of the third embodiment and a method for manufacturing the organic EL display element according to the modification of the third embodiment.

Note that, as illustrated in FIG. 7 with respect to an organic EL display element 200A, the first passivation layer 27 and the second passivation layer 37 may be integrally formed, so as to be a passivation layer 27A. In such a case, the lower-electrode 231 of the organic EL element 230 is connected to the second drain-electrode 35 of the second FET 30, via through-holes 220y and 220z formed on the interlayered insulating film 220 and on the passivation layer 27A, respectively.

For the lower-electrode 231 of the organic EL element 230, conductive oxides such as indium-tin-oxide (ITO), $In_2O_3$, $SnO_2$, or ZnO, silver-neodymium (Ag—Nd) alloy, etc., may be used. For the upper electrode 233, aluminum-magnesium-silver (Al—Mg—Ag) alloy, aluminum-lithium (Al—Li) alloy, ITO, etc., may be used.

The organic EL layer 232 includes an electron-transport layer, a light-emitting layer, and a hole-transport layer. Further, the upper electrode 233 is connected to the electron-transport layer, and the lower-electrode 231 is connected to the hole-transport layer. Upon application of a predetermined amount of voltage between the lower-electrode 231 and the upper electrode 233, holes and electrons, which are injected from the lower-electrode 231 and the upper electrode 233, recombine inside the organic EL layer 232, which causes the light-emitting layer to emit light because of exited energy. That is to say, when the first FET 20 and the second FET 30 are turned on, the organic EL element 230 emits light.

The organic EL element 230 is laminated by layers in an order as follows: the sealing layer 250, the adhesive layer 260, and the opposed insulating substrate 270.

[Method for Manufacturing the Organic EL Display Element]

Next, the following description explains a method for manufacturing the organic EL display element 200. The first FET 20 and the second FET 30 may be manufactured by the same material and processes as used for the FETs 10 through 10C according to the first embodiment.

Note that, in order to form the through-hole 220z in a case of using the first oxide for the passivation layer 27A illustrated in FIG. 7, one can provide a mask having an opening that corresponds to a part of the passivation layer 27A, which is formed into the through-hole 220z, after the passivation layer 27A is formed and before the interlayered insulating film 220 is formed. Then, one can perform etching on the passivation layer 27A through the mask by use of the first solution that contains at least one of hydrochloric acid, oxalic acid, nitric acid, phosphoric acid, acetic acid, sulfuric acid, and hydrogen peroxide water.

Alternatively, one can continuously perform film formation of the passivation layer 27A and the interlayered insulating film 220, and then form the through-hole 220y on the interlayered insulating film 220. Then, one can utilize the interlayered insulating film 220 having the through-hole 220y as a mask, to perform etching by use of the aforementioned solution, in order to form the through-hole 220z on the passivation layer 27A.

For the interlayered insulating film 220 and the partition-walls 240, various materials and processes may be used. For example, material for the interlayered insulating film 220 and the partition-walls 240 may be inorganic oxides such as $SiO_2$, SiON, or SiNx, insulating material such as acrylic or polyimide, etc. With regard to processes for forming the interlayered insulating film 220 and the partition-walls 240, one can perform film formation in a sputtering method or a spin-coating method, and then perform patterning by means of photolithography, or one can perform film formation in a printing process such as inkjet printing, nanoimprinting, and gravure printing, so that a desired shapes are directly formed.

There is no specific limitation regarding methods for manufacturing the organic EL element 230, and conventional technics may be used. For example, one can properly use a vacuum deposition method such as a vacuum vapor deposition method or a sputtering method, and a solution process such as an inkjet method or a nozzle-coating method.

For the sealing layer 250, various materials and processes may be used. For example, material for the sealing layer 250 may be inorganic oxides such as $SiO_2$, SiON, or SiNx, etc. For example, processes for forming the sealing layer 250 may be a vacuum deposition method such as a CVD method or a sputtering method.

After the sealing layer 250 is formed, the opposed insulating substrate 270 is attached via the adhesive layer 260 formed by material such as epoxy resin and acrylic resin, to complete forming the organic EL display element 200.

As described above, usage of the first oxide for at least one of the gate-insulating layers and the passivation layers and usage of the low-cost patterning process, in which wet-etching is performed on the first oxide, enable producing a high quality (i.e. with low energy consumption and high reliability) FET.

Note that, the display element according to the second embodiment includes the light-control element and the drive-circuit for driving the light-control element, at least, and may further include other members, as needed. There is no specific limitation regarding light-control elements, as long as being elements for controlling light-output in accordance with a driving signal; a light-control element may be selected properly in accordance with an intended purpose. Although a display element having an organic EL element as a light-control element is offered as an example in the above explanation, it is also possible to produce a display element having a liquid crystal element, an electrochromic element, an electrophoresis element, an electrowetting element, etc., instead of the organic EL element.

There is no specific limitation regarding drive-circuits, as long as having the FET according to the first embodiment; a drive-circuit may be selected properly in accordance with an intended purpose. There is no specific limitation regarding the other members; other members are selected properly in accordance with intended purposes.

Fourth Embodiment

The following description regarding the fourth embodiment explains another example of the FET. Note that, in the description regarding the fourth embodiment, explanation of the same configuration already explained in the above embodiments may be omitted.

[Configuration of the FET]

Figure 8:
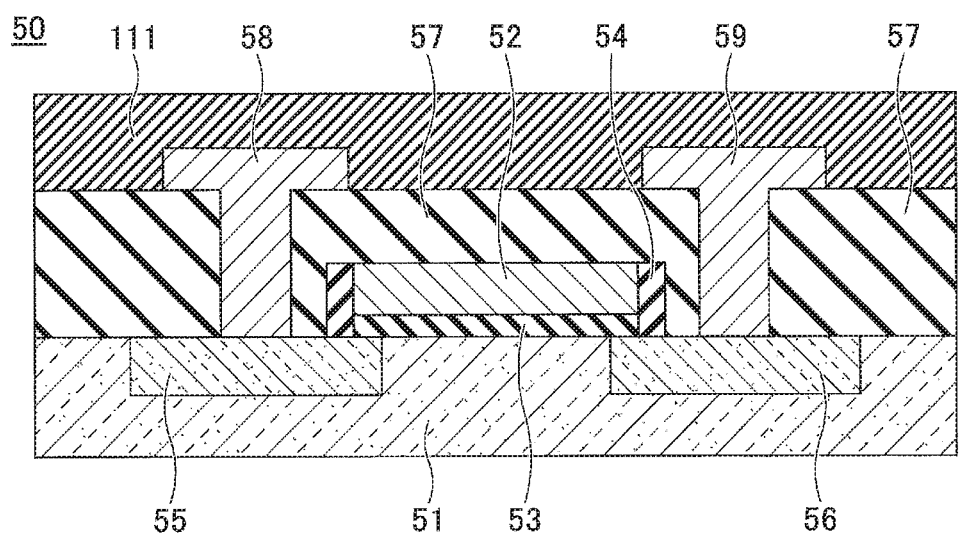
FIG. 8 is a cross-sectional view for explaining a configuration of an FET according to a fourth embodiment and a method for manufacturing the FET according to the fourth embodiment.

FIG. 8 is a cross-sectional view for explaining a configuration of an FET according to the fourth embodiment and a method for manufacturing the FET according to the fourth embodiment. According to FIG. 8, an FET 50 includes a substrate 51, a gate-electrode 52, a gate-insulating layer 53, a gate-sidewall-insulating film 54, a source-region 55, a drain-region 56, an interlayered insulating film 57, a source-electrode 58, a drain-electrode 59, and a passivation layer 111. Note that the FET 50 is a typical example of the FET according to the present invention.

For at least one of the gate-insulating layer 53 and the passivation layer 111, the same oxide as used for at least one of the gate-insulating layer 13 and the passivation layer 17 in the first embodiment may be used.

In a case where the gate-insulating layer 53 is formed by the first oxide, there is no specific limitation regarding material for the passivation layer 111. For example, an inorganic oxide film such as $SiO_2$, SiON, or SiN may be used.

Similarly, in a case where the passivation layer 111 is formed by the first oxide, there is no specific limitation regarding material for the gate-insulating layer 53. For example, an inorganic oxide film such as $SiO_2$, SiON, or SiN may be used. However, the first oxide may be used for both of the gate-insulating layer 53 and the passivation layer 111. In such a case, the boundary of the gate-insulating layer 53 and the passivation layer 111 is more stable, and therefore the gate-insulating layer 53 and the passivation layer 111 tend to have more reliable properties.

[Method for Manufacturing the FET]

Next, the following description explains a method for manufacturing the FET 50. Although the following description explains a method for manufacturing an FET having the gate-insulating layer 53 and the passivation layer 111 both formed by the first oxide, the FET 50 is not limited to as such.

For manufacturing the FET 50, first, the substrate 51, which is a semiconducting substrate, is prepared. There is no specific limitation regarding material for the substrate 51, as long as being semiconducting material; material for the substrate 51 may be properly selected from among silicon (Si), germanium (Ge), etc., with impurities added, as needed.

Then, the gate-insulating layer 53 is formed on the substrate 51. There is no specific limitation regarding processes; one can perform film formation in a vacuum deposition method such as a CVD method, an ALD method, or a sputtering method, and then form a desired pattern by means of photolithography, etc. The gate-insulating layer 53 may be formed to be an amorphous film, in any film formation methods above.

Then, the gate-electrode 52 is formed. There is no specific limitation regarding material and processes. For example, material for the gate-electrode 52 may be polysilicon, metal material such as Al, or a laminate of polysilicon, metal material, and barrier metal such as TiN or TaN. For example, a process for forming the gate-electrode 52 may be a vacuum deposition method such as a CVD method or a sputtering method. Furthermore, for lowering resistivity, one can form a layer of silicide such as Ni, Co, or Ti on a surface of the gate-electrode 52.

There is no specific limitation regarding methods for patterning of the gate-electrode 52. For example, one can form a mask using a photoresist, and then perform photolithography, to remove a part of the gate-insulating layer 53 or the gate-electrode 52 that is not covered by the mask in a dry-etching method.

The process for forming the gate-insulating layer 53 may be the same as the process for forming the gate-insulating layer 13 according to the first embodiment. There is no specific limitation regarding material for a mask to be used for performing wet-etching on the gate-insulating layer 53. For example, the pattern of the gate-electrode 52 may be used for a mask.

Then, the gate-sidewall-insulating film 54 is formed on the sides of the gate-insulating layer 53 and the gate-electrode 52. There is no specific limitation regarding material and processes. For example, material for the gate-sidewall-insulating film 54 may be insulating material such as SiON or $SiO_2$, and a process for forming the gate-sidewall-insulating film 54 may be a vacuum deposition method such as a CVD method or a sputtering method. There is also no specific limitation regarding methods for patterning. For example, one can perform film formation over the substrate 51, using material for the gate-sidewall-insulating film 54, and then perform etch-back on the overall surface in a dry-etching method.

Then, ion implantation is selectively performed on the substrate 51, in order to form the source-region 55 and the drain-region 56. For lowering resistivity, one can form a layer of silicide such as Ni, Co, or Ti on surfaces of the source-region 55 and the drain-region 56.

Then, the interlayered insulating film 57 is formed. There is no specific limitation regarding material and processes. For example, material for the interlayered insulating film 57 may be insulating material such as SiON or $SiO_2$, and a process for forming the interlayered insulating film 57 may be a vacuum deposition method such as a CVD method or a sputtering method. Furthermore, there is no specific limitation regarding methods for patterning; one can form a desired pattern by means of photolithography, etc., and can form a through-hole, as needed.

Then, the source-electrode 58 and the drain-electrode 59 are formed. The source-electrode 58 and the drain-electrode 59 are formed so as to make contact with the source-region 55 and the drain-region 56, respectively, burying the through-holes formed on the interlayered insulating film 57.

There is no specific limitation regarding material and processes for forming the source-electrode 58 and the drain-electrode 59. For example, material for the source-electrode 58 and the drain-electrode 59 may be metal material such as Al or Cu. With respect to processes for forming the source-electrode 58 and the drain-electrode 59, for example, one can bury the through-holes in a vacuum deposition method such as a sputtering method, and then perform patterning by use of photolithography. Furthermore, one can bury the through-holes in a CVD method or a plating method, and then perform planarization in a chemical mechanical polishing (CMP) method, etc. Furthermore, a laminate with a layer of barrier metal such as TiN or TaN may be used, as needed. Furthermore, a W-plug may be used; one can bury through-holes using tungsten (W) in a CVD method.

Lastly, the passivation layer 111 is formed. Material and processes may be the same as material and processes used for the gate-insulating layer 13 according to the first embodiment. Through the above steps, the FET is manufactured.

Note that, with respect to the FET 50, the substrate 51 is provided as an active layer, which forms a channel between the source-region 55 and the drain-region 56. Further, between the gate-insulating layer 53 and the substrate 51 formed by Si, an active layer may be formed by SiGe, etc. Furthermore, although a top-gate structure is illustrated in FIG. 8, the aforementioned gate-insulating layer 53 may be used for a so-called double-gate structure and FinFET.

As described above, usage of the first oxide for at least one of the gate-insulating layer and the passivation layer and usage of a low-cost patterning process, in which wet-etching is performed on the first oxide, enable producing a high quality (i.e. with low energy consumption and high reliability) FET, similarly to the first embodiment.

Fifth Embodiment

The following description regarding the fifth embodiment explains an example of a volatile semiconductor memory element. Note that, in the description regarding the fifth embodiment, explanation of the same configuration already explained in the above embodiments may be omitted.

[Configuration of the Volatile Semiconductor Memory Element]

Figure 9:
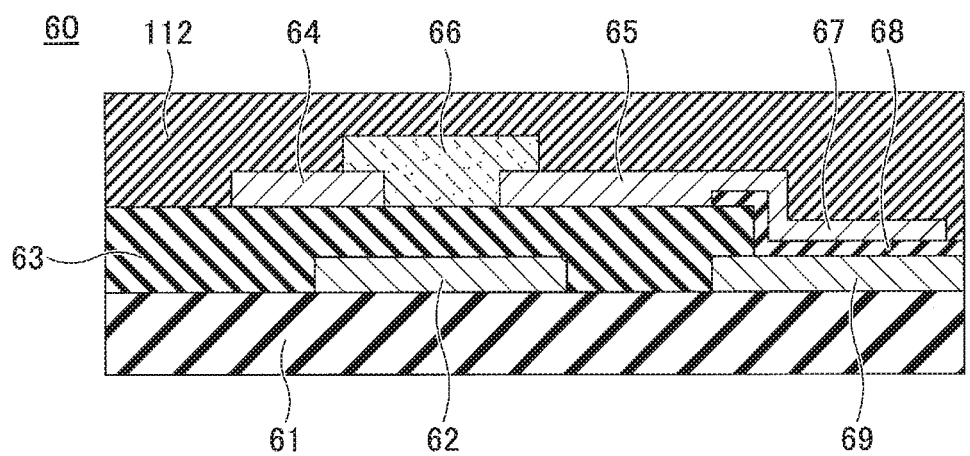
FIG. 9 is a cross-sectional view for explaining a configuration of a volatile semiconductor memory element according to a fifth embodiment and a method for manufacturing the volatile semiconductor memory element according to the fifth embodiment.

FIG. 9 is a cross-sectional view for explaining a configuration of a volatile semiconductor memory element according to the fifth embodiment and a method for manufacturing the volatile semiconductor memory element according to the fifth embodiment. According to FIG. 9, a volatile semiconductor memory element 60 includes a substrate 61, which is an insulating substrate, a gate-electrode 62, a gate-insulating layer 63, a source-electrode 64, a drain-electrode 65, an active layer 66, a first capacitor-electrode 67, a capacitor-dielectric layer 68, a second capacitor-electrode 69, and a passivation layer 112. Note that the volatile semiconductor memory element 60 is a typical example of the semiconductor device according to the present invention.

For at least one of the gate-insulating layer 63 and the passivation layer 112, the same oxide as used for at least one of the gate-insulating layer 13 and the passivation layer 17 in the first embodiment may be used.

In a case where the gate-insulating layer 63 is formed by the first oxide, there is no specific limitation regarding material for the passivation layer 112. For example, an inorganic oxide film such as $SiO_2$, SiON, or SiN may be used.

Similarly, in a case where the passivation layer 112 is formed by the first oxide, there is no specific limitation regarding material for the gate-insulating layer 63. For example, an inorganic oxide film such as $SiO_2$, SiON, or SiN may be used. However, the first oxide may be used for both of the gate-insulating layer 63 and the passivation layer 112. In such a case, the boundary of the gate-insulating layer 63 and the passivation layer 112 is more stable, and therefore the gate-insulating layer 63 and the passivation layer 112 tend to have more reliable properties.

It is preferred that the capacitor-dielectric layer 68 is also formed by the first oxide.

[Method for Manufacturing the Volatile Semiconductor Memory Element]

Next, the following description explains a method for manufacturing the volatile semiconductor memory element 60. Although the following description explains a method for manufacturing a volatile semiconductor memory element having the gate-insulating layer 63 and the passivation layer 112 both formed by the first oxide, the volatile semiconductor memory element 60 is not limited to as such.

For manufacturing the volatile semiconductor memory element 60, first, the substrate 61 is prepared. Material for the substrate 61 may be the same as the material used for the substrate 11 according to the first embodiment. Then, the gate-electrode 62 is formed on the substrate 61. Material and processes for forming the gate-electrode 62 may be the same as the material and processes used for forming the gate-electrode 12 according to the first embodiment.

Then, the second capacitor-electrode 69 is formed. For forming the second capacitor-electrode 69, various materials and processes may be used. For example, material for the second capacitor-electrode 69 may be metal such as Mo, Al, Cu, or ruthenium (Ru), an alloy of such metal, transparent conductive oxide such as ITO or ATO, organic conductor such as PEDOT or PANI, etc. With respect to processes for forming the second capacitor-electrode 69, for example, one can perform film formation in a sputtering method, a spin-coating or dis-coating method, etc., and then perform patterning by use of photolithography. Furthermore, one can perform a printing process such as inkjet printing, nanoimprinting, and gravure printing, so that a desired shape is directly formed.

Note that, in a case where the material and the processes for forming the gate-electrode 62 and the second capacitor-electrode 69 are the same, the gate-electrode 62 and the second capacitor-electrode 69 may be formed at one time.

Then, the gate-insulating layer 63 is formed by the first oxide. Processes for forming the gate-insulating layer 63 may be the same as the processes used for forming the gate-insulating layer 13 according to the first embodiment.

Then, the capacitor-dielectric layer 68 is formed on the second capacitor-electrode 69. There is no specific limitation regarding material for the capacitor-dielectric layer 68. For example, material for the capacitor-dielectric layer 68 may be high dielectric constant oxide material containing Hf oxide, Ta oxide, La oxide, etc., or may be ferroelectric material such as lead zirconate titanate (PZT) or strontium bismuth tantalate (SBT), etc. Among such materials, the first oxide is preferred for forming the capacitor-dielectric layer 68.

There is no specific limitation regarding processes. For example, one can perform film formation in a vacuum deposition method such as a CVD method, an ALD method, or a sputtering method, and then form a desired pattern by use of photolithography, etc. It is possible to form an amorphous film, in any film formation methods above.

Note that, in a case where the material and the processes for forming the gate-insulating layer 63 and the capacitor-dielectric layer 68 are the same, the gate-insulating layer 63 and the capacitor-dielectric layer 68 may be formed at one time.

Then, the source-electrode 64 and the drain-electrode 65 are formed. Material and processes for forming the source-electrode 64 and the drain-electrode 65 may be the same as the material and processes used for forming the source-electrode 14 and the drain-electrode 15 according to the first embodiment.

Then, the first capacitor-electrode 67 is formed. For forming the first capacitor-electrode 67, various materials and processes may be used. For example, material for the first capacitor-electrode 67 may be metal such as Mo, Al, Cu, or Ru, an alloy of such metal, transparent conductive oxide such as ITO or ATO, organic conductor such as PEDOT or PANI, etc. With respect to processes for forming the first capacitor-electrode 67, for example, one can perform film formation in a sputtering method, a spin-coating or dis-coating method, etc., and then perform patterning by means of photolithography. Furthermore, one can perform a printing process such as inkjet printing, nanoimprinting, and gravure printing, so that a desired shape is directly formed.

Note that, in a case where the material and the processes for forming the source-electrode 64, the drain-electrode 65, and the first capacitor-electrode 67 are the same, the source-electrode 64, the drain-electrode 65, and the first capacitor-electrode 67 may be formed at one time.

Then, the active layer 66 is formed. There is no specific limitation regarding material for the active layer 66. For example, material for the active layer 66 may be an oxide semiconductor such as p-Si, a-Si, or In—Ga—Zn—O, and may be an organic semiconductor such as pentacene. Among such materials, an oxide semiconductor is preferred, in view of stability of the boundaries of the gate-insulating layer 63 through the active layer 66. There is no specific limitation regarding processes for forming the active layer 66. For example, one can perform film formation in a vacuum process such as a sputtering method, a'PLD method, a CVD method, or an ALD method, or in a solution process such as spin-coating or dip-coating method, and then perform patterning by means of photolithography. Alternatively, one can perform a printing process such as inkjet printing, nanoimprinting, and gravure printing, so that a desired shape is directly formed.

Lastly, the passivation layer 112 is formed. Material and processes for forming the passivation layer 112 may be the same as the material and processes for forming the gate-insulating layer 13 according to the first embodiment. Through the above steps, the volatile semiconductor memory element 60 is manufactured.

Here, the volatile semiconductor memory element 60 has a so-called bottom-gate/bottom-contact configuration, in terms of positional relations of the gate-electrode 62, the gate-insulating layer 63, the source-electrode 64, the drain-electrode 65, and the active layer 66. However, the volatile semiconductor memory element according to the fifth embodiment is not limited to as such, and may have a bottom-gate/top-contact, top-gate/bottom-contact, or top-gate/top-contact configuration, for example.

Furthermore, such a planar structure with respect to the first capacitor-electrode 67, the capacitor-dielectric layer 68, and the second capacitor-electrode 69 of the volatile semiconductor memory element 60 may be formed to be a three-dimensional structure, etc., for increasing capacity of the capacitor.

As described above, usage of the first oxide for at least one of the gate-insulating layer and the passivation layer and usage of a low-cost patterning process, in which wet-etching is performed on the first oxide, enable producing a high quality (i.e. with low energy consumption and high reliability) FET. Furthermore, usage of the first oxide for the capacitor-dielectric layer, in addition to the gate-insulating layer, enables preferably producing an FET with even lower energy consumption.

Sixth Embodiment

The following description regarding the sixth embodiment explains another example of the volatile semiconductor memory element. Note that, in the description regarding the sixth embodiment, explanation of the same configuration already explained in the above embodiments may be omitted.

[Configuration of the Volatile Semiconductor Memory Element]

Figure 10:
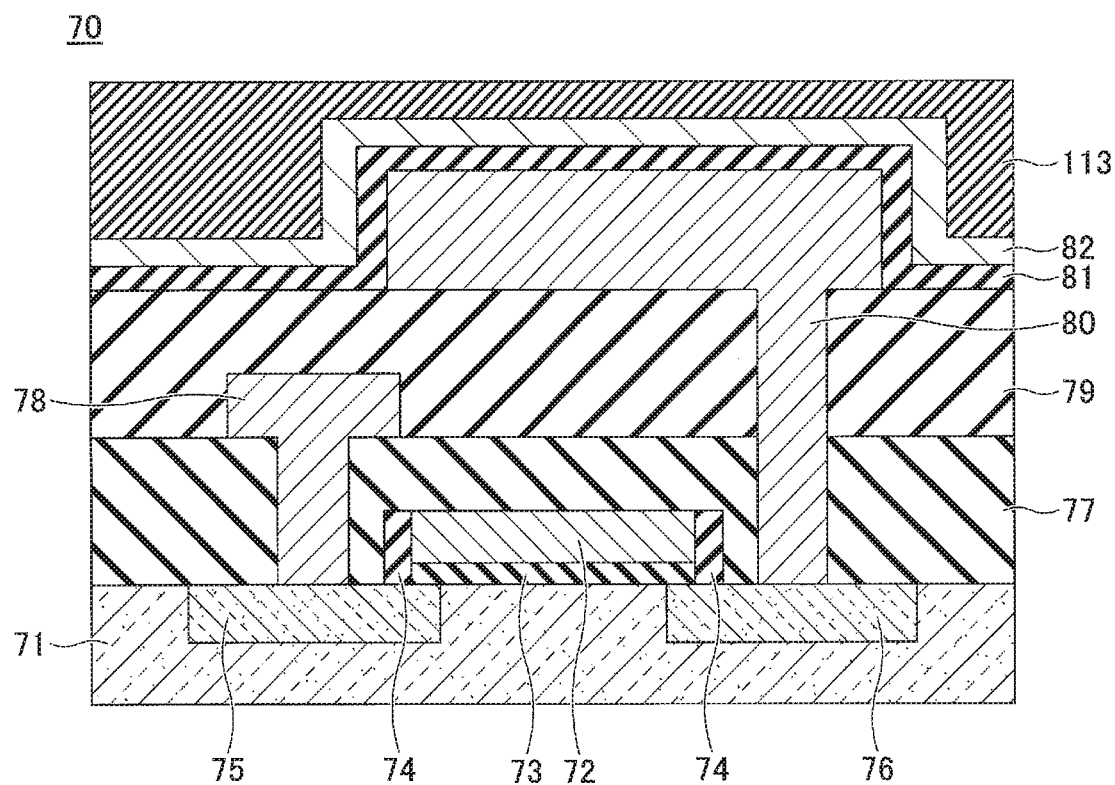
FIG. 10 is a cross-sectional view for explaining a configuration of a volatile semiconductor memory element according to a sixth embodiment and a method for manufacturing the volatile semiconductor memory element according to the sixth embodiment.

FIG. 10 is a cross-sectional view for explaining a configuration of a volatile semiconductor memory element according to the sixth embodiment and a method for manufacturing the volatile semiconductor memory element according to the sixth embodiment. According to FIG. 10, a volatile semiconductor memory element 70 includes a substrate 71, which is a semiconductor substrate, a gate-electrode 72, a gate-insulating layer 73, a gate-sidewall-insulating film 74, a source-region 75, a drain-region 76, a first interlayered insulating film 77, a bit-line-electrode 78, a second interlayered insulating film 79, a second capacitor-electrode 80, a capacitor-dielectric layer 81, a first capacitor-electrode 82, and a passivation layer 113. Note that the volatile semiconductor memory element 70 is a typical example of the semiconductor device according to the present invention.

For at least one of the gate-insulating layer 73 and the passivation layer 113, the same oxide as used for at least one of the gate-insulating layer 13 and the passivation layer 17 in the first embodiment may be used.

In a case where the gate-insulating layer 73 is formed by the first oxide, there is no specific limitation regarding material for the passivation layer 113. For example, an inorganic oxide film such as $SiO_2$, SiON, or SiN may be used.

Similarly, in a case where the passivation layer 113 is formed by the first oxide, there is no specific limitation regarding material for the gate-insulating layer 73. For example, an inorganic oxide film such as $SiO_2$, SiON, or SiN may be used. However, the first oxide may be used for both of the gate-insulating layer 73 and the passivation layer 113. In such a case, the boundary of the gate-insulating layer 73 and the passivation layer 113 is more stable, and therefore the gate-insulating layer 73 and the passivation layer 113 tend to have more reliable properties.

It is preferable that the capacitor-dielectric layer 81 is also formed by the first oxide.

[Method for Manufacturing the Volatile Semiconductor Memory Element]

Next, the following description explains a method for manufacturing the volatile semiconductor memory element 70. Although the following description explains a method for manufacturing a volatile semiconductor memory element having the gate-insulating layer 73 and the passivation layer 113 both formed by the first oxide, the volatile semiconductor memory element 70 is not limited to as such.

With respect to the volatile semiconductor memory element 70, the substrate 71, the gate-electrode 72, the gate-insulating layer 73, the gate-sidewall-insulating film 74, the source-region 75, the drain-region 76, and the first interlayered insulating film 77 may be formed by the same material and processes used for the substrate 51, the gate-electrode 52, the gate-insulating layer 53, the gate-sidewall-insulating film 54, the source-region 55, the drain-region 56, and the interlayered insulating film 57 according to the fourth embodiment.

After the gate-insulating layer 73, the gate-electrode 72, the gate-sidewall-insulating film 74, the source-region 75, the drain-region 76, the first interlayered insulating film 77 are formed on the substrate 71, the bit-line-electrode 78 is formed. There is no specific limitation regarding material and processes. For example, material for the bit-line-electrode 78 may be Al, Cu, etc. With respect to processes for forming the bit-line-electrode 78, for example, one can bury a through-hole in a vacuum deposition method such as a sputtering method or a CVD method, and then perform patterning by means of photolithography. Furthermore, one can bury the through-hole in a CVD method or a plating method, and then perform planarization in a CMP method, etc. Furthermore, a laminate with a layer of barrier metal such as TiN or TaN may be used, as needed. Furthermore, a W-plug may be used; one can bury the through-hole using W in a CVD method.

Then, the second interlayered insulating film 79 is formed. Material and processes for forming the second interlayered insulating film 79 may be the same as used for forming the interlayered insulating film 57 according to the fourth embodiment.

Then, the second capacitor-electrode 80 is formed. There is no specific limitation regarding material and processes. For example, material for the second capacitor-electrode 80 may be metal material such as Al, Cu, or Ru, and may be polysilicon, etc. With respect to processes for forming the second capacitor-electrode 80, for example, one can bury a through-hole in a vacuum deposition method such as a sputtering method or a CVD method, and then perform patterning by means of photolithography. Furthermore, one can bury the through-hole in a CVD method or a plating method, and then perform planarization in a CMP method, etc. Furthermore, a laminate with a layer of barrier metal such as TiN or TaN may be used, as needed. Furthermore, a W-plug may be used; one can bury the through-hole using W in a CVD method.

Then, the capacitor-dielectric layer 81 is formed. There is no specific limitation regarding material for the capacitor-dielectric layer 81. For example, material for the capacitor-dielectric layer 81 may be high dielectric constant oxide material containing Hf oxide, Ta oxide, La oxide, etc., or may be ferroelectric material such as PZT or SBT, etc. Among such materials, the first oxide is preferred for forming the capacitor-dielectric layer 81.

There is no specific limitation regarding processes for forming the capacitor-dielectric layer 81. For example, one can perform film formation in a vacuum deposition method such as a CVD method, an ALD method, or a sputtering method, and then form a desired pattern by use of photolithography, etc. It is possible to form an amorphous film, in any film formation methods above. In a case where the capacitor-dielectric layer 81 is formed by the first oxide, one can use the same process as used for the gate-insulating layer 13 according to the first embodiment.

Then, the first capacitor-electrode 82 is formed. There is no specific limitation regarding material and processes for forming the first capacitor-electrode 82. For example, material for the first capacitor-electrode 82 may be metal material such as Al, Cu, or Ru, and may be polysilicon. With respect to processes for forming the first capacitor-electrode 82, for example, one can perform film formation in a vacuum deposition method such as a CVD method or a sputtering method, and then perform patterning by means of photolithography, etc. Furthermore, a laminate with a layer of barrier metal such as TiN or TaN may be used, as needed.

Lastly, the passivation layer 113 is formed. Material and processes for forming the passivation layer 113 may be the same as the material and processes for forming the gate-insulating layer 13 according to the first embodiment. Through the above steps, the volatile semiconductor memory element 70 is manufactured.

Note that, although the description regarding the volatile semiconductor memory element 70 explains a volatile semiconductor memory element having a stacking structure, where a capacitor is disposed above an FET, the volatile semiconductor memory element 70 is not limited to as such. For example, the volatile semiconductor memory element 70 may be a volatile semiconductor memory element having a trench structure, where a capacitor is disposed below an FET, in a trench formed on the semiconductor substrate.

Furthermore, such a planar structure with respect to the second capacitor-electrode 80, capacitor-dielectric layer 81, and the first capacitor-electrode 82 of the volatile semiconductor memory element 70 may be formed to be a three-dimensional structure, etc., for increasing capacity of the capacitor.

As described above, usage of the first oxide for at least one of the gate-insulating layer and the passivation layer and usage of a low-cost patterning process, in which wet-etching is performed on the first oxide, enable producing a high quality (i.e. with low energy consumption and high reliability) volatile semiconductor memory element. Furthermore, usage of the first oxide for the capacitor-dielectric layer, in addition to the gate-insulating layer, enables preferably producing a volatile semiconductor memory element with even lower energy consumption.

Seventh Embodiment

The following description regarding the seventh embodiment explains an example of a non-volatile semiconductor memory element. Note that, in the description regarding the seventh embodiment, explanation of the same configuration already explained in the above embodiments may be omitted.

[Configuration of the Non-Volatile Semiconductor Memory Element]

Figure 11:
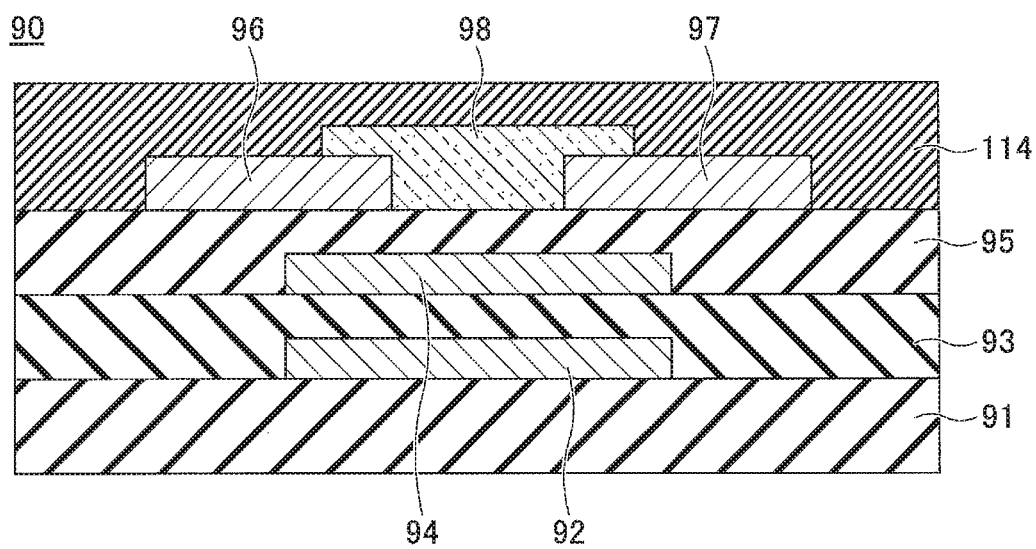
FIG. 11 is a cross-sectional view for explaining a configuration of a non-volatile semiconductor memory element according to a seventh embodiment and a method for manufacturing the non-volatile semiconductor memory element according to the seventh embodiment.

FIG. 11 is a cross-sectional view for explaining a configuration of a non-volatile semiconductor memory element according to the seventh embodiment and a method for manufacturing the non-volatile semiconductor memory element according to the seventh embodiment. According to FIG. 11, a non-volatile semiconductor memory element 90 includes a substrate 91, which is an insulating substrate, a gate-electrode 92, a first gate-insulating layer 93, a floating gate-electrode 94, a second gate-insulating layer 95, a source-electrode 96, a drain-electrode 97, an active layer 98, and a passivation layer 114. Note that the non-volatile semiconductor memory element 90 is a typical example of the semiconductor device according to the present invention.

For at least one of the first gate-insulating layer 93 and the passivation layer 114, the same oxide as used for at least one of the gate-insulating layer 13 and the passivation layer 17 in the first embodiment may be used.

In a case where the first gate-insulating layer 93 is formed by the first oxide, there is no specific limitation regarding material for the passivation layer 114. For example, an inorganic oxide film such as $SiO_2$, SiON, or SiN may be used.

Similarly, in a case where the passivation layer 114 is formed by the first oxide, there is no specific limitation regarding material for the first gate-insulating layer 93. For example, an inorganic oxide film such as $SiO_2$, SiON, or SiN may be used. However, the first oxide may be used for both of the first gate-insulating layer 93 and the passivation layer 114. In such a case, the boundary of the first gate-insulating layer 93 and the passivation layer 114 is more stable, and therefore the first gate-insulating layer 93 and the passivation layer 114 tend to have more reliable properties.

The first gate-insulating layer 93 is a so-called gate-electrodes-insulating layer. The second gate-insulating layer 95 is a so-called tunnel-insulating layer. The gate-electrode 92 is a so-called control-gate-electrode. By controlling condition of voltage-application to the source-electrode 96, the drain-electrode 97, and the gate-electrode 92, electrons are allowed to tunnel through the second gate-insulating layer 95, which is a tunnel-insulating layer, in and out the floating gate-electrode 94 because of tunneling-effect. In such a way, a function as a memory is achieved.

[Method for Manufacturing the Non-Volatile Semiconductor Memory Element]

Next, the following description explains a method for manufacturing the non-volatile semiconductor memory element 90. Although the following description explains a method for manufacturing a non-volatile semiconductor memory element having the first gate-insulating layer 93 and the passivation layer 114 both formed by the first oxide, the non-volatile semiconductor memory element 90 is not limited to as such.

For manufacturing the non-volatile semiconductor memory element 90, first the substrate 91 is prepared. Material for the substrate 91 may be the same as the material for the substrate 11 according to the first embodiment.

Then, the gate-electrode 92 is formed on the substrate 91. Material and processes for forming the gate-electrode 92 may be the same as the material and processes for forming the gate-electrode 12 according to the first embodiment.

Then, the first gate-insulating layer 93 is formed by the first oxide, so as to cover the gate-electrode 92. Processes for forming the first gate-insulating layer 93 may be the same as the processes for forming the gate-insulating layer 13 according to the first embodiment.

Then, the floating gate-electrode 94 is formed on the first gate-insulating layer 93. For forming the floating gate-electrode 94, various materials and processes may be used. For example, material for the floating gate-electrode 94 may be metal such as Mo, Al, or Cu, an alloy of such metal, transparent conductive oxide such as ITO or ATO, organic conductor such as PEDOT or PANI, etc. With respect to processes for forming the floating gate-electrode 94, for example, one can perform film formation in a sputtering method, a spin-coating or dis-coating method, etc., and then perform patterning by means of photolithography. Furthermore, one can perform a printing process such as inkjet printing, nanoimprinting, and gravure printing, so that a desired shape is directly formed.

Then, the second gate-insulating layer 95 is formed so as to cover the floating gate-electrode 94. There is no specific limitation regarding material; one can select proper material. Among material, low dielectric constant insulating material such as $SiO_2$ or fluoropolymer is preferred, for improving a coupling ratio. There is no specific limitation regarding processes for forming the second gate-insulating layer 95. For example, one can use a vacuum process such as a sputtering method, a CVD method, or an ALD method, or use a solution process such as spin-coating, die-coating, nozzle-coating, or inkjet printing by use of coating liquid containing metal alkoxide, metal complex, etc., or containing polymer, as needed. Furthermore, one can use a photolithography method, or use a printing method, so that a desired shape is directly formed.

Then, the source-electrode 96 and the drain-electrode 97 are formed on the second gate-insulating layer 95. Material and processes for forming the source-electrode 96 and the drain-electrode 97 may be the same as the material and processes for forming the source-electrode 14 and the drain-electrode 15 according to the first embodiment. Then, the active layer 98 is formed. There is no specific limitation regarding material for the active layer 98. For example, material for the active layer 90 may be an oxide semiconductor such as p-Si, a-Si, or In—Ga—Zn—O, and may be an organic semiconductor such as pentacene. Among such materials, an oxide semiconductor is preferred. There is no specific limitation regarding processes for forming the active layer 98. For example, one can perform film formation in a vacuum process such as a sputtering method, a PLD method, a CVD method, or an ALD method, or in a solution process such as a spin-coating or dip-coating method, and then perform patterning by means of photolithography. Alternatively, one can perform a printing process such as inkjet printing, nanoimprinting, or gravure printing, so that a desired shape is directly formed.

Lastly, the passivation layer 114 is formed. Material and processes for forming the passivation layer 114 may be the same as the material and processes for forming the gate-insulating layer 13 according to the first embodiment. Through the above steps, the non-volatile semiconductor memory element 90 is manufactured.

Here, the non-volatile semiconductor memory element 90 has a so-called bottom-gate/bottom-contact configuration, in terms of positional relations of the gate-electrode 92, the source-electrode 96, the drain-electrode 97, and the active layer 98. However, the non-volatile semiconductor memory element 90 according to the seventh embodiment is not limited to as such. For example, the non-volatile semiconductor memory element 90 may have a bottom-gate/top-contact, top-gate/bottom-contact, or top-gate/top-contact configuration.

Furthermore, such a planar structure with respect to the gate-electrode 92, the first gate-insulating layer 93, and the floating gate-electrode 94, of the non-volatile semiconductor memory element 90 may be formed to be a three-dimensional structure, etc., for increasing capacity of the capacitor.

As described above, usage of the first oxide for at least one of the gate-insulating layer and the passivation layer and usage of a low-cost patterning process, in which wet-etching is performed on the first oxide, enable producing a high quality (i.e. with low energy consumption and high reliability) non-volatile semiconductor memory element. That is to say, is possible to lessen voltage for writing/deleting by reducing leakage current and to improve durability of the element.

Eighth Embodiment

The following description regarding the eighth embodiment explains another example of the non-volatile semiconductor memory element. Note that, in the description regarding the eighth embodiment, explanation of the same configuration already explained in the above embodiments may be omitted.

[Configuration of the Non-Volatile Semiconductor Memory Element]

Figure 12:
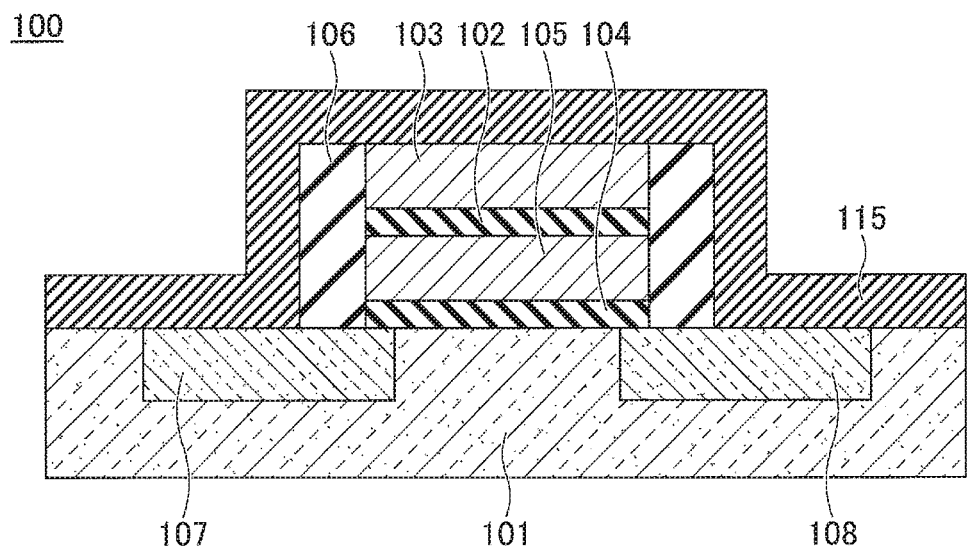
FIG. 12 is a cross-sectional view for explaining a configuration of a non-volatile semiconductor memory element according to an eighth embodiment and a method for manufacturing the non-volatile semiconductor memory element according to the eighth embodiment.

FIG. 12 is a cross-sectional view for explaining a configuration of a non-volatile semiconductor memory element according to the eighth embodiment and a method for manufacturing the non-volatile semiconductor memory element according to the eighth embodiment. According to FIG. 12, a non-volatile semiconductor memory element 100 includes a substrate 101, which is a semiconductor substrate, a first gate-insulating layer 102, a gate-electrode 103, a second gate-insulating layer 104, a floating gate-electrode 105, a gate-sidewall-insulating film 106, a source-region 107, a drain-region 108, and a passivation layer 115. Note that the non-volatile semiconductor memory element 100 is a typical example of the semiconductor device according to the present invention.

For at least one of the first gate-insulating layer 102 and the passivation layer 115, the same oxide as used for at least one of the gate-insulating layer 13 and the passivation layer 17 in the first embodiment may be used.

In a case where the first gate-insulating layer 102 is formed by the first oxide, there is no specific limitation regarding material for the passivation layer 115. For example, an inorganic oxide film such as $SiO_2$, SiON, or SiN may be used.

Similarly, in a case where the passivation layer 115 is formed by the first oxide, there is no specific limitation regarding material for the first gate-insulating layer 102. For example, an inorganic oxide film such as $SiO_2$, SiON, or SiN may be used. However, the first oxide may be used for both of the first gate-insulating layer 102 and the passivation layer 115. In such a case, the boundary of the first gate-insulating layer 102 and the passivation layer 115 is more stable, and therefore the first gate-insulating layer 102 and the passivation layer 115 tend to have more reliable properties.

The first gate-insulating layer 102 is a so-called gate-electrodes-insulating layer. The second gate-insulating layer 104 is a so-called tunnel-insulating layer. The gate-electrode 103 is a so-called control-gate-electrode. By controlling condition of voltage-application to the source-region 107, the drain-region 108, and the gate-electrode 103, electrons are allowed to tunnel through the second gate-insulating layer 104, which is a tunnel-insulating layer, in and out the floating gate-electrode 105 because of tunneling-effect. In such a way, a function as a memory is achieved.

[Method for Manufacturing the Non-Volatile Semiconductor Memory Element]

Next, the following description explains a method for manufacturing the non-volatile semiconductor memory element 100. Although the following description explains a method for manufacturing a non-volatile semiconductor memory element having the first gate-insulating layer 102 and the passivation layer 115 both formed by the first oxide, the non-volatile semiconductor memory element 100 is not limited to as such.

For manufacturing the non-volatile semiconductor memory element 100, first, the substrate 101 is prepared. Material for the substrate 101 may be the same as the material for the substrate 51 according to the fourth embodiment.

Then, the second gate-insulating layer 104 is formed. There is no specific limitation regarding material for the second gate-insulating layer 104, although, for example, low dielectric constant insulating material such as $SiO_2$ is preferred. There is no specific limitation regarding processes for forming the second gate-insulating layer 104. For example, one can use a vacuum deposition method such as a thermal oxidation method, a sputtering method, a CVD method, or an ALD method.

Then, the floating gate-electrode 105 is formed. There is no specific limitation regarding material and processes for forming the floating gate-electrode 105. For example, material for the floating gate-electrode 105 may be polysilicon, metal material such as Al, or a laminate of polysilicon, metal material, and barrier metal such as TiN or TaN. For example, processes for forming the floating gate-electrode 105 may be a vacuum deposition method such as a CVD method or a sputtering method.

Then, the first gate-insulating layer 102 is formed by the first oxide. Processes for forming the first gate-insulating layer 102 may be the same as the processes for forming the gate-insulating layer 13 according to the first embodiment.

Then, the gate-electrode 103 is formed. Material and processes for forming the gate-electrode 103 may be the same as the material and processes for forming the gate-insulating layer 53 according to the fourth embodiment.

There is no specific limitation regarding patterning of the first gate-insulating layer 102, the gate-electrode 103, the second gate-insulating layer 104, and the floating gate-electrode 105. For example, one can form a desired pattern by use of photolithography.

Then, the gate-sidewall-insulating film 106 is formed. Material and processes for forming the gate-sidewall-insulating film 106 may be the same as the material and processes for forming the gate-sidewall-insulating film 54 according to the fourth embodiment. Then, ion implantation is selectively performed on the substrate 101, in order to form the source-region 107 and the drain-region 108. For lowering resistivity, one can form a layer of silicide such as Ni, Co, or Ti on a surface of the source-region 107 and the drain-region 108.

Lastly, the passivation layer 115 is formed. Material and processes for forming the passivation layer 115 may be the same as the material and processes for forming the gate-insulating layer 13 according to the first embodiment. Through the above steps, the non-volatile semiconductor memory element 100 is manufactured.

Furthermore, such a planar structure with respect to the first gate-insulating layer 102, the gate-electrode 103, and the floating gate-electrode 105 of the non-volatile semiconductor memory element 100 may be formed to be a three-dimensional structure, etc., for increasing capacity of the capacitor.

As described above, usage of the first oxide for at least one of the first gate-insulating layer and the passivation layer and usage of a low-cost, patterning process, in which wet-etching is performed on the first oxide, enable producing a high quality (i.e. with low energy consumption and high reliability) non-volatile semiconductor memory element. That is to say, is possible to lessen voltage for writing/deleting by reducing leakage current and to improve durability of the element.

Ninth Embodiment

The following description regarding the ninth embodiment explains an example of an FET having multiple passivation layers. Note that, in the description regarding the ninth embodiment, explanation of the same configuration already explained in the above embodiments may be omitted.

[Configuration of the FET]

Figure 13:
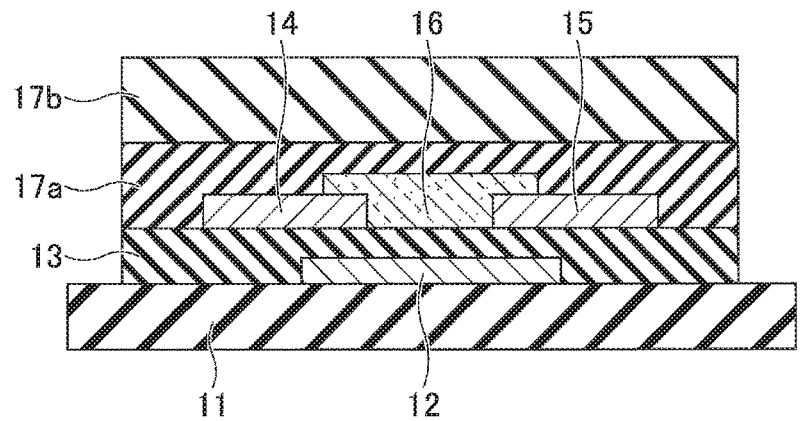
FIG. 13 is a cross-sectional view for explaining an FET according to a ninth embodiment.

FIG. 13 is a cross-sectional view for explaining an FET according to the ninth embodiment. According to FIG. 13, an FET 110 is a bottom-gate/bottom-contact FET including the substrate 11, the gate-electrode 12, the gate-insulating layer 13, the source-electrode 14, the drain-electrode 15, the active layer 16, a first passivation layer 17a, and a second passivation layer 17b. Note that the FET 110 is a typical example of the semiconductor device according to the present invention.

The FET 110 includes the gate-electrode 12 formed on the substrate 11, which has insulating property, and includes the gate-insulating layer 13 formed so as to cover the gate-electrode 12. Furthermore, the source-electrode 14 and the drain-electrode 15 are formed on the gate-insulating layer 13, and the active layer 16 is formed so as to partially cover the source-electrode 14 and the drain-electrode 15. The source-electrode 14 and the drain-electrode 15 are formed at a predetermined distance via the active layer 16, which turns into a channel region. Furthermore, the passivation layer 17a is formed over the gate-insulating layer 13, so as to cover the source-electrode 14, the drain-electrode 15, and the active layer 16, and the second passivation layer 17b is formed on the first passivation layer 17a.

In practice, a passivation layer is formed to be an upper layer of the substrate 11. The passivation layer includes the first passivation layer 17a and the second passivation layer 17b formed in contact with the first passivation layer 17a. In an example of FIG. 13, the first passivation layer 17a is formed on the gate-insulating layer 13, so as to cover the source-electrode 14, the drain-electrode 15, and the active layer 16.

With respect to the passivation layer, there is no specific limitation regarding arrangement of the first passivation layer 17a and the second passivation layer 17b; the arrangement may be selected properly in accordance with intended purposes. The first passivation layer 17a may be arranged closer to the active layer 16 than the second passivation layer 17b, as illustrated in FIG. 13. Contrarily, the second passivation layer 17b may be arranged closer to the active layer 16 than the first passivation layer 17a. Furthermore, the second passivation layer 17b may be arranged so as to cover the top surface and the side surfaces of the first passivation layer 17a. Contrarily, the first passivation layer 17a may be arranged so as to cover the top surface and the side surfaces of the second passivation layer 17b.

(First Passivation Layer 17a)

The first passivation layer 17a is preferred to be a second oxide.

(Second Oxide)

The second oxide contains Si and alkaline earth metal, and is preferred to contain at least one of Al and boron (B). Further, the second oxide may contain other elements, if needed.

With respect to the second oxide, $SiO_2$, which is constituted by Si, has an amorphous structure. Further, alkaline earth metal has a function to break Si—O bonds. Thus, dielectric constant and linear-expansion coefficient of the second oxide may be controlled, based on a composition ratio of Si and alkaline earth metal.

The second oxide is preferred to contain at least one of Al and B. $Al_2O_3$, which is constituted by Al, and $B_2O_3$, which is constituted by B, have amorphous structures, similarly to $SiO_2$. Thus, the second oxide containing Al and/or B has a more stable amorphous structure, and therefore, enables forming an insulating layer with higher uniformity. Furthermore, dielectric constant and linear-expansion coefficient of the second oxide may be controlled, as alkaline earth metal changes coordination-structure of Al and B, based on a composition ratio.

The alkaline earth metal of the second oxide may be Be, Mg, Ca, Sr, Ba, etc. The alkaline earth metal may be constituted by one element of the above, or may be constituted by two or more elements of the above.

There is no specific limitation regarding the composition ratio of Si and alkaline earth metal contained in the second oxide; the composition ratio may be selected properly in accordance with an intended purpose. However, the composition ratio is preferred to be in a range as described below.

The composition ratio of Si and alkaline earth metal (Si:alkaline earth metal) contained in the second oxide is preferred to be; 50.0 mol % or more and 90.0 mol % or less: 10.0 mol % or more and 50.0 mol % or less, in terms of oxide (e.g. $SiO_2$, BeO, MgO, CaO, SrO, BaO).

There is no specific limitation regarding the composition ratio of Si, alkaline earth metal, and at least one of Al and B contained in the second oxide; the composition ratio may be selected properly in accordance with an intended purpose. However, the composition ratio is preferred to be in a range as described below.

The composition ratio of Si, alkaline earth metal, and at least one of Al and B (Si:alkaline earth metal: at least one of Al and B) contained in the second oxide is preferred to be; 50.0 mol % or more and 90.0 mol % or less: 5.0 mol % or more and 20.0 mol % or less: 5.0 mol % or more and 30.0 mol % or less, in terms of oxide (e.g. $SiO_2$, BeO, MgO, CaO, SrO, BaO, $Al_2O_3$, $B_2O_3$).

The ratio of oxide (e.g. $SiO_2$, BeO, MgO, CaO, SrO, BaO, $Al_2O_3$, $B_2O_3$) contained in the second oxide may be calculated, by performing an analysis regarding cationic elements in oxide by means of a fluorescent X-ray analysis, an EPMA, an ICP-AES, etc.

There is no specific limitation regarding dielectric constant of the first passivation layer 17a; dielectric constant may be selected properly in accordance with an intended purpose.

For measuring dielectric constant of the first passivation layer 17a, one can prepare a capacitor, which is formed by laminating a lower-electrode, a dielectric layer (i.e. the first passivation layer 17a), and an upper electrode, and then measure dielectric constant by use of an inductance-capacitance-resistance (LCR) meter.

There is no specific limitation regarding linear-expansion coefficient of the first passivation layer 17a; linear-expansion coefficient may be selected properly in accordance with an intended purpose.

Linear-expansion coefficient of the first passivation layer 17a may be measured, for example, by means of a thermomechanical analyzer. In the way of measuring linear-expansion coefficient, one can prepare a sample for the measurement, which has the same composition as the first passivation layer 17a, instead of preparing an FET.

(Second Passivation Layer 17b)

The second passivation layer 17b contains a first oxide. The first oxide may be the same oxide as offered as examples of material for the gate-insulating layer 13 or the passivation layer 17 in the first embodiment. In other words, the first oxide contains Element-A (i.e. alkaline earth metal) and Element-B (i.e. at least one of Ga, Sc, Y, and a lanthanoid), at least. Furthermore, the first oxide may contain other elements, if needed.

There is no specific limitation regarding dielectric constant of the second passivation layer 17b; dielectric constant may be selected properly in accordance with an intended purpose. Dielectric constant of the second passivation layer 17b may be measured, for example, in the same method as used for measuring dielectric constant of the first passivation layer 17a.

There is no specific limitation regarding linear-expansion coefficient of the second passivation layer 17b; linear-expansion coefficient may be selected properly in accordance with an intended purpose. Linear-expansion coefficient of the second passivation layer 17b may be measured, for example, in the same method as used for measuring linear-expansion coefficient of the first passivation layer 17a.

The inventors have found that a passivation layer that is formed in a laminated structure of the first passivation layer 17a and the second passivation layer 17b has a remarkable barrier performance against moisture, oxygen, nitrogen, etc., in the atmosphere. Here, the first passivation layer 17a contains the second oxide including Si and alkaline earth metal, and the second passivation layer 17b contains the first oxide (e.g. paraelectric amorphous oxide) including Element-A (i.e. alkaline earth metal) and Element-B (i.e. at least one of Ga, Sc, Y, and a lanthanoid). Thus, such a passivation layer enables producing a highly reliable FET, with small shift of threshold-voltage on a BTS test.

[Method for Manufacturing the FET]

The following description explains a method for manufacturing the FET 110 illustrated in FIG. 13. FIGS. 14A to 15C are drawings illustrating examples of steps for manufacturing the FET 110 according to the ninth embodiment.

First, the same steps as illustrated in FIGS. 2A through 3A in the first embodiment are performed. Then, at a step illustrated in FIG. 14A, a first passivation layer 170a (i.e. a layer to be formed into the first passivation layer 17a in an etching process) is formed all over the substrate 11 and the gate-insulating layer 13, so as to cover the source-electrode 14, the drain-electrode 15, and the active layer 16. Then, a second passivation layer 170b (i.e. a layer to be formed into the second passivation layer 17b in an etching process) is formed all over the first passivation layer 170a.

There is no specific limitation regarding methods for forming the first passivation layer 170a and the second passivation layer 170b; the methods may be selected properly in accordance with intended purposes. For example, film formation may be performed in a vacuum process such as a sputtering method, a PLD method, a CVD method, or an ALD method.

Furthermore, to perform film formation of the first passivation layer 170a, one can prepare coating liquid (i.e. coating liquid for forming a first passivation layer) containing a precursor of the second oxide, then apply or print the coating liquid to/on an application-object, and then burn the application-object in an appropriate condition. Similarly, to perform film formation of the second passivation layer 170b, one can prepare coating liquid (i.e. coating liquid for forming a second passivation layer) containing a precursor of the first oxide, then apply or print the coating liquid to/on an application-object, and then burn the application-object in an appropriate condition.

Average film thickness of the first passivation layer 170a is preferred to be in a range of 10 nm or more and 1,000 nm or less, and more preferably is in a range of 20 nm or more and 500 nm or less. Average film thickness of the second passivation layer 170b is preferred to be in a range of 10 nm or more and 1,000 nm or less, and more preferably is in a range of 20 nm or more to 500 nm or less.

—Coating Liquid for Forming a First Passivation Layer—

The coating liquid for forming a first passivation layer contains a silicon-containing compound, an alkaline earth metal compound, and solvent, at least, and preferably contains at least one of an aluminum-containing compound and a boron-containing compound. Furthermore, the coating liquid for forming a first passivation layer may contain other elements, if needed.

—Silicon-Containing Compound—

A silicon-containing compound may be, for example, an inorganic silicon compound, an organic silicon compound, etc.

An inorganic silicon compound may be, for example, tetrachlorosilane, tetrabromosilane, tetraiodosilane, etc.

There is no specific limitation regarding an organic silicon compound, as long as being a compound including Si and an organic group; an organic silicon compound may be selected properly in accordance with an intended purpose. Si and an organic group may be bound, for example, in ionic bonding, covalent bonding, coordinate bonding, etc.

There is no specific limitation regarding an organic group; an organic group may be selected properly in accordance with an intended purpose. An organic group may be, for example, an alkyl group that may include a substituent group, an alkoxy group that may include a substituent group, an acyloxy group that may include a substituent group, a phenyl group that may include a substituent group, etc. An alkyl group may be, for example, an alkyl group having a carbon number of 1 to 6, etc. An alkoxy group may be, for example, an alkoxy group having a carbon number of 1 to 6, etc. An acyloxy group may be, for example, an acyloxy group having a carbon number of 1 to 10, etc.

An organic silicon compound may be, for example, tetramethoxysilane, tetraethoxysilane, tetraisopropoxysilane, tetrabutoxysilane, 1,1,1,3,3,3-hexamethyldisilazane (HMDS; product of TOKYO OHKA KOGYO Co., Ltd.), bis(trimethylsilyl)acetylene, triphenylsilane, 2-ethyl silicon hexanoate, tetraacetoxysilane, etc.

There is no specific limitation regarding an amount of silicon-containing compounds in the coating liquid for forming a first passivation layer; the amount of silicon-containing compounds may be selected properly in accordance with an intended purpose.

—Alkaline Earth Metal-Containing Compound—

An alkaline earth metal-containing compound may be, for example, an inorganic alkaline earth metal compound, an organic alkaline earth metal compound, etc. Alkaline earth metal contained in an alkaline earth metal-containing compound may be, for example, Be, Mg, Ca, Sr, Ba, etc.

An inorganic alkaline earth metal compound may be, for example, alkaline earth metal nitrate, alkaline earth metal sulfate, alkaline earth metal chloride, alkaline earth metal fluoride, alkaline earth metal bromide, alkaline earth metal halide, etc.

Alkaline earth metal nitrate may be, for example, magnesium nitrate, calcium nitrate, strontium nitrate, barium nitrate, etc.

Alkaline earth metal sulfate may be, for example, magnesium sulfate, calcium sulfate, strontium sulfate, barium sulfate, etc.

Alkaline earth metal chloride may be, for example, magnesium chloride, calcium chloride, strontium chloride, barium chloride, etc.

Alkaline earth metal fluoride may be, for example, magnesium fluoride, calcium fluoride, strontium fluoride, barium fluoride, etc.

Alkaline earth metal bromide may be, for example, magnesium bromide, calcium bromide, strontium bromide, barium bromide, etc.

Alkaline earth metal iodide may be, for example, magnesium iodide, calcium iodide, strontium iodide, barium iodide, etc.

There is no specific limitation regarding an organic alkaline earth metal compound, as long as being a compound containing alkaline earth metal and an organic group; an organic alkaline earth metal compound and may be selected properly in accordance with an intended purpose. Alkaline earth metal and an organic group may be bound, for example, in ionic bonding, covalent bonding, coordinate bonding, etc.

There is no specific limitation regarding an organic group; an organic group may be selected properly in accordance with an intended purpose. For example, an organic group may be an alkyl group that may include a substituent group, an alkoxy group that may include a substituent group, an acyloxy group that may include a substituent group, a phenyl group that may include a substituent group, an acetylacetonate group that may include a substituent group, a sulfonic acid group that may include a substituent group, etc. An alkyl group may be, for example, an alkyl group having a carbon number of 1 to 6, etc. An alkoxy group may be an alkoxy group having a carbon number of 1 to 6, etc. An acyloxy group may be, for example, an acyloxy group having a carbon number of 1 to 10, an acyloxy group partially substituted by a benzene ring (e.g. benzoic acid), an acyloxy group partially substituted by a hydroxy group (e.g. lactic acid), an acyloxy group having two or more carbonyl groups (e.g. oxalic acid and citric acid), etc.

An organic alkaline earth metal compound may be, for example, magnesium methoxide, magnesium ethoxide, diethyl magnesium, magnesium acetate, magnesium formate, acetyl acetone magnesium, magnesium 2-ethylhexanoate, magnesium lactate, magnesium naphthenate, magnesium citrate, magnesium salicylate, magnesium benzoate, magnesium oxalate, trifluoro magnesium methosulfonate, calcium methoxide, calcium ethoxide, calcium acetate, calcium formate, calcium acetylacetonate, calcium dipivaloyl methanate, calcium 2-ethylhexanoate, calcium lactate, calcium naphthenate, calcium citrate, calcium salicylate, oxalate, strontium isopropoxide, strontium acetate, strontium formate, acetylacetone strontium, strontium 2-ethylhexanoate, strontium lactate, strontium naphthenate, strontium salicylate, strontium oxalate, barium ethoxide, barium isopropoxide, barium acetate, barium formate, barium acetate, barium acetate, barium acetate, barium 2-ethylhexanoate, lactic acid barium, barium naphthenate, barium neodecanoate, barium oxalate, barium benzoate, barium trifluoromethanesulfonate, bis(acetylacetonate)beryllium, etc.

There is no specific limitation regarding an amount of alkaline earth metal-containing compounds in the coating liquid for forming a first passivation layer; the amount of alkaline earth metal-containing compounds may be selected properly in accordance with an intended purpose.

—Aluminum-Containing Compound—

An aluminum-containing compound may be, for example, an inorganic aluminum compound, an organic aluminum compound, etc.

An inorganic aluminum compound may be, for example, aluminum chloride, aluminum nitrate, aluminum bromide, aluminum hydroxide, aluminum borate, aluminum trifluoride, aluminum iodide, aluminum sulfate, aluminum phosphate, ammonium aluminum sulfate, etc.

There is no specific limitation regarding an organic aluminum compound, as long as being a compound containing Al and an organic group; an organic aluminum compound may be selected properly in accordance with an intended purpose. Al and an organic group may be bound, for example, in ionic bonding, covalent bonding, coordinate bonding, etc.

There is no specific limitation regarding an organic group; an organic group may be selected properly in accordance with an intended purpose. An organic group may be, for example, an alkyl group that may include a substituent group, an alkoxy group that may include a substituent group, an acyloxy group that may include a substituent group, an acetylacetonate group that may include a substituent group, a sulfonic acid group that may include a substituent group, etc. An alkyl group may be, for example, an alkyl group having a carbon number of 1 to 6, etc. An alkoxy group may be an alkoxy group having a carbon number of 1 to 6, etc. An acyloxy group may be, for example, an acyloxy group having a carbon number of 1 to 10, an acyloxy group partially substituted by a benzene ring (e.g. benzoic acid), an acyloxy group partially substituted by a hydroxy group (e.g. lactic acid), an acyloxy group having two or more carbonyl groups (e.g. oxalic acid and citric acid), etc.

An organic aluminum compound may be, for example, aluminum isopropoxide, aluminum-sec-butoxide, triethylaluminum, diethylaluminum ethoxide, aluminum acetate, aluminum acetylacetonate, aluminum hexafluoroacetylacetonate, aluminum 2-ethylhexanoate, aluminum lactate, aluminum benzoate, aluminum di(s-butoxide)acetoacetic acid ester chelate, aluminum trifluoromethanesulfonate, etc.

There is no specific limitation regarding an amount of aluminum-containing compounds in the coating liquid for forming a first passivation layer; the amount of aluminum-containing compounds may be selected properly in accordance with an intended purpose.

—Boron-Containing Compound—

A boron-containing compound may be, for example, an inorganic boron compound, an organoboron compound, etc.

An inorganic boron compound may be, for example, orthoboric acid, boron oxide, boron tribromide, tetrafluoroboric acid, ammonium borate, magnesium borate, etc. Boron oxide may be, for example, diboron dioxide, diboron trioxide, tetraboron trioxide, tetraboron pentoxide, etc.

There is no specific limitation regarding an organoboron compound, as long as being a compound containing B and an organic group; an organoboron compound may be selected properly in accordance with an intended purpose. B and an organic group may be bound, for example, in ionic bonding, covalent bonding, coordinate bonding, etc.

There is no specific limitation regarding an organic group; an organic group may be selected properly in accordance with an intended purpose. An organic group may be, for example, an alkyl group that may include a substituent group, an alkoxy group that may include a substituent group, an acyloxy group that may include a substituent group, a phenyl group that may include a substituent group, a sulfonic acid group that may include a substituent group, a thiophene group that may include a substituent group, etc. An alkyl group may be, for example, an alkyl group having a carbon number of 1 to 6, etc. An alkoxy group may be, for example, an alkoxy group having a carbon number of 1 to 6, etc. Examples of an alkoxy group include an organic group having two or more oxygen atoms, among which two oxygen atoms are bound with B in order to form a ring structure together with B. Furthermore, examples of an alkoxy group include an alkoxy group, in which an alkyl group is substituted by an organosilyl group. An acyloxy group may be, for example, an acyloxy group having a carbon number of 1 to 10, etc.

An organoboron compound may be, for example, (R)-5,5-diphenyl-2-methyl-3,4-propano-1,3,2-oxazaborolidine, triisopropyl borate, 2-isopropoxy-4,4,5,5-tetramethyl-1,3,2-dioxaborolane, bis(hexylene glycolato)diboron, 4-(4,4,5,5-tetramethyl-1,3,2-dioxaborolan-2-yl)-1H-pyrazole, (4,4,5,5-tetramethyl-1,3,2-dioxaborolan-2-yl)benzene, tert-butyl-N-[4-(4,4,5,5-tetramethyl-1,2,3-dioxaborolan-2-yl)phenyl] carbamate, phenylboronic acid, 3-acetylphenylboronic acid, boron trifluorideacetate complex, boron trifluoride sulforane complex, 2-thiopheneboronic acid, tris(trimethylsilyl)borate, etc.

There is no specific limitation regarding an amount of boron-containing compounds in the coating liquid for forming a first passivation layer; the amount of boron-containing compounds may be selected properly in accordance with an intended purpose.

—Solvent—

There is no specific limitation regarding solvent, as long as being solvent that stably dissolves and disperses compounds; solvent may be selected properly in accordance with an intended purpose. For example, solvent may be toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethylhexanoic acid, mineral spirits, dimethylpropylene urea, 4-butyrolactone, 2-methoxyethanol, propylene glycol, water, etc.

There is no specific limitation regarding an amount of solvent in the coating liquid for forming a first passivation layer; the amount of solvent may be selected properly in accordance with an intended purpose.

There is no specific limitation regarding a composition ratio (silicon-containing compound: alkaline earth metal-containing compound) of silicon-containing compounds and alkaline earth metal-containing compounds in the coating liquid for forming a first passivation layer; the composition ratio may be selected properly in accordance with an intended purpose. However, the composition ratio is preferred to be in a range as described below.

The composition ratio (Si:alkaline earth metal) of Si and alkaline earth metal in the coating liquid for forming a first passivation layer is preferred to be; 50.0 mol % or more and 90.0 mol % or less: 10.0 mol % or more and 50.0 mol % or less, in terms of oxide (e.g. $SiO_2$, BeO, MgO, CaO, SrO, BaO).

There is no specific limitation regarding a composition ratio (silicon-containing compound: alkaline earth metal-containing compound: at least one of aluminum-containing compound and boron-containing compound) of silicon-containing compounds, alkaline earth metal-containing compounds, and at least one of aluminum-containing compounds and boron-containing compounds in the coating liquid for forming a first passivation layer; the composition ratio may be selected properly in accordance with an intended purpose. However, the composition ratio is preferred to be in a range as described below.

The composition ratio (Si:alkaline earth metal: at least one of Al and B) of Si, alkaline earth metal, and at least one of Al and B, in the coating liquid for forming a first passivation layer is preferred to be; 50.0 mol % or more and 90.0 mol % or less: 5.0 mol % or more and 20.0 mol % or less: 5.0 mol % or more and 30.0 mol % or less, in terms of oxide (e.g. $SiO_2$, BeO, MgO, CaO, SrO, BaO, $Al_2O_3$, $B_2O_3$).

—Coating Liquid for Forming a Second Passivation Layer—

The coating liquid for forming a second passivation layer contains an alkaline earth metal-containing compound (i.e. Element-A-containing compound), an Element-B-containing compound, and solvent, at least. Further, the coating liquid for forming a second passivation layer is preferred to contain at least one of Element-C-containing compounds. Furthermore, the coating liquid for forming a second passivation layer may contain other elements, if needed.

—Alkaline Earth Metal-Containing Compound (Element-A-Containing Compound)—

An alkaline earth metal-containing compound may be, for example, an inorganic alkaline earth metal compound, an organic alkaline earth metal compound, etc. Alkaline earth metal contained in an alkaline earth metal-containing compound may be, for example, Be, Mg, Ca, Sr, Ba, etc.

An inorganic alkaline earth metal compound may be, for example, alkaline earth metal nitrate, alkaline earth metal sulfate, alkaline earth metal chloride, alkaline earth metal fluoride, alkaline earth metal bromide, alkaline earth metal halide, etc.

Alkaline earth metal nitrate may be, for example, magnesium nitrate, calcium nitrate, strontium nitrate, barium nitrate, etc.

Alkaline earth metal sulfate may be, for example, magnesium sulfate, calcium sulfate, strontium sulfate, barium sulfate, etc.

Alkaline earth metal chloride may be, for example, magnesium chloride, calcium chloride, strontium chloride, barium chloride, etc.

Alkaline earth metal fluoride may be, for example, magnesium fluoride, calcium fluoride, strontium fluoride, barium fluoride, etc.

Alkaline earth metal bromide may be, for example, magnesium bromide, calcium bromide, strontium bromide, barium bromide, etc.

Alkaline earth metal iodide may be, for example, magnesium iodide, calcium iodide, strontium iodide, barium iodide, etc.

There is no specific limitation regarding an organic alkaline earth metal compound, as long as being a compound containing alkaline earth metal and an organic group; an organic alkaline earth metal compound and may be selected properly in accordance with an intended purpose. Alkaline earth metal and an organic group may be bound, for example, in ionic bonding, covalent bonding, coordinate bonding, etc.

There is no specific limitation regarding an organic group; an organic group may be selected properly in accordance with an intended purpose. For example, an organic group may be an alkyl group that may include a substituent group, an alkoxy group that may include a substituent group, an acyloxy group that may include a substituent group, a phenyl group that may include a substituent group, an acetylacetonate group that may include a substituent group, a sulfonic acid group that may include a substituent group, etc. An alkyl group may be, for example, an alkyl group having a carbon number of 1 to 6, etc. An alkoxy group may be an alkoxy group having a carbon number of 1 to 6, etc. An acyloxy group may be, for example, an acyloxy group having a carbon number of 1 to 10, an acyloxy group partially substituted by a benzene ring (e.g. benzoic acid), an acyloxy group partially substituted by a hydroxy group (e.g. lactic acid), an acyloxy group having two or more carbonyl groups (e.g. oxalic acid and citric acid), etc.

An organic alkaline earth metal compound may be, for example, magnesium methoxide, magnesium ethoxide, diethyl magnesium, magnesium acetate, magnesium formate, acetyl acetone magnesium, magnesium 2-ethylhexanoate, magnesium lactate, magnesium naphthenate, magnesium citrate, magnesium salicylate, magnesium benzoate, magnesium oxalate, trifluoro magnesium methosulfonate, calcium methoxide, calcium ethoxide, calcium acetate, calcium formate, calcium acetylacetonate, calcium dipivaloyl methanate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, acetylacetone strontium, strontium 2-ethylhexanoate, strontium lactate, strontium naphthenate, strontium salicylate, strontium oxalate, barium ethoxide, barium isopropoxide, barium acetate, barium formate, barium acetate, barium acetate, barium acetate, barium 2-ethylhexanoate, lactic acid Barium, barium naphthenate, barium neodecanoate, barium oxalate, barium benzoate, barium trifluoromethanesulfonate, bis(acetylacetonate)beryllium, etc.

There is no specific limitation regarding an amount of alkaline earth metal-containing compounds in the coating liquid for forming a second passivation layer; the amount of alkaline earth metal-containing compounds may be selected properly in accordance with an intended purpose.

(Element-B-Containing Compound)

A rare earth element contained in Element-B-containing compounds may be, for example, Ga, Sc, Y, La, Ce, Pr, Nd, Pm, Sm, Eu, Gd, Tb, Dy, Ho, Er, Tm, Yb, Lu, etc.

An Element-B-containing compound may be, for example, an inorganic Element-B-containing compound, an organic Element-B-containing compound, etc.

An inorganic Element-B-containing compound may be, for example, nitrate of Element-B, sulfate of Element-B, fluoride of Element-B, chloride of Element-B, bromide of Element-B, iodide of Element-B, etc.

Nitrate of Element-B may be, for example, gallium nitrate, scandium nitrate, yttrium nitrate, lanthanum nitrate, cerium nitrate, praseodymium nitrate, neodymium nitrate, samarium nitrate, europium nitrate, gadolinium nitrate, terbium nitrate, dysprosium nitrate, holmium nitrate, erbium nitrate, thulium nitrate, ytterbium nitrate, lutetium nitrate, etc.

Sulfate of Element-B may be, for example, gallium sulfate, scandium sulfate, yttrium sulfate, lanthanum sulfate, cerium sulfate, praseodymium sulfate, neodymium sulfate, samarium sulfate, europium sulfate, gadolinium sulfate, terbium sulfate, dysprosium sulfate, holmium sulfate, erbium sulfate, thulium sulfate, ytterbium sulfate, lutetium sulfate, etc.

Fluoride of Element-B may be, for example, gallium fluoride, scandium fluoride, yttrium fluoride, lanthanum fluoride, cerium fluoride, praseodymium fluoride, neodymium fluoride, samarium fluoride, europium fluoride, gadolinium fluoride, terbium fluoride, dysprosium fluoride, holmium fluoride, erbium fluoride, thulium fluoride, ytterbium fluoride, lutetium fluoride, etc.

Chloride of Element-B may be, for example, gallium chloride, scandium chloride, yttrium chloride, lanthanum chloride, cerium chloride, praseodymium chloride, neodymium chloride, samarium chloride, europium chloride, gadolinium chloride, terbium chloride, dysprosium chloride, holmium chloride, erbium chloride, thulium chloride, ytterbium chloride, lutetium chloride, etc.

Bromide of Element-B may be, for example, gallium bromide, scandium bromide, yttrium bromide, lanthanum bromide, cerium bromide, praseodymium bromide, neodymium bromide, samarium bromide, europium, bromide, gadolinium bromide, terbium bromide, dysprosium bromide, holmium bromide, erbium bromide, thulium bromide, ytterbium bromide, lutetium bromide, etc.

Iodide of Element-B may be, for example, gallium iodide, scandium iodide, yttrium iodide, lanthanum iodide, cerium iodide, praseodymium iodide, neodymium iodide, samarium iodide, europium iodide, gadolinium iodide, terbium iodide, dysprosium iodide, holmium iodide, erbium iodide, thulium iodide, ytterbium iodide, lutetium iodide, etc.

There is no specific limitation regarding an organic Element-B compound, as long as being a compound containing Element-B and an organic group; an organic Element-B compound may be selected properly in accordance with an intended purpose. Element-B and an organic group may be bound, for example, in ionic bonding, covalent bonding, coordinate bonding, etc.

There is no specific limitation regarding an organic group; an organic group may be selected properly in accordance with an intended purpose. For example, an organic group may be an alkyl group that may include a substituent group, an alkoxy group that may include a substituent group, an acyloxy group that may include a substituent group, an acetylacetonate group that may include a substituent group, a cyclopentadienyl group that may include a substituent group. An alkyl group may be, for example, an alkyl group having a carbon number of 1 to 6, etc. An alkoxy group may be, for example, an alkoxy group having a carbon number of 1 to 6, etc. An acyloxy group may be, for example, an acyloxy group having a carbon number of 1 to 10, etc.

An organic Element-B compound may be, for example, tris(cyclopentadienyl)gallium, scandium isopropoxide, scandium acetate, tris(cyclopentadienyl)scandium, yttrium isopropoxide, yttrium 2-ethylhexanoate, tris(acetylacetonate)yttrium, tris(cyclopentadienyl)yttrium, lanthanum isopropoxide, lanthanum 2-ethylhexanoate, tris(acetylacetonate)lanthanum, tris(cyclopentadienyl)lanthanum, cerium 2-ethylhexanoate, tris(acetylacetonato)cerium, tris(cyclopentadienyl)cerium, praseodymium isopropoxide, praseodymium oxalate, tris(acetylacetonate)praseodymium, tris(cyclopentadienyl)praseodymium, neodymium isopropoxide, neodymium 2-ethylhexanoate, trifluoroacetylacetonate neodymium, tris(isopropylcyclopentadienyl)neodymium, tris(ethylcyclopentadienyl)promethium, samarium isopropoxide, samarium 2-ethylhexanoate, tris(acetylacetonate)samarium, tris(cyclopentadienyl)samarium, europium 2-ethylhexanoate, tris(acetylacetonate)europium, tris(ethylcyclopentadienyl)europium, gadolinium isopropoxide, gadolinium 2-ethylhexanoate, tris(acetylacetonate)gadolinium, tris(cyclopentadienyl)gadolinium, terbium acetate, tris(acetylacetonate)terbium, tris(cyclopentadienyl)terbium, dysprosium isopropoxide, dysprosium acetate, tris(acetylacetonate)dysprosium, tris(ethylcyclopentadienyl)dysprosium, holmium isopropoxide, holmium acetate, tris(cyclopentadienyl)holmium, erbium isopropoxide, erbium acetate, tris(acetylacetonate)erbium, tris(cyclopentadienyl)erbium, thulium acetate, tris(acetylacetonate)thulium, tris(cyclopentadienyl)thulium, ytterbium isopropoxide, ytterbium acetate, tris(acetylacetonate)ytterbium, tris(cyclopentadienyl)ytterbium, lutetium oxalate, tris(ethylcyclopentadienyl)lutetium, etc.

There is no specific limitation regarding an amount of Element-B-containing compounds in the coating liquid for forming a second passivation layer; the amount of Element-B-containing compounds may be selected properly in accordance with an intended purpose.

—Element-C-Containing Compound—

An Element-C-containing compound may be, for example, Al, Ti, Zr, Hf, Nb, Ta, etc.

An Element-C-containing compound may be, for example, an inorganic compound of Element-C, an organic compound of Element-C, etc.

An inorganic compound of Element-C may be, for example, nitrate of Element-C, sulfate of Element-C, fluoride of Element-C, chloride of Element-C, bromide of Element-C, iodide of Element-C, etc.

An inorganic compound of Element-C may be, for example, aluminum nitrate, aluminum sulfate, aluminum fluoride, aluminum chloride, aluminum bromide, aluminum iodide, aluminum hydroxide, aluminum phosphate, ammonium aluminum sulfate, titanium sulfide, titanium fluoride, titanium chloride, titanium bromide, titanium iodide, zirconium sulfate, zirconium carbonate, zirconium fluoride, zirconium chloride, zirconium bromide, zirconium iodide, hafnium sulfate, hafnium fluoride, hafnium chloride, hafnium bromide, hafnium bromide, hafnium iodide, niobium fluoride, niobium chloride, niobium bromide, tantalum fluoride, tantalum chloride, tantalum bromide, etc.

There is no specific limitation regarding an organic compound of Element-C, as long as being a compound containing Element-C and an organic group; an organic compound of Element-C may be selected properly in accordance with an intended purpose. Element-C and an organic group may be bound, for example, in ionic bonding, covalent bonding, coordinate bonding, etc.

There is no specific limitation regarding an organic group; an organic group may be selected properly in accordance with an intended purpose. An organic group may be, for example, an alkyl group that may include a substituent group, an alkoxy group that may include a substituent group, an acyloxy group that may include a substituent group, an acetylacetonate group that may include a substituent group, a cyclopentadienyl group that may include a substituent group, etc. An alkyl group may be, for example, an alkyl group having a carbon number of 1 to 6, etc. An alkoxy group may be, for example, an alkoxy group having a carbon number of 1 to 6, etc. An acyloxy group may be, for example, an acyloxy group having a carbon number of 1 to 10, etc.

An organic compound of Element-C may be, for example, aluminum isopropoxide, aluminum-sec-butoxide, triethylaluminum, diethylaluminum ethoxide, aluminum acetate, acetylacetone aluminum, aluminum hexafluoroacetylacetonate, aluminum 2-ethylhexanoate, aluminum lactate, aluminum benzoate, aluminum di(s-butoxide)acetoacetate chelate, aluminum trifluoromethane sulfonate, titanium isopropoxide, bis(cyclopentadienyl)titanium chloride, zirconium butoxide, zirconium isopropoxide, bis(2-ethylhexanoic acid)zirconium oxide, zirconium di(n-butoxide) bisacetylacetonate, tetrakis(acetylacetonic acid)zirconium, tetrakis(cyclopentadienyl)zirconium, hafnium butoxide, hafnium isopropoxide, tetrakis(2-ethylhexanoic acid)hafnium, hafnium di(n-butoxide)bisacetylacetonate, tetrakis(acetylacetonate)hafnium, bis(cyclopentadienyl)dimethylhafnium, niobium ethoxide, niobium 2-ethylhexanoate, bis(cyclopentadienyl)niobium chloride, tantalum ethoxide, tetraethoxy acetylacetonate tantalum, etc.

There is no specific limitation regarding an amount of Element-C-containing compounds in the coating liquid for forming a second passivation layer; the amount of Element-C-containing compounds may be selected properly in accordance with an intended purpose.

—Solvent—

There is no specific limitation regarding solvent, as long as being solvent that stably dissolves and disperses compounds; solvent may be selected properly in accordance with an intended purpose. For example, solvent may be toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethylhexanoic acid, mineral spirits, dimethyl propylene urea, 4-butyrolactone, 2-methoxy ethanol, propylene glycol, water, etc.

There is no specific limitation regarding an amount of solvent in the coating liquid for forming a second passivation layer; the amount of solvent may be selected properly in accordance with an intended purpose.

There is no specific limitation regarding a composition ratio (alkaline earth metal-containing compound: Element-B-containing compound) of alkaline earth metal-containing compounds (i.e. Element-A-containing compounds) and Element-B-containing compounds in the coating liquid for forming a second passivation layer; the composition ratio may be selected properly in accordance with an intended purpose. However, the composition ratio is preferred to be in a range as described below.

The composition ratio (Element-A:Element-B) of Element-A (i.e. alkaline earth metal) and Element-B (i.e. at least one of Ga, Sc, Y, and a lanthanoid) in the coating liquid for forming a second passivation layer is preferred to be; 10.0 mol % or more and 67.0 mol % or less: 33.0 mol % or more and 90.0 mol or less, in terms of oxide (e.g. BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$).

There is no specific limitation regarding the composition ratio (alkaline earth metal-containing compound: Element-B-containing compound: Element-C-containing compound) of alkaline earth metal-containing compounds (i.e. Element-A-containing compounds), Element-B-containing compounds, and at least one of Element-C-containing compounds in the coating liquid for forming a second passivation layer; the composition ratio may be selected properly in accordance with an intended purpose. However, the composition ratio is preferred to be in a range as described below.

The composition ratio (Element-A:Element-B: Element-C) of Element-A (i.e. alkaline earth metal), Element-B (i.e. at least one of Ga, Sc, Y, and a lanthanoid), and Element-C (i.e. at least one of Al, Ti, Zr, Hf, Nb, and Ta) in the coating liquid for forming a second passivation layer is preferred to be; 5.0 mol % or more and 22.0 mol % or less: 33.0 mol % or more and 90.0 mol or less: 5.0 mol % or more and 45.0 mol % or less, in terms of oxide (e.g. BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $Al_2O_3$, $TiO_2$, $ZrO_2$, $HfO_2$, $Nb_2O_5$, $Ta_2O_5$).

—Method for Forming the First Passivation Layer and the Second Passivation Layer—

The following description explains examples of a method for forming the first passivation layer 170a using the coating liquid for forming a first passivation layer and a method for forming the second passivation layer 170b using the coating liquid for forming a second passivation layer. The methods for forming the first passivation layer 170a and the second passivation layer 170b include a coating step and heat-processing step, and may further include other steps, as needed.

There is no specific limitation regarding details of the coating step, as long as being a step for applying the coating liquid for forming a first passivation layer or the coating liquid for forming a second passivation layer onto a coating object; details of the coating step may be selected properly in accordance with intended purposes. There is no specific limitation regarding coating methods; a coating method may be selected properly in accordance with an intended purpose. For example, one can perform film formation in a solution process, and then perform patterning by means of photolithography. Furthermore, one can perform film formation in a printing process such as inkjet printing, nanoimprinting, and gravure printing, so that a desired shape is formed directly. For the solution process, a dip-coating method, a spin-coating method, a die-coating method, a nozzle-printing method, etc., may be used.

There is no specific limitation regarding details of the heat-processing step, as long as being a step for performing heat-processing on the coating liquid for forming a first passivation layer or the coating liquid for forming a second passivation layer, which are applied onto the coating object; details of the heat-processing step may be selected properly in accordance with intended purposes. Note that, in the heat-processing step, the coating liquid for forming a first passivation layer and the coating liquid for forming a second passivation layer, which are applied onto the coating object, may be let dry naturally. In the heat-processing step, drying of solvent, generating of oxide (i.e. the first oxide or the second oxide), etc., are performed.

In the heat-processing step, it is preferred that drying of solvent (hereinafter referred to as "drying process") and generating of the first oxide or the second oxide (hereinafter referred to as "generating process") are performed in different temperatures. In other words, it is preferred to let the solvent dry, and then to increase the temperature in order to generate the first oxide or the second oxide. Generating of the second oxide involves decomposition of at least one of a silicon-containing compound, an alkaline earth metal-containing compound, an aluminum-containing compound, a boron-containing compound, etc. Generating of the first oxide involves decomposition of at least one of an alkaline earth metal-containing compound (i.e. Element-A-containing compound), Element-B-containing compound, Element-C-containing compound, etc.

There is no specific limitation regarding temperature of the drying process; temperature may be selected properly in accordance with contained solvent. For example, temperature may be in a range of 80° C. or more and 180° C. or less. For the drying process, it is effective to use a vacuum oven, etc., in order to dry in lower temperature. There is no specific limitation regarding time to be taken for the drying process; time may be selected properly in accordance with intended purposes. For example, time may be in a range of a minute or more and an hour or less.

There is no specific limitation regarding the temperature in the generating process, and the temperature may be arbitrarily determined in accordance with an intended purpose, although the temperature is preferred to be 100° C. or more and less than 550° C., and more preferably is in a rage from 200 to 500° C. There is no specific limitation regarding the time to be taken for the generating process, and the time may be arbitrarily determined in accordance with an intended purpose. An example of the time is in a range from an hour to five hours.

Note that, in the heat-processing step, the drying process and the generating process may be performed continually, and may be performed in separated steps.

There is no specific limitation regarding methods for the heat-processing; a method may be selected properly in accordance with an intended purpose. For example, one can apply heat to the coating object. There is no specific limitation regarding atmospheres of the heat-processing; an atmosphere may be selected properly in accordance with an intended purpose, although an oxygen atmosphere is preferred. Performing heat-processing in an oxygen atmosphere promotes generating of the first oxide or the second oxide as decomposition products are smoothly eliminated out of the system.

In the heat-processing step, it is effective, after the drying process, to irradiate the dried object with UV light at a wavelength of 400 nm or less, in order to promote reaction in the generating process. Irradiation of UV light at a wavelength of 400 nm or less breaks chemical bonds in an organic substance contained in the dried object and dissolves the organic substance, and therefore enables the first oxide or the second oxide to be formed efficiently. There is no specific limitation regarding UV light at a wavelength of 400 nm or less; UV light may be selected properly in accordance with an intended purpose. For example, UV light at a wavelength of 222 nm, which is emitted by an excimer lamp, may be used. Furthermore, it is also preferable to apply ozone, alternatively or additionally to irradiation of UV light. Applying ozone to the dried object promotes generation of oxide.

Figure 14A:
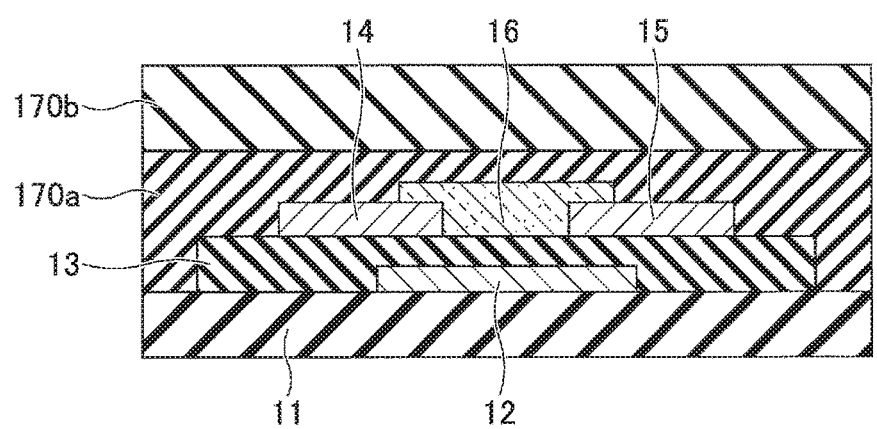
FIGS. 14A and 14B are (first) drawings illustrating examples of steps for manufacturing the FET according to the ninth embodiment.
Figure 14B:
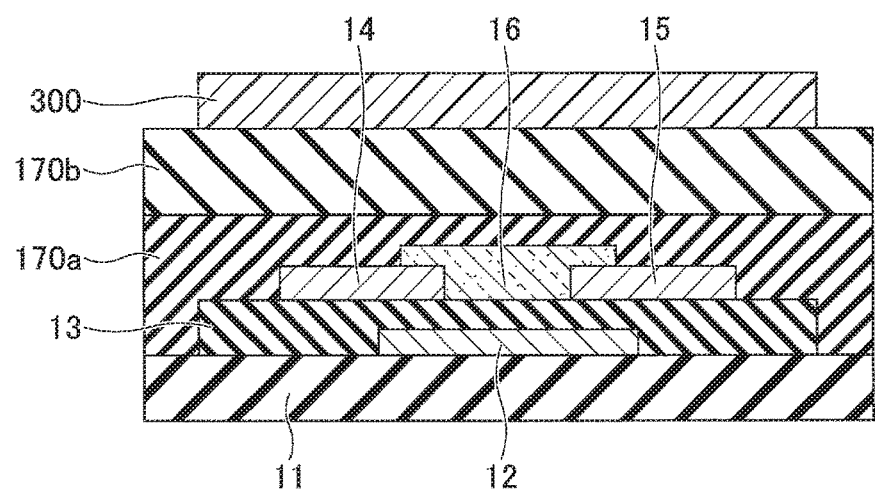

Then, in the step illustrated in FIG. 14B, a mask 300 is formed on a predetermined region of the second passivation layer 170b. There is no specific limitation regarding material for the mask 300, as long as being material that functions as a protection film in an etching step performed on the first passivation layer 170a and the second passivation layer 170b; material may be selected properly in accordance with an intended purpose. There is no specific limitation regarding material types of the mask 300; a material type may be selected properly in accordance with an intended purpose. For example, positive photoresist and negative photoresist may be used.

Figure 15A:
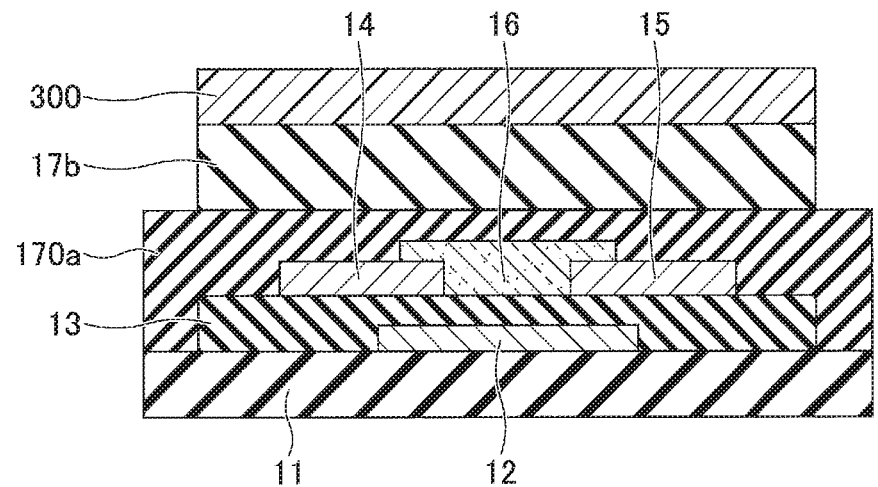
FIGS. 15A through 15C are (second) drawings illustrating examples of steps for manufacturing the FET according to the ninth embodiment.

Then, in the step illustrated in FIG. 15A, etching is performed on the second passivation layer 170b in order to form the second passivation layer 17b in a predetermined shape. Etching may be performed on the second passivation layer 170b by use of the first solution containing at least one of hydrochloric acid, oxalic acid, nitric acid, phosphoric acid, acetic acid, sulfuric acid, and hydrogen peroxide water. An etching method may be, for example, a dipping method, in which the second passivation layer 170b is soaked in the first solution, a spraying method, in which the second passivation layer 170b is sprayed with the first solution, a spinning method, in which the first solution is dripped onto the second passivation layer 170b and the substrate 11 including the second passivation layer 170b spins.

Concentration of hydrochloric acid contained in the first solution is preferred to be in a range of 0.04 wt % or more and 40 wt % or less. Concentration of oxalic acid contained in the first solution is preferred to be in a range of 0.1 wt % or more and 10 wt % or less. Concentration of nitric acid contained in the first solution is preferred to be in a range of 0.1 wt % or more and 40 wt % or less. Concentration of phosphoric acid contained in the first solution is preferred to be in a range of 0.1 wt % or more and 85 wt % or less. Concentration of acetic acid contained in the first solution is preferred to be in a range of 1 wt % or more and 50 wt % or less. Concentration of sulfuric acid contained in the first solution is preferred to be in a range of 1 wt % or more and 20 wt % or less. Concentration of hydrogen peroxide water contained in the first solution is preferred to be in a range of 1 wt % or more and 10 wt % or less. It is preferred that mixed solution containing hydrochloric acid, phosphoric acid, and nitric acid, or mixed solution containing phosphoric acid, nitric acid, and acetic acid, is used for the first solution.

Figure 15B:
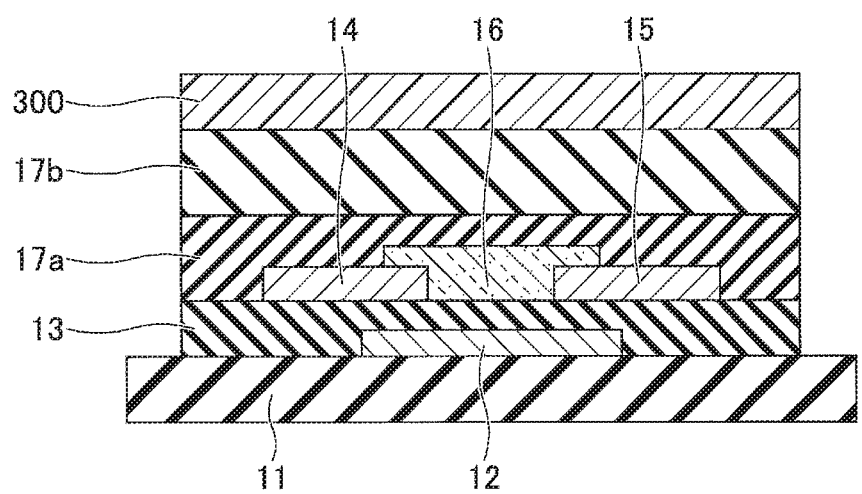

Then, in the step illustrated in FIG. 15B, etching is performed on the first passivation layer 170a in order to form the first passivation layer 17a in a predetermined shape. Etching may be performed on the first passivation layer 170a by use of a second solution (which may be hereinafter referred to as "second solution") containing at least one of hydrofluoric acid, ammonium fluoride, ammonium hydrogen fluoride, and organic alkali. An etching method may be, for example, a dipping method, in which the first passivation layer 170a is soaked in the second solution, a spraying method, in which the first passivation layer 170a is sprayed with the second solution, a spinning method, in which the second solution is dripped onto the first passivation layer 170a and the substrate 11 including the first passivation layer 170a spins.

In the ninth embodiment, etching is performed on the second passivation layer 170b at the step illustrated in FIG. 15A, and then continually performed on the first passivation layer 170a at the step illustrated in FIG. 15B. Thus, the mask 300 need not be formed for both of the second passivation layer 170b and the first passivation layer 170a, which means that patterning of the passivation layers is simplified in terms of the number of steps. Therefore, passivation layers with desired shapes may be formed with high productivity.

Concentration of hydrofluoric acid contained in the second solution is preferred to be in a range of 0.1 wt % or more and 10 wt % or less. Concentration of ammonium fluoride contained in the second solution is preferred to be in a range of 5 wt % or more and 25 wt % or less. Concentration of ammonium hydrogen fluoride contained in the second solution is preferred to be in a range of 1 wt % or more and 25 wt % or less. Concentration of organic alkali contained in the second solution is preferred to be in a range of 1 wt % or more and 15 wt % or less. It is preferred that mixed solution containing hydrofluoric acid, ammonium fluoride and ammonium hydrogen fluoride is used for the second solution.

Figure 15C:
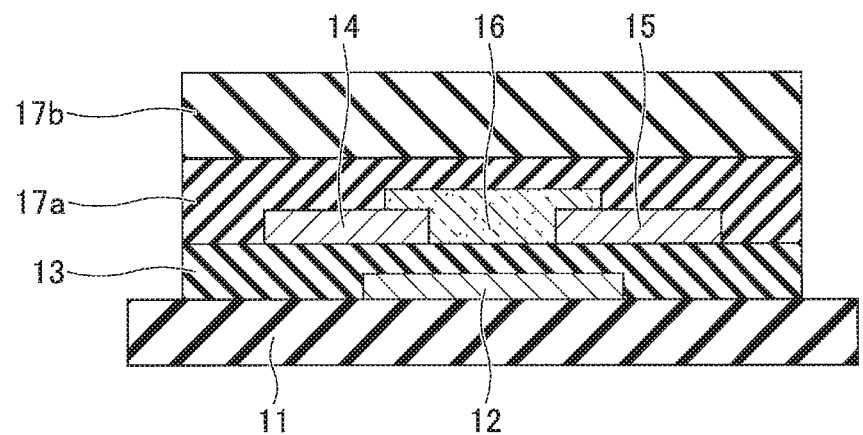

Then, at the step illustrated in FIG. 15C, the mask 300 is removed. There is no specific limitation regarding methods for removing the mask 300; a method may be selected properly in accordance with an intended purpose. For example, in a case where photoresist is used for the mask 300, the mask 300 may be dissolved by use of solution such as resist-peeling agent to be removed. Further, a method for removing the mask 300 is preferred to be one that does not damage the passivation layers. Through the aforementioned steps, a bottom-gate/bottom-contact FET 110 is manufactured.

As described above, the FET 110 according to the ninth embodiment includes, as a passivation layer, the first passivation layer and the second passivation layer that are arranged in contact with each other. Here, the first passivation layer is constituted by the second oxide that contains Si and alkaline earth metal, and the second passivation layer is constituted by the first oxide that contains Element-A, which is alkaline earth metal, and Element-B, which is at least one of Ga, Sc, Y, and a lanthanoid.

Furthermore, the method for manufacturing the FET 110 according to the ninth embodiment includes a step of bringing the first passivation layer 170a into contact with the second solution, which contains at least one of hydrofluoric acid, ammonium fluoride, ammonium hydrogen fluoride, organic alkali, in order to perform wet-etching, and includes a step of bringing the second passivation layer 170b into contact with the first solution, which contains at least one of hydrochloric acid, oxalic acid, nitric acid, phosphoric acid, acetic acid, sulfuric acid, and hydrogen peroxide water, in order to perform wet-etching.

Wet-etching may be preferably performed on the first passivation layer 170a and the second passivation layer 170b by use of the solution as described above to the first passivation layer 170a and the second passivation layer 170b, respectively. Here, conventional dry-etching, which involves usage of dangerous gas, damage to the environment, costs for required apparatuses, etc., need not be performed.

Further, such a passivation layer formed in a laminated structure of the second oxide and the first oxide has a remarkable barrier performance, and therefore enables producing an FET with high reliability (e.g. with small shift of threshold-voltage on a BTS test).

That is to say, by means of wet-etching using the aforementioned solution to each of the first passivation layer 170a and the second passivation layer 170b, a high quality FET (with low energy consumption and high reliability) may be produced with low cost, high safety, and little damage to the environment.

Modifications of the Ninth Embodiment

Description regarding the modifications of the ninth embodiment explains an example of an FET having a different layer configuration, compared to the ninth embodiment. Note that, in the description of the modifications of the ninth embodiment, explanation of the same configuration already explained in the above description may be omitted.

Figure 16A:
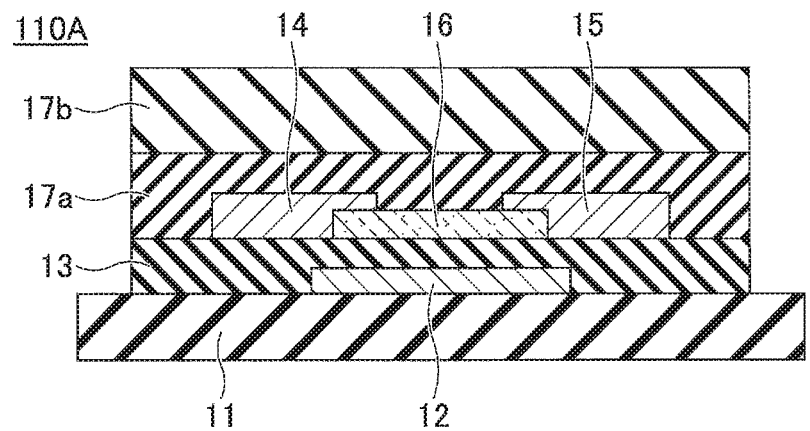
FIGS. 16A through 16C are cross-sectional views illustrating examples of FETs according to modifications of the ninth embodiment.
Figure 16B:
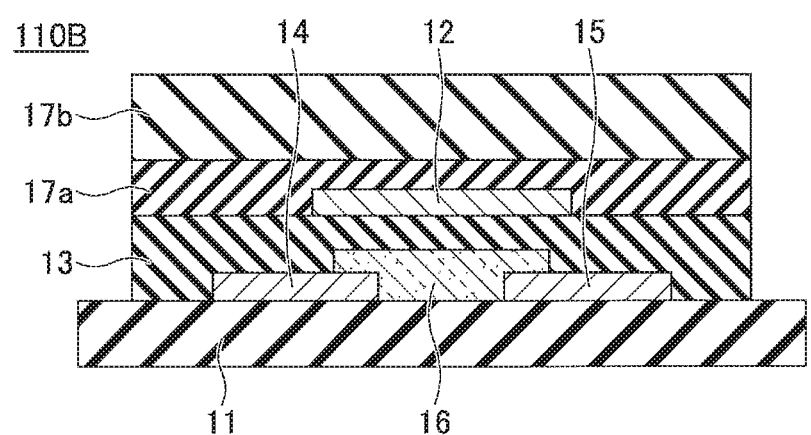
Figure 16C:
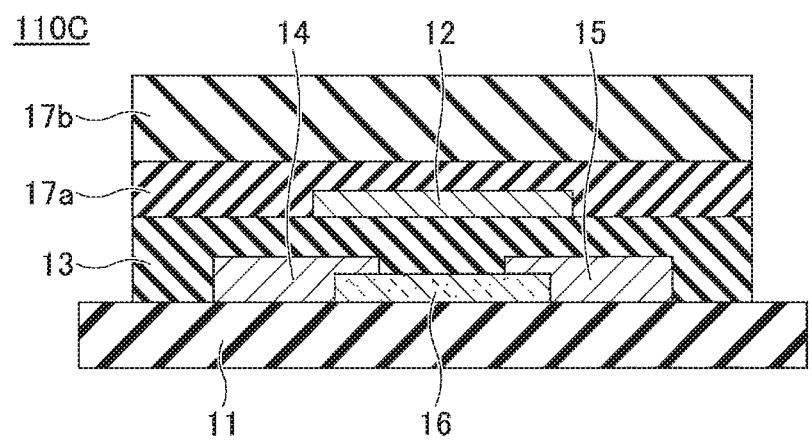

FIGS. 16A through 16C are cross-sectional views illustrating examples of FETs according to the modifications of the ninth embodiment. FETs illustrated in FIGS. 16A through 16C are typical examples of the semiconductor device according to the present invention.

An FET 110A illustrated in FIG. 16A is a bottom-gate/top-contact FET. The FET 110A includes the gate-electrode 12 formed on the substrate 11, which has insulating property, and includes the gate-insulating layer 13 formed so as to cover the gate-electrode 12. Furthermore, the active layer 16 is formed on the gate-insulating layer 13, and the source-electrode 14 and the drain-electrode 15 are formed, partially on the active layer 16, at a predetermined distance via the active layer 16, which turns into a channel region. Furthermore, the first passivation layer 17a is formed over the gate-insulating layer 13, so as to cover the source-electrode 14, the drain-electrode 15, and the active layer 16. Furthermore, the second passivation layer 17b is formed on the first passivation layer 17a.

An FET 110B illustrated in FIG. 16B is a top-gate/bottom-contact FET. The FET 110B includes the source-electrode 14 and the drain-electrode 15 formed on the substrate 11, which has insulating property, and includes the active layer 16 formed so as to partially cover the source-electrode 14 and the drain-electrode 15. Furthermore, the gate-insulating layer 13 is formed so as to cover the source-electrode 14, the drain-electrode 15, and the active layer 16, and the gate-electrode 12 is formed on the gate-insulating layer 13. Furthermore, the first passivation layer 17a is formed over the gate-insulating layer 13, so as to cover the gate-electrode 12, and the second passivation layer 17b is formed on the first passivation layer 17a.

An FET 110C illustrated in FIG. 16C is a top-gate/top-contact FET. The FET 110C includes the active layer 16 formed on the substrate 11, which has insulating property, and includes the source-electrode 14 and the drain-electrode 15 formed partially on the active layer 16 at a predetermined distance via the active layer 16, which turns into a channel region. Furthermore, the gate-insulating layer 13 is formed so as to cover the source-electrode 14, the drain-electrode 15, and the active layer 16, and the gate-electrode 12 is formed on the gate-insulating layer 13. Furthermore, the first passivation layer 17a is formed over the gate-insulating layer 13, so as to cover the gate-electrode 12, and the second passivation layer 17b is formed on the first passivation layer 17a.

As described above, there is no specific limitation regarding layer configurations of FETs according to the present invention, and one can properly select a configuration as illustrated in each of FIGS. 13 through 16C, in accordance with an intended purpose. The first passivation layer 17a and the second passivation layer 17b provided on the FETs 110A, 110B, and 110C, illustrated in FIGS. 16A through 16C may be manufactured in the same method as used for the FET 110. Therefore, with respect to the FETs 110A, 110B, and 110C, the present invention provides the same advantageous effect as provided to the FET 110.

Note that, contrary to FIGS. 16A through 16C, the second passivation layer 17b may be arranged closer to the active layer 16 than the first passivation layer 17a. Furthermore, the second passivation layer 17b may be arranged so as to cover the top surface and the side surfaces of the first passivation layer 17a. Furthermore, the first passivation layer 17a may be arranged so as to cover the top surface and the side surfaces of the second passivation layer 17b.

Tenth Embodiment

The following description regarding the tenth embodiment explains an example of an FET having a gate-insulating layer in a two-layered structure. Note that, in the description regarding the tenth embodiment, explanation of the same configuration already explained in the above embodiment may be omitted.

[Configuration of FET]

Figure 17:
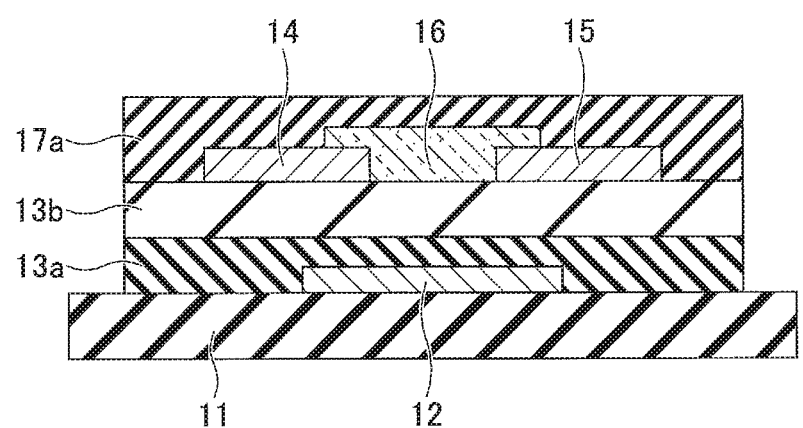
FIG. 17 is a cross-sectional view illustrating an example of an FET according to a tenth embodiment.

FIG. 17 is a cross-sectional view illustrating an example of an FET according to the tenth embodiment. According to FIG. 17, an FET 110D is a bottom-gate/bottom-contact FET including the substrate 11, the gate-electrode 12, a first gate-insulating layer 13a, a second gate-insulating layer 13b, the source-electrode 14, the drain-electrode 15, the active layer 16, and the first passivation layer 17a. Note that, the FET 110D is a typical example of the semiconductor device according to the present invention.

The FET 110D differs from the FET 110 (see FIG. 13), in terms of the gate-insulating layer having the two-layered structure (i.e. the first gate-insulating layer 13a and the second gate-insulating layer 13b) and in terms of the passivation layer being constituted only by the first passivation layer 17a. Note that, the passivation layer may be constituted only by the second passivation layer 17b, and may be constituted in a two-layered structure of the first passivation layer 17a and the second passivation layer 17b, similarly to the FET 110.

There is no specific limitation regarding arrangement of the first gate-insulating layer 13a and the second gate-insulating layer 13b; one can select arrangement properly in accordance with an intended purpose. The first gate-insulating layer 13a may be arranged closer to the gate-electrode 12 than the second gate-insulating layer 13b as illustrated in FIG. 17, and contrarily, the second gate-insulating layer 13b may be arranged closer to the gate-electrode 12 than the first gate-insulating layer 13a. Furthermore, the second gate-insulating layer 13b may be arranged so as to cover the top surface and the side surfaces of the first gate-insulating layer 13a, and contrarily, the first gate-insulating layer 13a may be arranged so as to cover the top surface and the side surfaces of the second gate-insulating layer 13b.

The first gate-insulating layer 13a may be formed by the same material as used for the first passivation layer 17a. The second gate-insulating layer 13b may be formed by the same material as used for the second passivation layer 17b.

[Method for Manufacturing the FET]

The following description explains a method for manufacturing the FET 110D illustrated in FIG. 17. FIGS. 18A through 19C are drawings illustrating examples of steps for manufacturing the FET 110D according to the tenth embodiment.

Figure 18A:
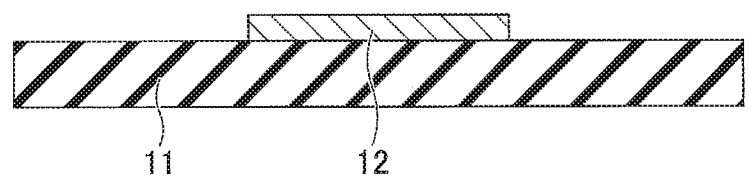
FIGS. 18A through 18D are (first) drawings illustrating examples of steps for manufacturing the FET according to the tenth embodiment.

First, at the step illustrated in FIG. 18A, the gate-electrode 12 is formed in a predetermined shape on the substrate 11, similarly to the step illustrated in FIG. 2A.

Figure 18B:
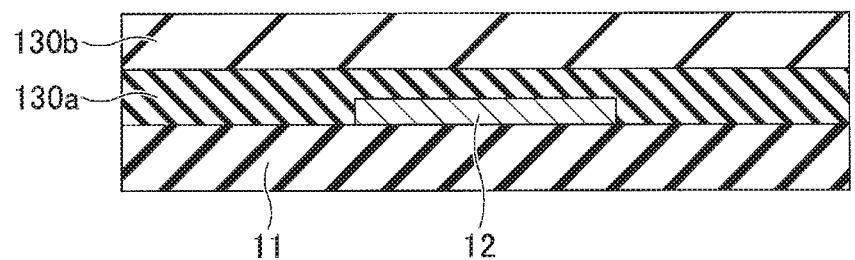

Then, at the step illustrated in FIG. 18B, a first gate-insulating layer 130a (i.e. a layer to be formed into the first gate-insulating layer 13a in an etching process) is formed over the substrate 11, so as to cover the gate-electrode 12. Then, a second gate-insulating layer 130b (i.e. a layer to be formed into the second gate-insulating layer 13b in an etching process) is formed over the first gate-insulating layer 130a.

The first gate-insulating layer 130a may be formed by the same material as used for the first passivation layer 170a. The second gate-insulating layer 130b may be formed by the same material as used for the second passivation layer 170b. Furthermore, there is no specific limitation regarding methods for forming the first gate-insulating layer 130a; one can properly select a method, among the methods described above as a method for forming the first passivation layer 170a, in accordance with an intended purpose. Similarly, there is no specific limitation regarding methods for forming the second gate-insulating layer 130b; one can properly select a method, among the methods described above as a method for forming the second passivation layer 170b, in accordance with an intended purpose.

Figure 18C:
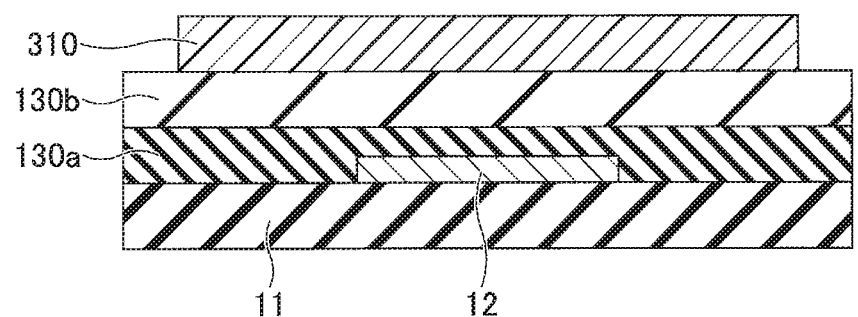
Figure 18D:
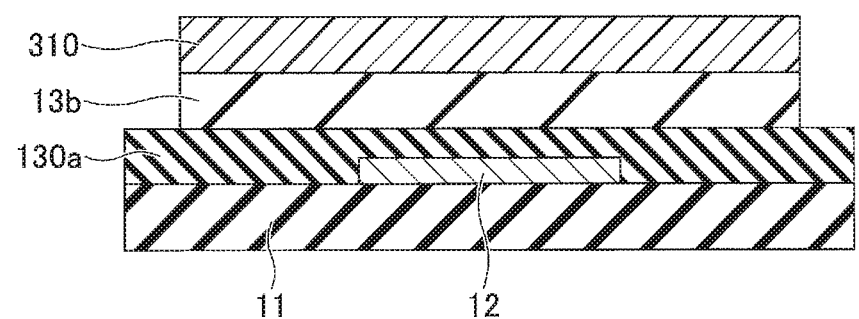

Then, at the step illustrated in FIG. 18C, a mask 310 is formed on a predetermined region of the second gate-insulating layer 130b, similarly to the step illustrated in FIG. 14B. Then, at the step illustrated in FIG. 18D, an etching process is performed on the second gate-insulating layer 130b in order to form the second gate-insulating layer 13b in a predetermined shape, similarly to the step illustrated in FIG. 15A.

Figure 19A:
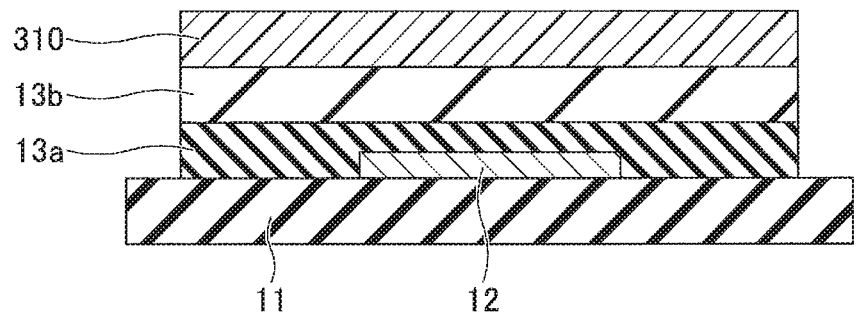
FIGS. 19A through 19C are (second) drawings illustrating examples of steps for manufacturing the FET according to the tenth embodiment.
Figure 19B:
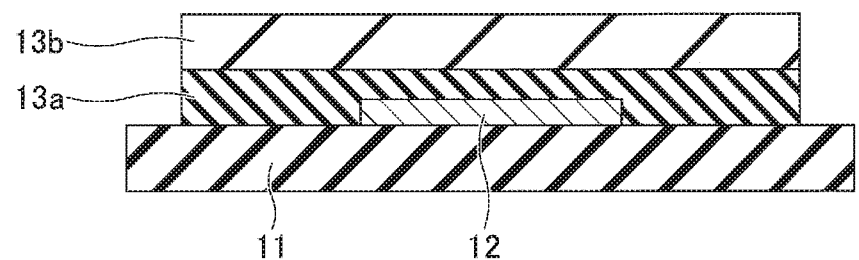

Then, at the step illustrated in FIG. 19A, an etching process is performed on the first gate-insulating layer 130a in order to form the first gate-insulating layer 13a in a predetermined shape, similarly to the step illustrated in FIG. 15B. Then, at the step illustrated in FIG. 19B, the mask 310 is removed, similarly to the step illustrated in FIG. 15C.

Figure 19C:
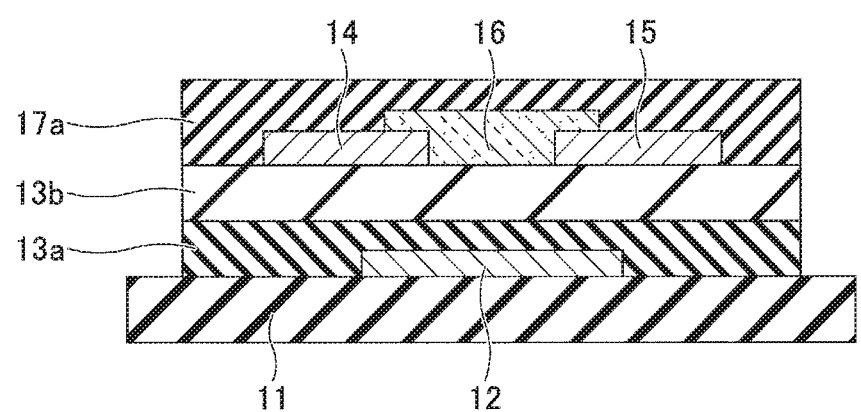

Then, at the step illustrated in FIG. 19C, the same steps as illustrated in FIGS. 2D through 3C according to the first embodiment are performed, so as to manufacture the bottom-gate/bottom-contact FET 110D. Note that, the passivation layer may be constituted only by the first passivation layer 17a, and may be constituted only by the second passivation layer 17b, as needed. Further, the passivation layer may be constituted in a two-layered structure of the first passivation layer 17a and the second passivation layer 17b, similarly to the FET 110.

As described above, the FET 110D according to the tenth embodiment includes, as a passivation layer, the first gate-insulating layer 13a and the second gate-insulating layer 13b that are arranged in contact with each other. Here, the first gate-insulating layer 13a is constituted by the second oxide containing Si and alkaline earth metal, and the second gate-insulating layer 13b is constituted by the first oxide containing Element-A (i.e. alkaline earth metal) and Element-B (i.e. at least one of Ga, Sc, Y, and a lanthanoid).

Furthermore, the method for manufacturing the FET 110D according to the tenth embodiment includes a step of bringing the first gate-insulating layer 130a into contact with the second solution containing at least one of hydrofluoric acid, ammonium fluoride, ammonium hydrogen fluoride, organic alkali, in order to perform wet-etching, and includes a step of bringing the second gate-insulating layer 130b into contact with the first solution containing at least one of hydrochloric acid, oxalic acid, nitric acid, phosphoric acid, acetic acid, sulfuric acid, and hydrogen peroxide water, in order to perform wet-etching.

Wet-etching is preferably performed on the gate-insulating layers 130a and 130b by use of the aforementioned solution to the respective gate-insulating layers, respectively. Here, conventional dry-etching, which involves problems relating to usage of dangerous gas, damage to the environment, costs for required apparatuses, etc., need not be performed.

Furthermore, usage of the first oxide for a gate-insulating layer enables driving an FET with low voltage (or low energy consumption), as dielectric constant of the first oxide is in a range of 6 or more and 20 or less, which is higher than that of $SiO_2$ film.

That is to say, usage of wet-etching using the aforementioned solution for each of the first gate-insulating layer 130a and the second gate-insulating layer 130b enables manufacturing a high quality FET (with low energy consumption and high reliability) with low cost, high safety, and little damage to the environment.

Modifications of the Tenth Embodiment

Description regarding the modifications of the tenth embodiment explains an example of an FET having a different layer configuration, compared to the tenth embodiment. Note that, in the description of the modifications of the tenth embodiment, explanation of the same configuration already explained in the above description may be omitted.

Figure 20A:
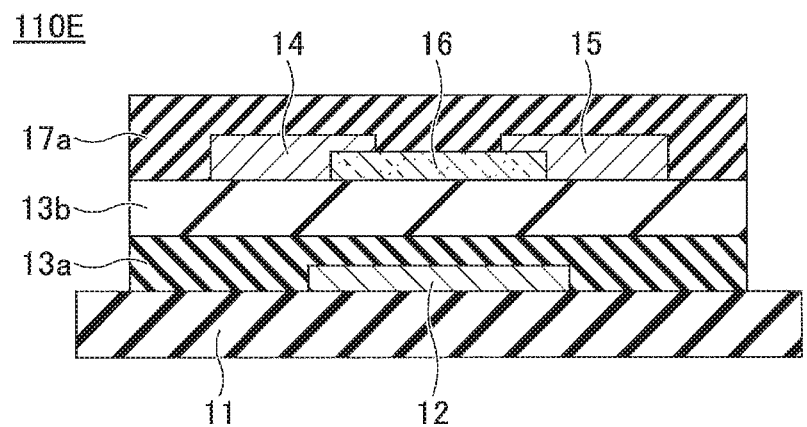
FIGS. 20A through 20C are cross-sectional views illustrating examples of FETs according to modifications of the tenth embodiment.
Figure 20B:
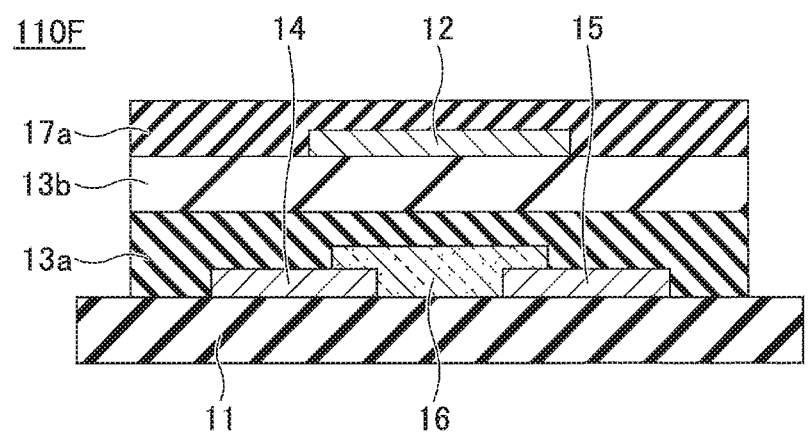
Figure 20C:
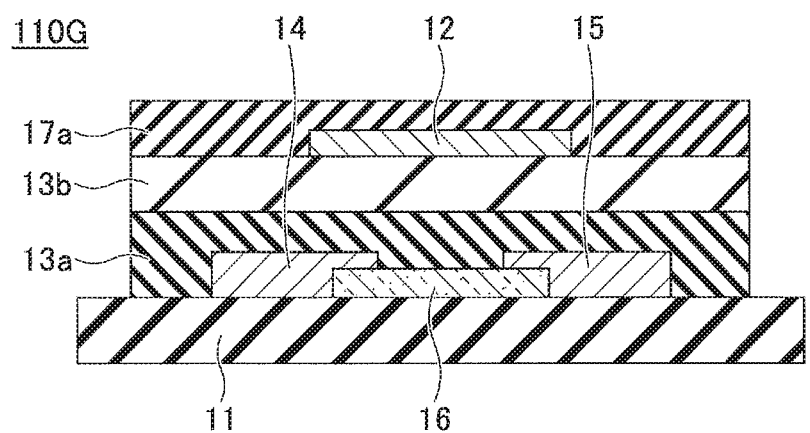

FIGS. 20A through 20C are cross-sectional views illustrating examples of FETs according to the modifications of the tenth embodiment. FETs illustrated in FIGS. 20A through 20C are typical examples of the semiconductor device according to the present invention.

An FET 110E illustrated in FIG. 20A is a bottom-gate/top-contact FET. The FET 110E includes the gate-electrode 12 formed on the substrate 11, which has insulating property. Furthermore, the first gate-insulating layer 13a is formed so as to cover the gate-electrode 12, and the second gate-insulating layer 13b is formed on the first gate-insulating layer 13a.

Furthermore, the active layer 16 is formed on the second gate-insulating layer 13b, and the source-electrode 14 and the drain-electrode 15 are formed partially on Tie active layer 16 at a predetermined distance via the active layer 16, which turns into a channel region. Furthermore, the first passivation layer 17a is formed over the second gate-insulating layer 13b, so as to cover the source-electrode 14, the drain-electrode 15, and the active layer 16.

An FET 110F illustrated in FIG. 20B is a top-gate/bottom-contact FET. The FET 110F includes the source-electrode 14 and the drain-electrode 15 formed on the substrate 11, which has insulating property, and includes the active layer 16 formed so as to partially cover the source-electrode 14 and the drain-electrode 15. Furthermore, the first gate-insulating layer 13a is formed so as to cover the source-electrode 14, the drain-electrode 15, and the active layer 16. Furthermore, the second gate-insulating layer 13b is formed on the first gate-insulating layer 13a, and the gate-electrode 12 is formed on the second gate-insulating layer 13b. Furthermore, the first passivation layer 17a is formed over the second gate-insulating layer 13b, so as to cover the gate-electrode 12.

An FET 110G illustrated in FIG. 20C is a top-gate/top-contact FET. The FET 110G includes the active layer 16 formed on the substrate 11, which has insulating property, and includes the source-electrode 14 and the drain-electrode 15 formed partially on the active layer 16 at a predetermined distance via the active layer 16, which turns into a channel region. Furthermore, the first gate-insulating layer 13a is formed so as to cover the source-electrode 14, the drain-electrode 15, and the active layer 16. Furthermore, the second gate-insulating layer 13b is formed on the first gate-insulating layer 13a, and the gate-electrode 12 is formed on the second gate-insulating layer 13b. Furthermore, the first passivation layer 17a is formed over the second gate-insulating layer 13b, so as to cover the gate-electrode 12.

As described above, there is no specific limitation regarding layer configurations of FETs according to the present invention; one can properly select a configuration as illustrated in each of FIGS. 17 through 20C, in accordance with an intended purpose. The first gate-insulating layer 13a and the second gate-insulating layer 13b provided on the FETs 110E, 110F, and 101G illustrated in FIGS. 20A through 20C may be manufactured in the same method as used for the FET 110D. Therefore, with respect to the FETs 110E, 110F, and 110G, the present invention provides the same advantageous effect as provided to the FET 110D.

Here, contrary to FIGS. 20A through 20C, the second gate-insulating layer 13b may be arranged closer to the active layer 16 than the first gate-insulating layer 13a. Furthermore, the second gate-insulating layer 13b may be arranged so as to cover the top surface and the side surfaces of the first gate-insulating layer 13a. Furthermore, the first gate-insulating layer 13a may be arranged so as to cover the top surface and the side surfaces of the second gate-insulating layer 13b. Note that, the passivation layer may be constituted only by the second passivation layer 17b, and may be constituted in a two-layered structure of the first passivation layer 17a and the second passivation layer 17b, similarly to the FET 110.

Eleventh Embodiment

Description regarding the eleventh embodiment explains an example of an organic EL display element. Note that, in the description of the eleventh embodiment, explanation of the same configuration already explained in the above description may be omitted.

FIGS. 21A through 22B are cross-sectional views for explaining configurations of organic EL display elements according to the eleventh embodiment and methods for manufacturing the organic EL display elements according to the eleventh embodiment.

Figure 21A:
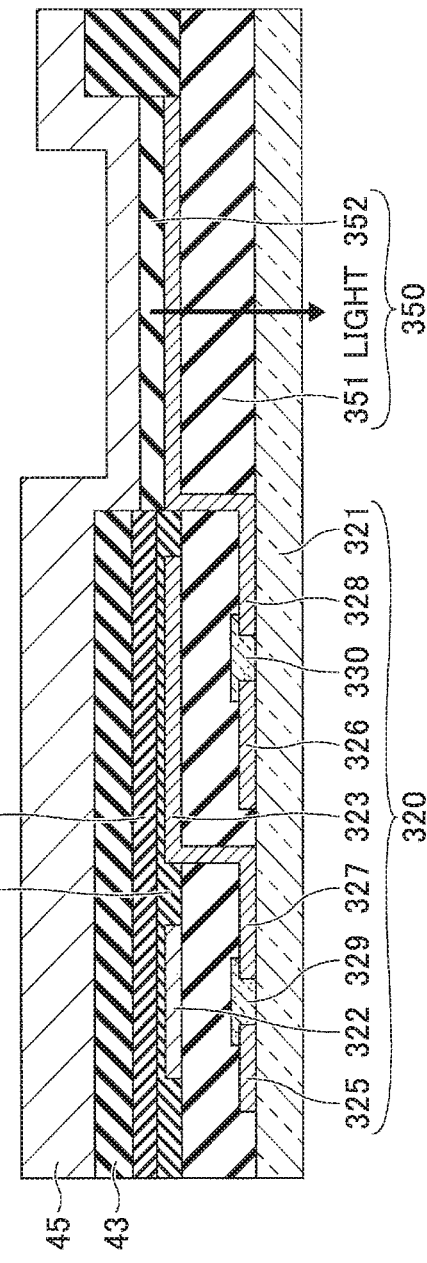
FIGS. 21A and 21B are (first) cross-sectional views for explaining configurations of organic EL display elements according to an eleventh embodiment and methods for manufacturing the organic EL display elements according to the eleventh embodiment.

An organic EL display element 150 illustrated in FIG. 21A is a display element including an organic EL element 350 and a drive-Circuit 320 that are combined together. Further, the organic EL display element 150 is provided with a bottom-contact/top-gate FET.

Figure 21B:
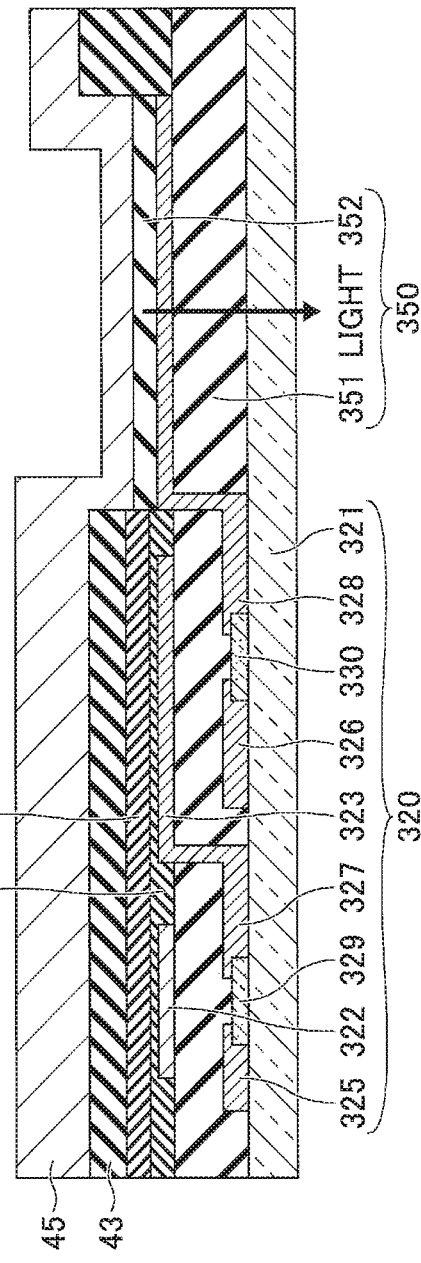

An organic EL display element 150A illustrated in FIG. 21B is a display element including the organic EL element 350 and the drive-circuit 320 that are combined together. Further, the organic EL display element 150A is provided with a top-contact/top-gate FETs.

The organic EL display elements 150 and 150A include a substrate 321, a first gate-electrode 322, a second gate-electrode 323, a gate-insulating layer 351, first source-electrode 325, a second source-electrode 326, a first drain-electrode 327, a second drain-electrode 328, a first active layer 329, a second active layer 330, a first passivation layer 41a, a second passivation layer 41b, an interlayered insulating film 43, an organic EL layer 352, and a cathode 45.

The first drain-electrode 327 and the second gate-electrode 323 are connected via a through-hole formed on the gate-insulating layer 351. The second drain-electrode 328 functions as an anode of the organic EL element 350.

Note that, in FIGS. 21A and 21B, a capacitor is formed between the second gate-electrode 323 and the second drain-electrode 328, although there is no specific limitation regarding where to form capacitors. That is to say, capacitors with proper sizes and arrangement may be formed, as needed.

The materials, processes, etc., as explained in the description regarding the FETs according to the ninth embodiment may be used for forming the substrate 321, the first gate-electrode 322, the second gate-electrode 323, the gate-insulating layer 351, the first source-electrode 325, the second source-electrode 326, the first drain-electrode 327, the second drain-electrode 328, the first active layer 329, the second active layer 330, the first passivation layer 41a, and the second passivation layer 41b.

Note that, the first passivation layer 41a and second passivation layer 41b correspond to the first passivation layer 17a and second passivation layer 17b provided on the FET 110, etc., respectively. Furthermore, similarly to the ninth embodiment, there is no specific limitation regarding arrangement of the first passivation layer 41a and second passivation layer 41b, with respect to the passivation layer; one can properly select arrangement in accordance with an intended purpose. Furthermore, the second passivation layer 41b may be arranged so as to cover the top surface and the side surfaces of the first passivation layer 41a, and the first passivation layer 41a may be arranged so as to cover the top surface and the side surfaces of the second passivation layer 41b.

There is no specific limitation regarding material types of the interlayered insulating film 43 (or planarizing film); one can properly select a material type in accordance with an intended purpose. For example, the material type may be organic material, inorganic material, organic-inorganic composite material, etc.

For example, organic material may be resin such as polyimide, acrylic resin, fluorine-based resin, non-fluorine-based resin, olefin-based resin, or silicone resin, and may be photosensitive resin constituted by such resin, etc.

For example, inorganic material may be spin-on-glass (SOG) material such as AQUAMICA (product of AZ Electronic Materials), etc.

For example, organic-inorganic composite material may be organic-inorganic composite material constituted by a silane compound, which is disclosed in Japanese Unexamined Patent Application Publication No. 2007-158146, etc.

The interlayered insulating film 43 is preferred to have a barrier performance against moisture, oxygen, hydrogen, etc., in the atmosphere.

There is no specific limitation regarding processes for forming the interlayered insulating film 43; one can properly select a process in accordance with an intended purpose. For example, one can perform film formation of a film in a desired shape directly in a spin-coating method, an inkjet printing method, a slit-coating method, a nozzle-printing method, gravure printing method, dip-coating method, etc. Furthermore, one can perform patterning by use of photolithography, in a case where photoconductive material is used, etc.

In addition, it is effective to perform heat-processing, as post-processing after formation of the interlayered insulating film 43, in order to stabilize properties of the FETs that constitute the display element.

There is no specific limitation regarding methods for manufacturing the organic EL layer 352 and the cathode 45; one can properly select a method in accordance with an intended purpose. For example, the method for manufacturing the organic EL layer 352 and the cathode 45 may be a vacuum deposition method such as a vacuum vapor deposition method and a spattering method, and may be a solution process such as an inkjet printing method, a nozzle-coating method, etc.

In such a way as described above, a so-called "bottom-emission" type organic EL display element 150 or 150A, which extracts light emission through the substrate 321, may be manufactured. Here, transparency is required for the substrate 321, the gate-insulating layer 351, and second drain-electrode 328 (i.e. anode).

An organic EL display element 150B illustrated in FIG. 22A is a display element including the organic EL element 350 and the drive-circuit 320 that are combined together. Further, the organic EL display element 150B is provided with bottom-contact/bottom-gate FETs.

An organic EL display element 150C illustrated in FIG. 22B is a display element including the organic EL element 350 and the drive-circuit 320 that are combined together. Further, the organic EL display element 150C is provided with top-contact/bottom-gate FETs.

Contrarily to the organic EL display elements 150 and 150A, the organic EL display elements 150B and 150C include a first passivation layer 42a and a second passivation layer 42b, in addition to the first passivation layer 41a and second passivation layer 41b. Materials, processes, etc., as explained in the description regarding the FETs according the ninth embodiment may be used for forming the first passivation layer 42a and second passivation layer 42b.

Note that, the first passivation layer 42a and second passivation layer 42b correspond to the first passivation layer 17a and second passivation layer 17b provide on the FET 110, etc. Furthermore, similarly to the ninth embodiment, there is no specific limitation regarding arrangement of the first passivation layer 42a and second passivation layer 42b, with respect to the passivation layer; one can properly select arrangement in accordance with an passivation layer 42b may be arranged so as to cover the top surface and the side surfaces of the first passivation layer 42a, and the first passivation layer 42a may be arranged so as to cover the top surface and the side surfaces of the second passivation layer 42b.

Note that, although the description regarding FIGS. 21A through 22B explains a configuration where the organic EL element 350 is arranged to be by the drive-circuit 320, the organic EL element 350 may be arranged to be above the drive-circuit 320. Here, the display element is still a so-called "bottom-emission" type, where light-emission is extracted through the substrate 321, and therefore transparency is required for the drive-circuit 320. It is preferred that conductive and transparent oxide such as ZnO with ITO, $In_2O_3$, $SnO_2$, ZnO, or Ga added, ZnO with Al added, and $SnO_2$ with Sb added is used for the source-electrodes, the drain-electrodes, and the anode.

Twelfth Embodiment

Description of the twelfth embodiment explains an example of an image displaying apparatus and a system using the FET according to the first embodiment. Note that, in the description of the twelfth embodiment, explanation of the same configuration already explained in the above description may be omitted.

Figure 23:
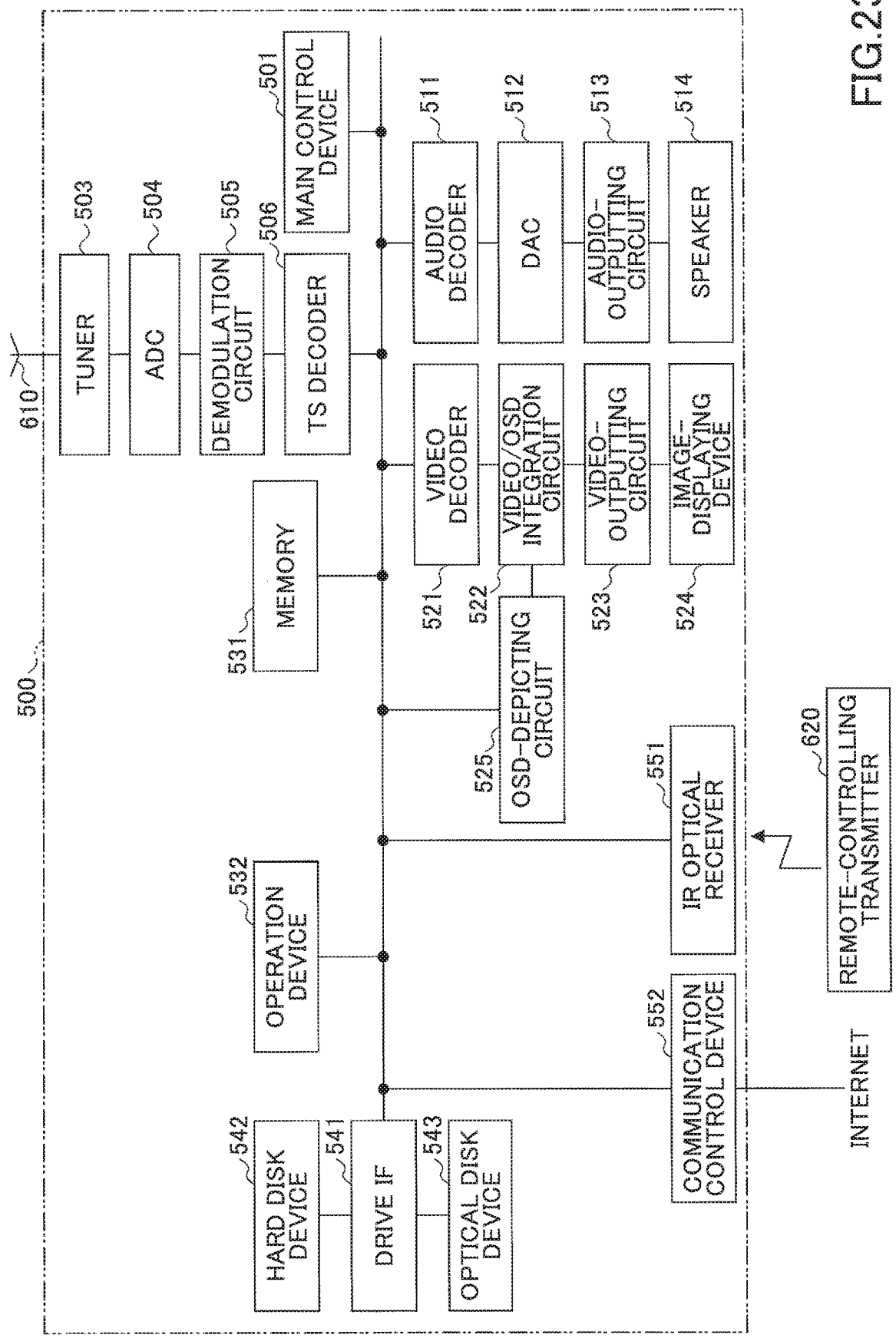
FIG. 23 is a block diagram illustrating a configuration of a television device according to a twelfth embodiment.

In FIG. 23, a schematic configuration of a television device 500 is illustrated as a system according to the twelfth embodiment. Here, connection lines illustrated in FIG. 23 are for indicating paths of representative signals and information, and not for expressing all relation of connection between each block.

The television device 500 according to the twelfth embodiment includes a main control device 501, a tuner 503, an analog-digital convertor (ADC) 504, a demodulation circuit 505, a transport-stream (TS) decoder 506, an audio decoder 511, a digital-analog convertor (DAC) 512, an audio-outputting circuit 513, a speaker 514, a video decoder 521, a video/on-screen display (OSD) integration circuit 522, a video-outputting circuit 523, an image-displaying device 524, an OSD-depicting circuit 525, a memory 531, an operation device 532, a drive interface (IF) 541, a hard disk device 542, an optical disk device 543, an infrared (IR) optical receiver 551, a communication control device 552, etc.

The main control device 501, which is constituted by a central processing unit (CPU), a flash read-only memory (ROM), a random access memory (RAM), etc., performs an overall control of the television device 500. The flash ROM stores programs written in a code readable to the CPU, various types of data utilized for processing performed by the CPU. Furthermore, the RAM is a memory as a working area.

The tuner 503 tunes in to a broadcast of a pre-set channel, among broadcast waves received by an antenna 610. The ACD 504 converts an output signal (i.e. analog information) of the tuner 503 into digital information. The demodulation circuit 505 demodulates the digital information output from the ACD 504.

The TS decoder 506 performs a TS decode on an output signal of the demodulation circuit 505, and then separates audio information and video information. The audio decoder 511 decodes the audio information output from the TS decoder 506. The DAC 512 converts an output signal from the audio decoder 511 into an analog signal.

The audio-outputting circuit 513 outputs an output signal from the DAC 512 to the speaker 514. The video decoder 521 decodes the video information output from the TS decoder 506. The video/OSD integration circuit 522 integrates an output signal from the video decoder 521 and an output signal from the OSD-depicting circuit 525.

The video-outputting circuit 523 outputs an output signal from the video/OSD integration circuit 522 to the image-displaying device 524. The OSD-depicting circuit 525, which is provided with a character-generator for displaying letters, figures, etc., on the image-displaying device 524, generates a signal that includes display information, based on an instruction from the operation device 532 and the IR optical receiver 551.

The memory 531 temporarily stores audio-visual (AV) data, etc. The operation device 532, which is provided with an input medium (not illustrated in FIG. 23) such as a control panel, transmits various types of input information from a user to the main control device 501. The drive interface IF 541 is an interactive communication interface that complies with, for example, AT Attachment Packet Interface (ATAPI).

The hard disk device 542 is constituted by a hard disk, a driving device for driving the hard disk, etc. The driving device stores data in the hard disk, and retrieves data stored in the hard disk as well. The optical disk device 543 stores data in an optical disk (e.g. a digital versatile disc (DVD)), and retrieves data stored in the optical disk as well.

The IR optical receiver 551 receives an optical signal from a remote-controlling transmitter 620, and then transmits the optical signal to the main control device 501. The communication control device 552 controls communication with the internet, and is capable of acquiring various types of information via the internet.

Figure 24:
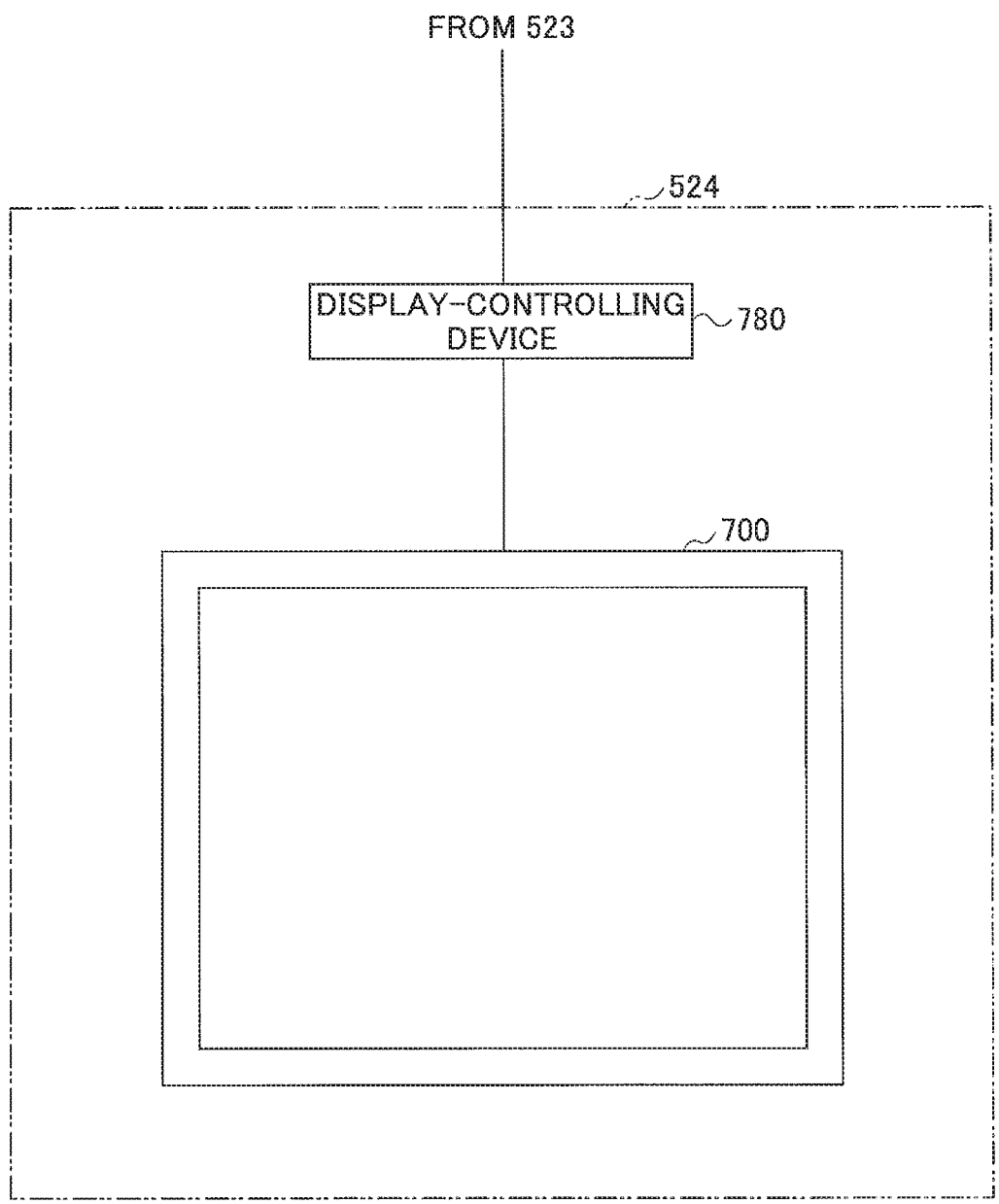
FIG. 24 is a (first) drawing for explaining the television device according to the twelfth embodiment.
Figure 25:
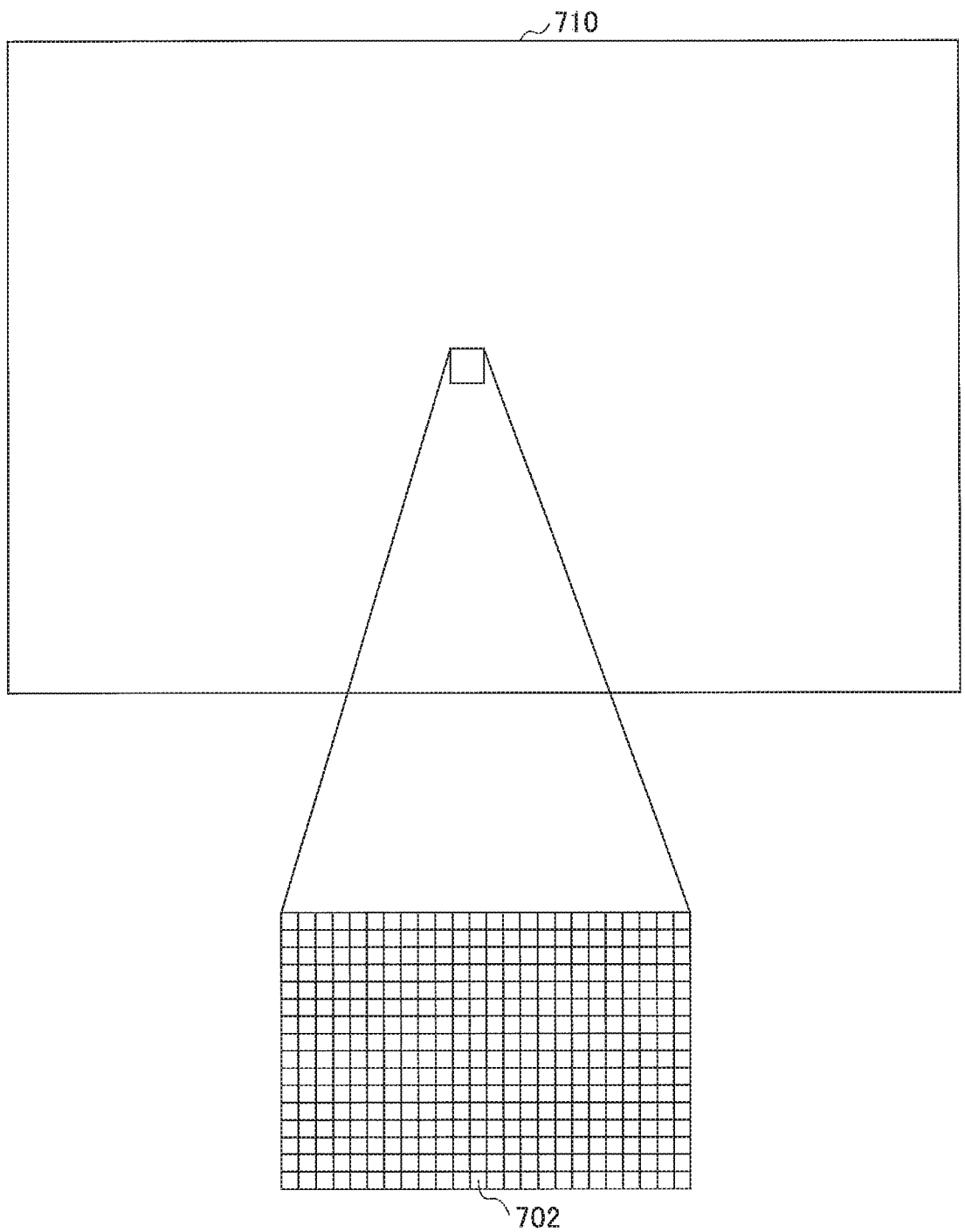
FIG. 25 is a (second) drawing for explaining the television device according to the twelfth embodiment.

The image-displaying device 524 includes a screen 700 and a display-controlling device 780, as illustrated in FIG. 24 as an example. The screen 700 includes a display 710, on which a number (here, n×m) of display elements 702 are arranged in a matrix, as illustrated in FIG. 25 as an example.

Figure 26:
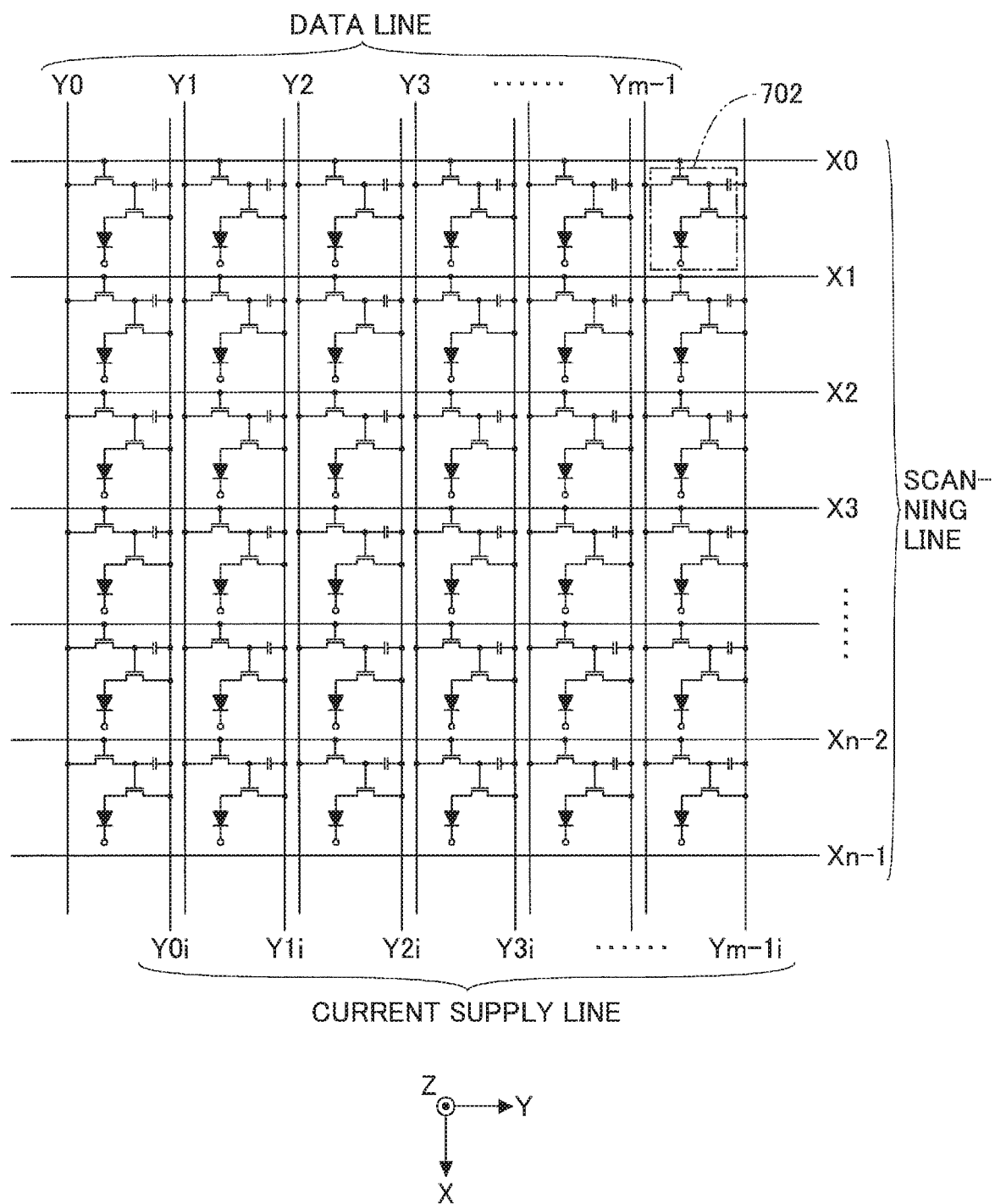
FIG. 26 is a (third) drawing for explaining the television device according to the twelfth embodiment.

Furthermore, the display 710 includes (number) scanning lines (i.e. X0, X1, X2, X3, . . . , Xn−2, Xn−1), which are arranged at equal intervals in the X-axis direction, m (number) data lines (i.e. Y0, Y1, Y2, Y3, . . . , Ym−1), which are arranged at equal intervals in the Y-axis direction, m (number) current supply lines (i.e. Y0i, Y1i, Y2i, Y3i, . . . , Ym−1i), which are arranged at equal intervals in the Y-axis direction, as illustrated in FIG. 26 as an example. Additionally, each of the display elements 702 may be identified, based on the scanning lines and the data lines.

Figure 27:
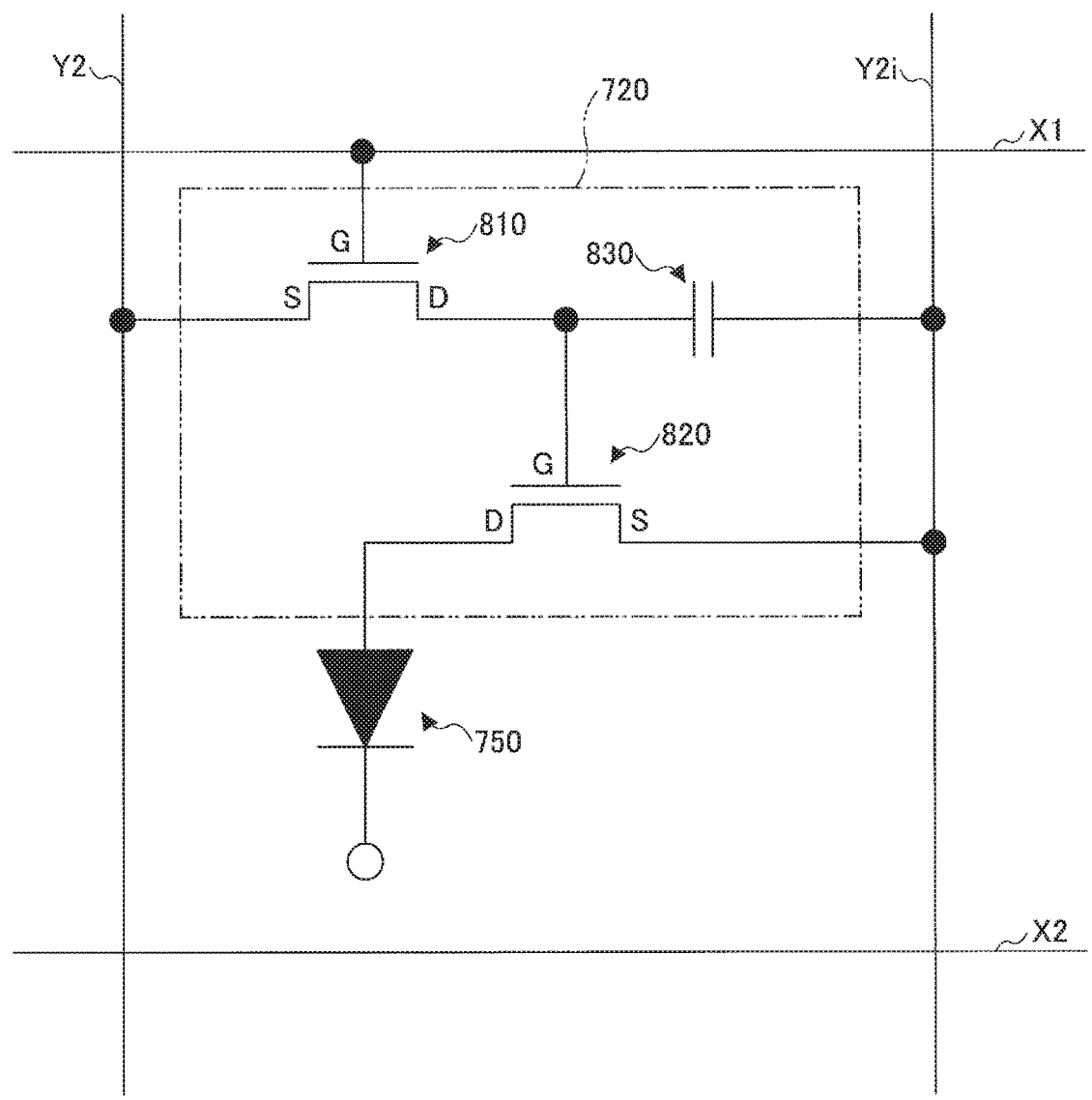
FIG. 27 is a drawing for explaining a display element according to the twelfth embodiment.

Each of the display elements 702 includes an organic EL element 750, and a drive-circuit 720 for lighting the organic EL element 750, as illustrated in FIG. 27 as an example. That is to say, the display 710 is a so-called active matrix organic EL display. Furthermore, the display 710 is a 32-inch color display, although there is no specific limitation regarding sizes of the display 710.

Figure 28:
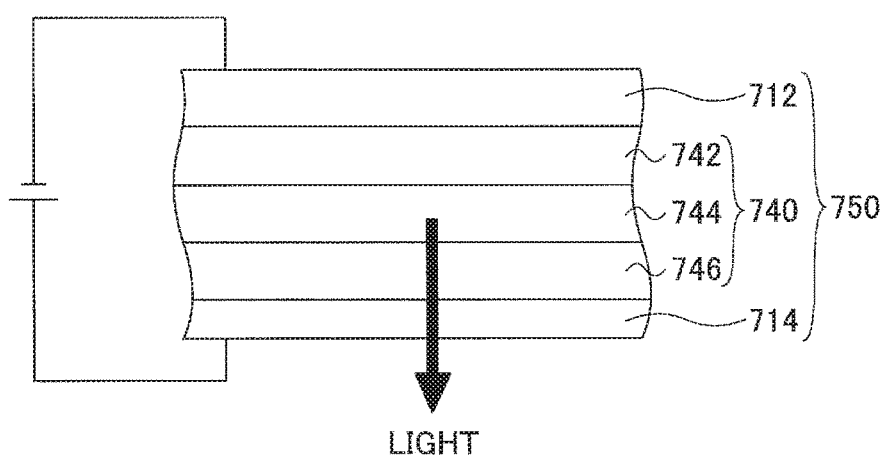
FIG. 28 is a drawing for explaining an organic EL element according to the twelfth embodiment.

The organic EL element 750 includes an organic EL thin-film layer 740, a cathode 712, and an anode 714, as illustrated in FIG. 28 as an example.

The organic EL element 750 may be arranged, for example, to be by the FET. In such a case, the organic EL element 750 and the FET may be formed on the same substrate. However, there is no specific limitation regarding arrangement of the organic EL element 750. For example, the organic EL element 750 may be arranged above the FET. In such a case, transparency is required for the gate-electrode. Thus, it is preferred that a conductive and transparent oxide such as ZnO with ITO, $In_2O_3$, $SnO_2$, ZnO, or Ga added, ZnO with Al added, and $SnO_2$ with Sb added is used for the gate-electrode.

Al is used for the cathode 712 provided on the organic EL element 750. Note that, Mg—Ag alloy, Al—Li alloy, ITO, etc., may be used as well. ITO is used for the anode 714. Note that, conductive oxide such as $In_2O_3$, $SnO_2$, or ZnO, and Ag—Nd alloy, etc., may be used for the anode 714 as well.

The organic EL thin-film layer 740 includes an electron-transport layer 742, a light-emitting layer 744, and a hole-transport layer 746. Furthermore, the cathode 712 is connected to the electron-transport layer 742, and the anode 714 is connected to the hole-transport layer 746. The light-emitting layer 744 emits light, responding to a predetermined amount of electric voltage applied between the anode 714 and the cathode 712.

Furthermore, as illustrated in FIG. 27, the drive-circuit 720 includes two FETs 810 and 820, and a condenser 830. The FET 810 functions as a switching element. A gate-electrode G is connected to a predetermined scanning line, and a source-electrode S is connected to a predetermined data line. Furthermore, a drain-electrode D is connected to one of the terminals of the condenser 830.

The condenser 830 is provided for storing a state of the FET 810, in other words, for storing data. The other terminal of the condenser 830 is connected to a predetermined current supply line.

The FET 820 is provided for supplying a large amount of current to the organic EL element 750. A gate-electrode G is connected to the drain-electrode D provided on the FET 810. In addition, a drain-electrode D is connected to the anode 714 of the organic EL element 750, and a source-electrode S is connected to a predetermined current supply line.

Here, when the FET 810 turns to "ON" state, the FET 820 drives the organic EL element 750.

Figure 29:
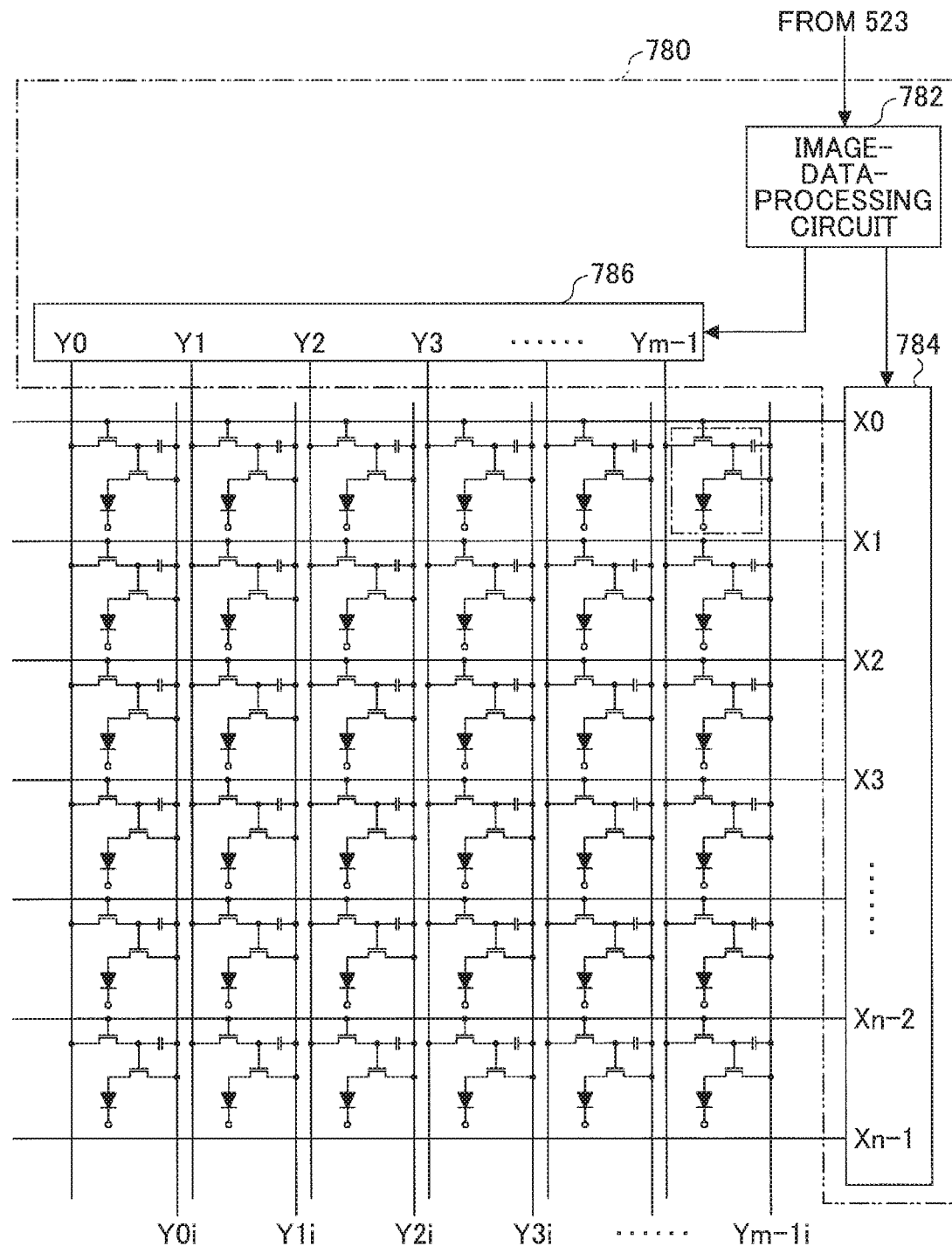
FIG. 29 is a (fourth) drawing for explaining the television device according to the twelfth embodiment.

The display-controlling device 780 includes an image-data-processing circuit 782, a scanning-line-drive-circuit 784, and a data-line-drive-circuit 786, as illustrated in FIG. 29 as an example.

The image-data-processing circuit 782 determines brightness of the multiple display elements 702 on the display 710, based on an output signal of the video-outputting circuit 523. The scanning-line-drive-circuit 784 applies electric voltage to n (number) scanning lines, specifically, based on commands from the image-data-processing circuit 782. The data-line-drive-circuit 786 applies electric voltage to m (number) data lines, specifically, based on commands from the image-data-processing circuit 782.

As described in the explanation above, the television device 500 according to the twelfth embodiment has an image-data-generating unit that is constituted by the video decoder 521, the video/OSD integration circuit 522, the video-outputting circuit 523, and the OSD-depicting circuit 525.

Furthermore, although the above description explains a case where a light-controlling element is an organic EL element, there is no specific limitation regarding light-controlling elements. The light-controlling element may be, for example, a liquid crystal element, an electrochromic element, an electrophoretic element, or an electrowetting element.

Figure 30:
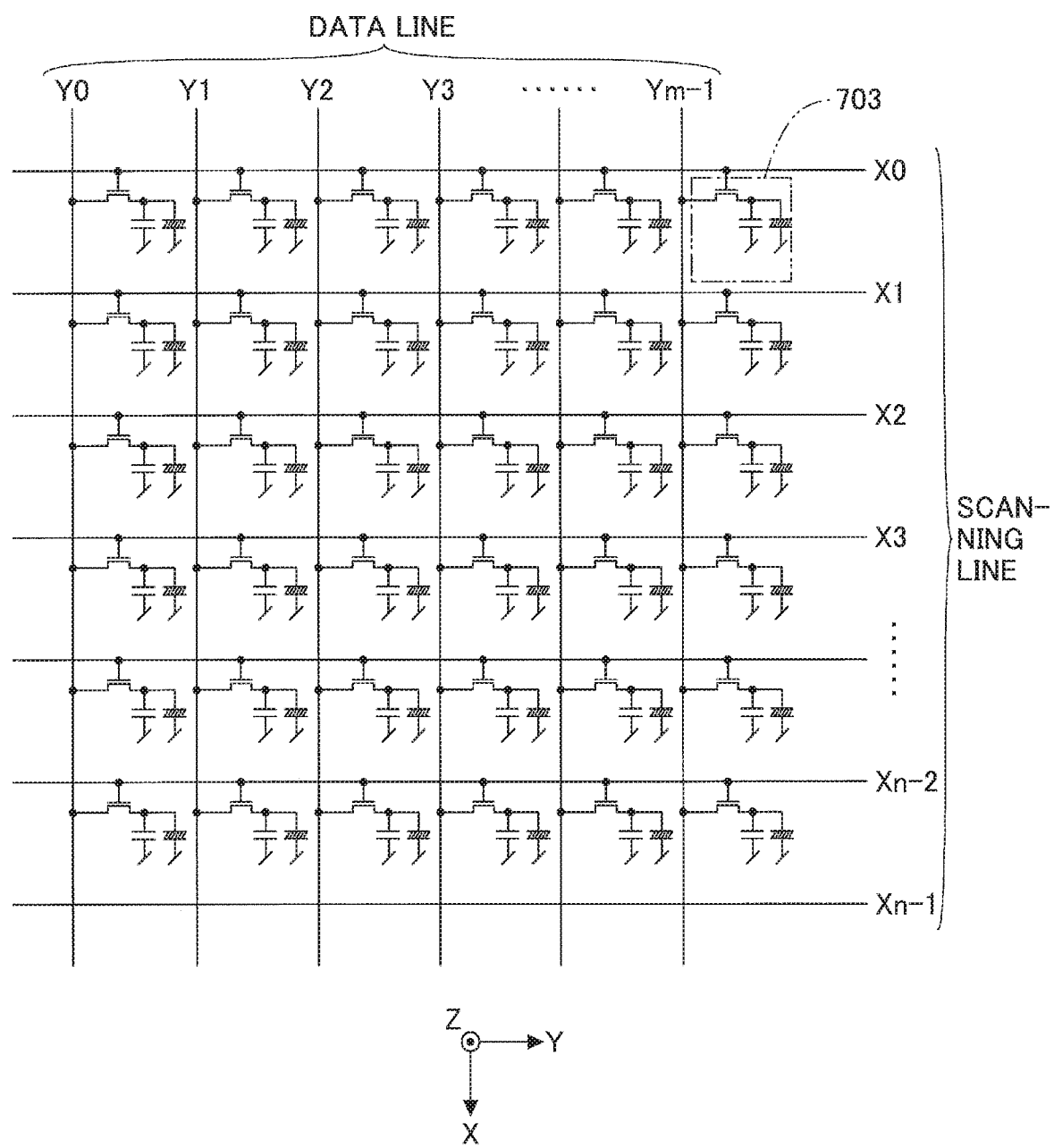
FIG. 30 is a (first) drawing for explaining another display element according to the twelfth embodiment.

For example, in a case where the light-controlling element is a liquid crystal element, a liquid crystal display is used for the display 710. In such a case, current supply lines are not required for a display element 703, as illustrated in FIG. 30.

Figure 31:
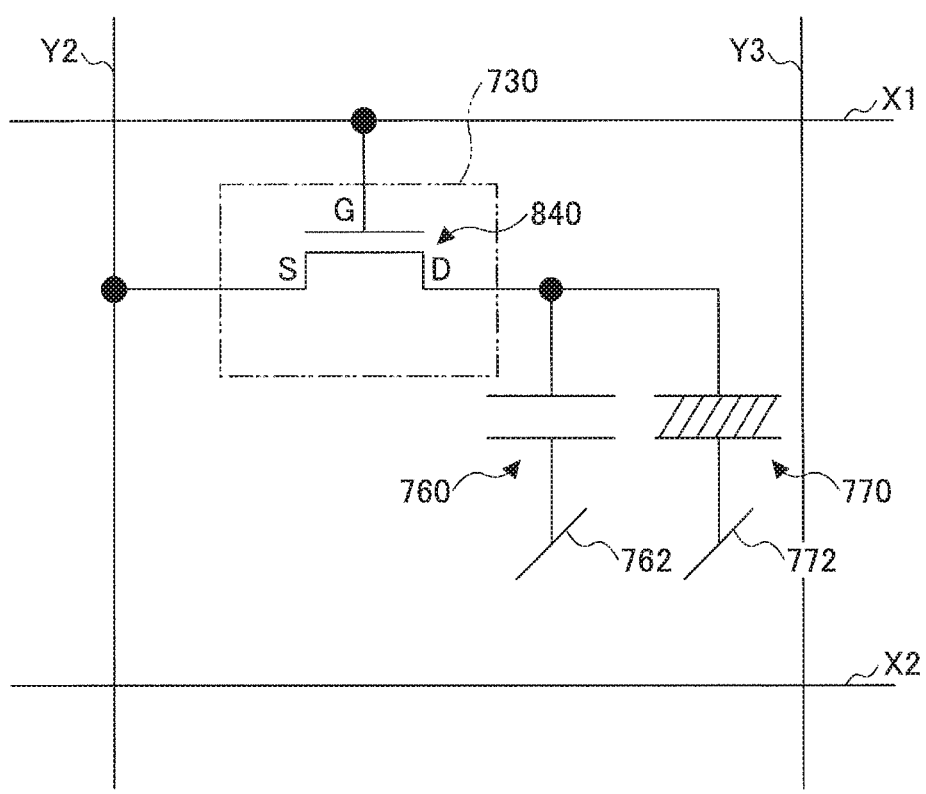
FIG. 31 is a (second) drawing for explaining another display element according to the twelfth embodiment.

Furthermore, in such a case, as illustrated in FIG. 20 as an example, the drive-circuit 730 may be constituted only by an FET 840, which is similar to the FETs 810 and 820 illustrated in FIG. 27. The FET 840 has a gate-electrode G that is connected to a predetermined scanning line and a source-electrode S that is connected to a predetermined data line. Furthermore, a drain-electrode D is connected to a pixel-electrode of a liquid crystal element 770 and a condenser 760. Here, reference symbols 762 and 772 in FIG. 31 indicate the condenser 760 and a counterpart electrode (i.e. a common electrode) of the liquid crystal element 770, respectively.

Furthermore, although the above description explains a case where the system is a television device, there is no specific limitation regarding systems. That is to say, the system is only required to include the aforementioned image-displaying device 524, which is a device for displaying an image and information. For example, the system may be a computer system, where a computer (e.g. personal computer) and the image-displaying device 524 are connected.

Furthermore, the image-displaying device 524 may be provided on a display unit of a mobile information device such as a mobile phone, a portable music player, a portable video player, an electronic book, and a personal digital assistant (PDA), and may be provided on a display unit of an image-capturing device such as a still camera and a video camera. Furthermore, the image-displaying device 524 may be provided on a display unit for displaying various types of information, which is mounted on a transportation system such as a car, an aircraft, a train, or a ship. Furthermore, the image-displaying device 524 may be provided on a display unit for displaying various types of information, which is mounted on a measurement device, an analysis device, a medical device, an advertisement medium, etc.

Practical Example 1

In the practical example 1, the bottom-gate/bottom-contact FET 10, as illustrated in FIG. 1, was manufactured.

(Formation of the Gate-Electrode)

First, the gate-electrode 12 was formed on the substrate 11. Specifically, an Mo film, which was a conductive film, was formed on the substrate 11, which was made of glass, by means of a direct-current (DC) sputtering method, so that the average film thickness was approximately 100 nm. Subsequently, the gate-electrode 12 was coated by photoresist, and then prebaked, exposed by an exposure device, and developed, so as to form a resist-pattern having a pattern that corresponds to the gate-electrode 12. Then, a part of the Mo film that was not covered by the resist-pattern was removed by means of reactive ion etching (RIE). Then, the resist-pattern was removed as well, in order to form the gate-electrode 12.

(Formation of the Gate-Insulating Layer)

Next, the gate-insulating layer 13 was formed. First, coating liquid for forming a gate-insulating layer was prepared. Specifically, the coating liquid for forming a gate-insulating layer was prepared by mixing 1.2 mL of cyclohexylbenzene, 1.95 mL of lanthanum 2-ethylhexanoate toluene solution (7% La; Wako 122-03371; product of WAKO CHEMICAL, LTD.), 0.57 mL of strontium 2-ethylhexanoate toluene solution (2% Sr; Wako 195-09561; product of WAKO CHEMICAL, LTD.), and 0.09 mL of zirconium 2-ethylhexanoate oxide mineral spirit solution (12% Zr; Wako 269-01116; product of WAKO CHEMICAL, LTD.).

Next, the coating liquid for forming a gate-insulating layer was dripped onto the substrate 11 and the gate-electrode 12, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 135 nm), which was paraelectric and amorphous. Subsequently, the Mo/Al/Mo-laminated film was coated by photoresist (TSMR-8800BE; product of TOKYO OHKA KOGYO Co., Ltd.), and then prebaked, exposed by an exposure device, and developed, so as to form a resist-pattern having a pattern that corresponded to the gate-insulating layer 13 to be formed.

Next, a part of the Sr—La—Zr oxide that was not covered by the resist-pattern was etched by being soaked in 0.1 mol/L of hydrochloric acid (Wako 083-01115; product of Wako. Pure Chemical Industries, Ltd.) for 30 seconds, and then the resist-pattern was removed as well, by being soaked in resist-peeling agent (i.e. STRIPPER 104; product of TOKYO OHKA KOGYO Co., Ltd.) for two minutes, in order to form the gate-insulating layer 13. Here, a part of the Sr—La—Zr oxide was removed to expose a part of the gate-electrode 12, so that electric voltage may be applied to the gate-electrode 12.

(Formation of the Source-Electrode and the Drain-Electrode)

Next, the source-electrode 14 and the drain-electrode 15 were formed. Specifically, an Mo film, which was a conductive film, was formed on the gate-insulating layer 13 by means of a DC sputtering method, so that the average film thickness was approximately 100 nm. Subsequently, the Mo film was coated by photoresist, and then prebaked, exposed by an exposure device, and developed, so as to form a resist-pattern having a pattern that corresponded to the source-electrode 14 and the drain-electrode 15. Then, a part of the Mo film that was not covered by the resist-pattern was removed by means of RIE. Then, the resist-pattern was removed as well, in order to form the source-electrode 14 and the drain-electrode 15.

(Formation of the Active Layer)

Next, the active layer 16 was formed. Specifically, an Mg—In-based oxide ($In_2MgO_4$) film was formed by means of a DC sputtering method, so that the average film thickness was approximately 100 nm. Subsequently, the Mg—In-based oxide film was coated by photoresist, and then prebaked, exposed by an exposure device, and developed, so as to form a resist-pattern having a pattern that corresponds to the active layer 16. Then, a part of the Mg—In-based oxide film that was not covered by the resist-pattern was removed by means of RIE. Then, the resist-pattern was removed as well, in order to form the active layer 16. Through the above steps, the active layer 16 was obtained, so as to form a channel between the source-electrode 14 and the drain-electrode 15.

(Formation of the Passivation Layer)

Next, the passivation layer 17 was formed. Specifically, a SiON film was formed by means of a plasma CVD method, so that the average film thickness was 300 nm. Subsequently, the SiON film was coated by photoresist, and then prebaked, exposed by an exposure device, and developed, so as to form a resist-pattern having a pattern that corresponded to the passivation layer 17. Then, a part of the SiON film that was not covered by the resist-pattern was removed by means of RIE. Then, the resist-pattern was removed as well, in order to form the passivation layer 17.

Through the above steps, a bottom-gate/bottom-contact FET 10 was manufactured.

Practical Example 2

The FET 10 was manufactured in exactly the same method as used in the practical example 1, except that etchant for the Sr—La—Zr oxide was 5% "(Formation of the Gate-Insulating Layer)" in practical example 1.

Practical Example 3

The FET 10 was manufactured in exactly the same method as used in the practical example 1, except that etchant for the Sr—La—Zr oxide was 20% nitric acid, at a step that corresponds to "(Formation of the Gate-Insulating Layer)" in practical example 1.

Practical Example 4

The FET 10 was manufactured in exactly the same method as used in the practical example 1, except that etchant for the Sr—La—Zr oxide was 50% phosphoric acid, at a step that corresponds to "(Formation of the Gate-Insulating Layer)" in practical example 1.

Practical Example 5

The FET 10 was manufactured in exactly the same method as used in the practical example 1, except that etchant for the Sr—La—Zr oxide was 5% acetic acid and soaking time in the etchant was 6 minutes, at a step that corresponds to "(Formation of the Gate-Insulating Layer)" in practical example 1.

Practical Example 6

The FET 10 was manufactured in exactly the same method as used in the practical example 1, except that etchant for the Sr—La—Zr oxide was 10% sulfuric acid, at a step that corresponds to "(Formation the Gate-Insulating Layer)" in practical example 1.

Practical Example 7

The FET 10 was manufactured in exactly the same method as used in the practical example 1, except that etchant for the Sr—La—Zr oxide was mixed solution containing 20% of nitric acid, 60% of phosphoric acid, and 20% of water, at a step that corresponds to "(Formation of the Gate-Insulating Layer)" in practical example 1.

Practical Example 8

The FET 10 was manufactured in exactly the same method as used in the practical example 1, except that etchant for the Sr—La—Zr oxide was mixed solution containing 5% of nitric acid, 80% of phosphoric acid, 10% of acetic acid, and 5% of water, at a step that corresponds to "(Formation of the Gate-Insulating Layer)" in practical example 1.

Practical Example 9

The FET 10 was manufactured in exactly the same method as used in the practical example 1, except that etchant for the Sr—La—Zr oxide was 5% hydrogen peroxide water, at a step that corresponds to "(Formation of the Gate-Insulating Layer)" in practical example 1.

Practical Example 10

In the practical example 10, the top-gate/self-aligned FET 120, as illustrated in FIG. 5, was manufactured.
(Formation of the Active Layer)
First, the active layer 122 was formed on the substrate 121. Specifically, an Mg—In-based oxide ($In_2MgO_4$) film was formed on the substrate 121, which was made of glass, by means of a DC sputtering method, so that the average film thickness was approximately 100 nm. Subsequently, the Mg—In-based oxide film was coated by photoresist, and then prebaked, exposed by an exposure device, and developed, so as to form a resist-pattern having a pattern that corresponded to the active layer 122. Then, a part of the Mg—In-based oxide film that was not covered by the resist-pattern was removed by means of RIE. Then, the resist-pattern was removed as well, in order to form the active layer 122.

(Formation of the Gate-Insulating Layer and the Gate-Electrode)
Next, the gate-insulating layer 123 was formed. The same coating liquid for forming a gate-insulating layer as used in the practical example 1 was dripped onto the substrate 121 and the active layer 122, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 135 nm), which was paraelectric and amorphous. Then, an Mo/Al/Mo-laminated film, which is a conductive film, was formed by means of a DC sputtering method, so that the average film thickness was approximately 300 nm (i.e. 50 nm/200 nm/50 nm). Subsequently, the Mo/Al/Mo-laminated film was coated by photoresist, and then prebaked, exposed by an exposure device, and developed, so as to form a resist-pattern having a pattern that corresponded to the gate-electrode 124. Then, the Mo/Al/Mo-laminated film and the Sr—La—Zr oxide were soaked in mixed solution containing 5% of nitric acid, 80% of phosphoric acid, 10% of acetic acid, and 5% of water for 30 seconds, so that a part of the Mo/Al/Mo-laminated film and a part of the Sr—La—Zr oxide that were not covered by the resist-pattern were removed. Then, the resist-pattern was removed as well, in order to obtain the gate-insulating layer 123 and the gate-electrode 124.

(Formation of the Interlayered Insulating Film)
Next, the interlayered insulating film 127 was formed. Specifically, a SiON film was formed by means of a plasma CVD method, so that the average film thickness is 300 nm. Subsequently, the SiON film was coated by photoresist, and then prebaked, exposed by an exposure device, and developed, so as to form a resist-pattern having a pattern that corresponded to the interlayered insulating film 127. Then, a part of the SiON film that was not covered by the resist-pattern was removed by means of RIE. Then, the resist-pattern was removed as well, in order to form the interlayered insulating film 127.

(Formation of the Source-Electrode and the Drain-Electrode)
Next, the source-electrode 125 and the drain-electrode 126 were formed. Specifically, an Mo/Al/Mo-laminated film, which was a conductive film, was formed on the interlayered insulating film 127 by means of a DC sputtering method, so that the average film thickness was approximately 300 nm (i.e. 50 nm/200 nm/50 nm). Subsequently, the Mo/Al/Mo-laminated film was coated by photoresist, and then prebaked, exposed by an exposure device, and developed, so as to form a resist-pattern having a pattern that corresponded to the source-electrode 125 and the drain-electrode 126. Then, a part of the Mo/Al/Mo-laminated film that was not covered by the resist-pattern was removed by means of RIE. Then, the resist-pattern was removed as well, in order to obtain the source-electrode 125 and the drain-electrode 126 formed by the Mo/Al/Mo-laminated film.

(Formation of the Passivation Layer)
Next, the passivation layer 128 was formed. Specifically, a SiON film was formed by means of a plasma CVD method, so that the average film thickness was 300 nm. Subsequently, the SiON film was coated by photoresist, and then prebaked, exposed by an exposure device, and developed, so as to form a resist-pattern having a pattern that corresponded to the passivation layer 128. Then, a part of the SiON film that was not covered by the resist-pattern was removed by means of RIE. Then, the resist-pattern was removed as well, in order to form the passivation layer 128. Through the above steps, the top-gate/self-aligned FET 120 was manufactured.

(Evaluation of a Transistor-Property)

Evaluation of a transistor-property was performed with respect to each of the FETs manufactured in practical examples 1 through 10. Evaluation of a transistor-property was based on measurement of a relation (Vgs-Ids) of voltage (Vgs) between the source-electrode 14 and the drain-electrode 15 and current (Ids) between the source-electrode 14 and the drain-electrode 15, provided that the voltage (Vds) between the source-electrode 14 and the drain-electrode 15 was +10 V.

Furthermore, field-effect mobility in the saturation region was calculated, based on the evaluation result of a transistor-property (Vgs-Ids). Further, S-value was calculated, as an indicator for rise-sharpness of Ids in response to application of Vgs. Further, a ratio (i.e. ON/OFF ratio) of Ids in "ON" state (e.g. Vgs=+10 V) of a transistor to Ids in "OFF" state (e.g. Vgs=−10 V) of the transistor was calculated. Further, a threshold-voltage (Vth), which was a value of voltage corresponding to rise of Ids in response to application of Vgs, was calculated.

With regard to results of transistor-properties, preferable transistor-properties are: high mobility; high ON/OFF ratio; low S-value; and Vts in proximity of 0 V. Specifically, preferable transistor-properties are: mobility of 3 $cm^2/Vs$ or more; ON/OFF ratio of $1.0 \times 10^8$ or more; S-value of 0.7 or less; and Vth in a range of ±5 V.

Furthermore, capacitance of the gate-insulating layer was simultaneously measured, in order to calculate dielectric constant. Energy consumption is considered to be low, when the gate insulating layer has dielectric constant of 6 or more.

Evaluation result of the transistor-properties of the FETs manufactured in the practical examples 1 through 10 is shown in Table 1. It is noticeable that all of the FETs manufactured in the practical examples 1 through 10 have preferable transistor-properties. Furthermore, dielectric constant of the gate-insulation layers according to the practical examples 1 through 10 are all approximately 13, and therefore energy consumption of the FETs are considered to be low.

As described above, it is confirmed that usage of the first oxide for the gate-insulating layer and usage of a low-cost patterning process, in which wet-etching is performed on the first oxide, enable producing a high quality FET.

TABLE 1

| | MOBILITY [$cm^2/Vs$] | S-VALUE [V/dec] | ON/OFF RATIO | Vth [V] | DIELECTRIC CONSTANT OF GATE-INSULATING LAYER |
|---|---|---|---|---|---|
| PRACTICAL EXAMPLE 1 | 7.38 | 0.22 | $4.8 \times 10^8$ | 3.89 | 12.8 |
| PRACTICAL EXAMPLE 2 | 8.11 | 0.31 | $5.3 \times 10^8$ | 2.35 | 13.1 |
| PRACTICAL EXAMPLE 3 | 6.85 | 0.28 | $4.2 \times 10^8$ | 4.20 | 12.9 |
| PRACTICAL EXAMPLE 4 | 7.29 | 0.35 | $3.7 \times 10^8$ | 2.77 | 13.1 |
| PRACTICAL EXAMPLE 5 | 7.32 | 0.31 | $4.0 \times 10^8$ | 2.98 | 13.3 |
| PRACTICAL EXAMPLE 6 | 7.47 | 0.28 | $4.6 \times 10^8$ | 3.12 | 12.8 |
| PRACTICAL EXAMPLE 7 | 7.10 | 0.23 | $2.9 \times 10^8$ | 3.61 | 12.8 |
| PRACTICAL EXAMPLE 8 | 7.71 | 0.28 | $4.5 \times 10^8$ | 3.23 | 12.9 |
| PRACTICAL EXAMPLE 9 | 6.94 | 0.29 | $3.4 \times 10^8$ | 4.06 | 13.0 |
| PRACTICAL EXAMPLE 10 | 7.63 | 0.25 | $3.2 \times 10^8$ | 3.53 | 13.3 |

Practical Example 11

In practical example 11, the bottom-gate/bottom-contact FET 10 illustrated in FIG. 1 was manufactured.

(Formation of the Gate-Electrode)

First, the gate-electrode 12 was formed on the substrate 11 in the same method as in the practical example 1.

(Formation of the Gate-Insulating Layer)

Next, the gate-insulating layer 13 was formed. Specifically, a SiON film was formed by means of a plasma CVD method, so that the average film thickness was approximately 300 nm. Subsequently, the SiON film was coated by photoresist, and then prebaked, exposed by an exposure device, and developed, so as to form a resist-pattern having a pattern that corresponded to the gate-insulating layer 13. Then, a part of the SiON film that was not covered by the resist-pattern was removed by means of RIE. Then, the resist-pattern was removed as well, in order to form the gate-insulating layer 13.

(Formation of the Source-Electrode and the Drain-Electrode)

Next, the source-electrode 14 and the drain-electrode 15 were formed in the same method as in the practical example 1.

(Formation of the Active Layer)

Next, the active layer 16 was formed in the same method as in the practical example 1.

(Formation of the Passivation Layer)

Next, the passivation layer 17 was formed. First, coating liquid for forming a passivation layer was prepared. Specifically, the coating liquid for forming a passivation layer was prepared by mixing 1.2 mL of cyclohexylbenzene, 1.95 mL of lanthanum 2-ethylhexanoate toluene solution (i.e. Wako 122-03371), 0.57 mL of strontium 2-ethylhexanoate toluene solution (i.e. Wako 195-09561), and 0.09 mL of zirconium 2-ethylhexanoate oxide mineral spirit solution (i.e. Wako 269-01116).

Next, the coating liquid for forming a passivation layer was dripped onto the substrate 11, the gate-electrode 12, the gate-insulating layer 13, the source-electrode 14, the drain-electrode 15, and the active layer 16, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 135 nm), which was paraelectric and amorphous. Then, the Sr—La—Zr oxide was coated by photoresist (i.e. TSMR8800-BE), and then prebaked, exposed by an exposure device, and developed, so as to form a resist-pattern having a pattern that corresponded to the passivation layer 17 to be formed.

Next, a part of the Sr—La—Zr oxide that was not covered by the resist-pattern was etched by being soaked in 0.1 mol/L of hydrochloric acid (i.e. Wako 083-01115) for 30 seconds, and then the resist-pattern was removed as well, by being soaked in resist-peeling agent (i.e. STRIPPER 104; product of TOKYO OHKA KOGYO Co., Ltd.) for two minutes, in order to form the passivation layer 17. Here, a part of the Sr—La—Zr oxide was removed to expose a part of the gate-electrode 12, the source-electrode 14, and the drain-electrode 15, so that electric voltage may be applied to the gate-electrode 12 the source-electrode 14, and the drain-electrode 15.

Practical Example 12

The FET 10 was manufactured in exactly the same method as used in the practical example 11, except that etchant for the Sr—La—Zr oxide is 5% oxalic acid, at a step that corresponds to "(Formation of the Passivation Layer)" in practical example 11.

Practical Example 13

The FET 10 was manufactured in exactly the same method as used in the practical example 11, except that etchant for the Sr—La—Zr oxide was 20% nitric acid, at a step that corresponds to "(Formation of the Passivation Layer)" in practical example 11.

Practical Example 14

The FET 10 was manufactured in exactly the same method as used in the practical example 11, except that etchant for the Sr—La—Zr oxide was 50% phosphoric acid, at a step that corresponds to "(Formation of the Passivation Layer)" in practical example 11.

Practical Example 15

The FET 10 was manufactured in exactly the same method as used in the practical example 11, except that etchant for the Sr—La—Zr oxide was 5% acetic acid and soaking time in the etchant was 6 minutes, at a step that corresponds to "(Formation of the Passivation Layer)" in practical example 11.

Practical Example 16

The FET 10 was manufactured in exactly the same method as used in the practical example 11, except that etchant for the Sr—La—Zr oxide was 10% sulfuric acid, at a step that corresponds to "(Formation of the Passivation Layer)" in practical example 11.

Practical Example 17

The FET 10 was manufactured in exactly the same method as used in the practical example 11, except that etchant for the Sr—La—Zr oxide was mixed solution containing 20% of nitric acid, 60% of phosphoric acid, and 20% of water, at a step that corresponds to "(Formation of the Passivation Layer)" in practical example 11.

Practical Example 18

The FET 10 was manufactured in exactly the same method as used in the practical example 11, except that etchant for the Sr—La—Zr oxide was mixed solution containing 5% of nitric acid, 80% of phosphoric acid, 10% of acetic acid, and 5% of water, at a step that corresponds to "(Formation of the Passivation Layer)" in practical example 11.

Practical Example 19

The FET 10 was manufactured in exactly the same method as used in the practical example 11, except that etchant for the Sr—La—Zr oxide was 5% hydrogen peroxide water, at a step that corresponds to "(Formation of the Passivation Layer)" in practical example 11.

(Evaluation of a Transistor-Property)

With respect to each of the FETs manufactured in practical examples 11 through 19, mobility, ON/OFF ratio, S-value, and threshold-voltage (Vth) were calculated, in the same method as used in the practical examples 1 through 10. Furthermore, with respect to each of the FETs manufactured in practical examples 11 through 19, 100-hours-long BTS test was executed, in the atmosphere (temperature: 50° C.; relative humidity: 50%).

The following four conditions were provided as stress-conditions:
(1) Vgs=+10 V, and Vds=0 V
(2) Vgs=+10 V, and Vds=+10 V
(3) Vgs=−10 V, and Vds=0 V
(4) Vgs=−10 V, and Vds=+10 V Every time a predetermined amount of time passes in the BTS test, the relation (Vgs-Ids) of Vgs and Ids under condition of Vds=+10 V, was measured, in order to evaluate shift (ΔVth) of threshold-voltage in stressing-time of 100 hours. An FET is considered to be reliable, when the shift (ΔVth) of threshold-voltage in stressing-time of 100 hours is 3V or less.

Evaluation result of the transistor-properties of the FETs manufactured in the practical examples 11 through 19 is shown in Table 2. It is noticeable that all of the FETs manufactured in the practical examples 11 through 19 have preferable transistor-properties. Furthermore, it is noticeable that shift (ΔVth) of threshold-voltage is less than 1 V, with respect to each of the results, and therefore the FETs are considered to have high reliability.

As described above, it is confirmed that usage of the first oxide for the passivation layer and usage of a low-cost patterning process, in which wet-etching is performed on the first oxide, enable producing a high quality FET.

TABLE 2

| | MOBILITY [cm²/Vs] | S-VALUE [V/dec] | ON/OFF RATIO | Vth [V] | Δ Vth[V] | | | |
|---|---|---|---|---|---|---|---|---|
| | | | | | Vgs +10 V Vds 0 V | Vgs +10 V Vds +10 V | Vgs −10 V Vds 0 V | Vgs −10 V Vds +10 V |
| PRACTICAL EXAMPLE 11 | 5.17 | 0.45 | 2.4 × 10⁸ | −1.24 | 1.76 | 1.92 | −0.90 | −0.82 |
| PRACTICAL EXAMPLE 12 | 5.60 | 0.50 | 4.7 × 10⁸ | −0.81 | 1.59 | 1.54 | −0.69 | −0.94 |

TABLE 2-continued

|  | MOBILITY [cm²/Vs] | S-VALUE [V/dec] | ON/OFF RATIO | Vth [V] | ΔVth[V] | | | |
|---|---|---|---|---|---|---|---|---|
|  |  |  |  |  | Vgs +10 V Vds 0 V | Vgs +10 V Vds +10 V | Vgs −10 V Vds 0 V | Vgs −10 V Vds +10 V |
| PRACTICAL EXAMPLE 13 | 4.98 | 0.53 | $3.9 \times 10^8$ | −1.69 | 1.25 | 1.40 | −0.81 | −0.73 |
| PRACTICAL EXAMPLE 14 | 5.33 | 0.51 | $4.0 \times 10^8$ | −0.90 | 1.80 | 1.95 | −0.87 | −0.84 |
| PRACTICAL EXAMPLE 15 | 5.12 | 0.47 | $3.8 \times 10^8$ | −1.17 | 1.54 | 1.86 | −0.86 | −0.81 |
| PRACTICAL EXAMPLE 16 | 5.73 | 0.44 | $4.2 \times 10^8$ | −0.84 | 1.77 | 1.59 | −0.68 | −0.77 |
| PRACTICAL EXAMPLE 17 | 4.85 | 0.42 | $2.9 \times 10^8$ | −1.33 | 1.33 | 1.52 | −0.91 | −0.79 |
| PRACTICAL EXAMPLE 18 | 5.26 | 0.48 | $3.1 \times 10^8$ | −1.42 | 1.68 | 1.61 | −0.64 | −0.70 |
| PRACTICAL EXAMPLE 19 | 4.90 | 0.53 | $3.5 \times 10^8$ | −0.95 | 1.41 | 1.73 | −0.75 | −0.88 |

Practical Example 20

In the practical example 20, the organic EL display element 200 illustrated in FIG. 6 was manufactured. First, the first gate-electrode 22 and the second gate-electrode 32 were formed on the substrate 21. Specifically, an Mo film was formed on the substrate 21, which was made of alkali-free glass, by means of a DC sputtering method, so that the average film thickness was approximately 100 nm. Subsequently, the Mo film was coated by photoresist, and then prebaked, exposed by an exposure device, and developed, so as to form a resist-pattern having a pattern to be formed. Then, a part of the Mo film that was not covered by the resist-pattern was removed by means of RIE. Then, the resist-pattern was removed as well, in order to form the first gate-electrode 22 and the second gate-electrode 32.

Next, the gate-insulating layer 23 was formed over the substrate 21, the first gate-electrode 22, and the second gate-electrode 32. First, 1 L of coating liquid for forming a gate-insulating layer having the same composition as in the practical example 1 was prepared.

Next, the coating liquid for forming a gate-insulating layer was applied to the substrate 21, the first gate-electrode 22, and the second gate-electrode 32 by means of a slit-coating method. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 135 nm), which was paraelectric and amorphous.

Then, the Sr—La—Zr oxide was coated by photoresist (i.e. TSMR8800-BE), and then prebaked, exposed by an exposure device, and developed, so as to form a resist-pattern having a pattern that corresponded to the gate-insulating layer 23 to be formed.

Next, a part of the Sr—La—Zr oxide that was not covered by the resist-pattern was etched, by being soaked in 0.1 mol/L of hydrochloric acid (Wako 083-01115) for 30 seconds, and then the resist-pattern was removed as well, by being soaked in resist-peeling agent (i.e. STRIPPER 104) for two minutes, in order to form the gate-insulating layer 23 having a through-hole on the second gate-electrode 32.

Then, the first source-electrode 24, the second source-electrode 34, the first drain-electrode 25, and the second drain-electrode 35 were formed. Specifically, an ITO film, which was a transparent and conductive film, was formed on the gate-insulating layer 23 by means of a DC sputtering method, so that the average film thickness was approximately 100 nm. Subsequently, the ITO film was coated by photoresist, and then prebaked, exposed by an exposure device, and developed, so as to form a resist-pattern having a pattern to be formed.

Furthermore, a part of the ITO film that was not covered by the resist-pattern was removed by means of RIE. Then, the resist-pattern was removed as well, in order to form the first source-electrode 24, the second source-electrode 34, the first drain-electrode 25, and the second drain-electrode 35. In such a way, the first drain-electrode 25 and the second gate-electrode 32 were connected via the through-hole formed on the gate-insulating layer 23.

Next, the first active layer 26 and the second active layer 36 were formed. Specifically, an Mg—In-based oxide film was formed by means of a DC sputtering method, so that the average film thickness was approximately 100 nm. Subsequently, the Mg—In-based oxide film was coated by photoresist, and then prebaked, exposed by an exposure device, and developed, so as to form a resist-pattern having a pattern to be formed. Then, a part of the Mg—In-based oxide film that was not covered by the resist-pattern was removed by means of RIE. Then, the resist-pattern was removed as well, in order to form the first active layer 26 and the second active layer 36.

In such a way, the first active layer 26 was formed, so that a channel was formed between the first source-electrode 24 and the first drain-electrode 25. Furthermore, the second active layer 36 was formed, so that a channel was formed between the second source-electrode 34 and the second drain-electrode 35.

Next, the first passivation layer 27 and the second passivation layer 37 were formed. First, coating liquid for forming a passivation layer was prepared. Specifically, the coating liquid for forming a passivation layer was prepared by mixing 1.2 mL of cyclohexylbenzene, 1.95 mL of lanthanum 2-ethylhexanoate toluene solution (i.e. Wako 122-03371), 0.57 mL of strontium 2-ethylhexanoate toluene solution (i.e. Wako 195-09561), and 0.09 mL of zirconium 2-ethylhexanoate oxide mineral spirit solution (i.e. Wako 269-01116).

Next, the coating liquid for forming a gate-insulating layer was dripped onto the substrate 21, the first gate-electrode 22, the second gate-electrode 32, the gate-insulating layer 23, the first source-electrode 24, the first drain-electrode 25, the second source-electrode 34, the second drain-electrode 35, the first active layer 26, and the second active layer 36, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 135 nm), which was paraelectric and amorphous. Then, the Sr—La—Zr oxide was coated by photoresist (i.e. TSMR8800-BE), and then prebaked, exposed by an exposure device, and developed, so as to form a resist-pattern having a pattern that corresponded to the first passivation layer 27 and the second passivation layer 37 to be formed.

Next, a part of the Sr—La—Zr oxide that was not covered by the resist-pattern was etched, by being soaked in 0.1 mol/L of hydrochloric acid (Wako 083-01115) for 30 seconds, and then the resist-pattern was removed as well, by being soaked in resist-peeling agent (i.e. STRIPPER 104) for two minutes, in order to form the first passivation layer 27 and the second passivation layer 37. Through the above steps, the two-transistor/one-capacitor drive-circuit substrate 321 was manufactured.

Next, the interlayered insulating film 220 (i.e. planarizing film) was formed on the drive-circuit 210. Specifically, positive type photosensitive organic material (SUMIRESIN EXCEL® CRC series; product of Sumitomo Bakelite Co., Ltd.) was applied by means of a spin-coating method, and then prebaked, exposed by an exposure device, and developed, so as to form a desired pattern. Then, a postbaking process was performed in the temperature of 320° C. for 30 mins, in order to form the interlayered insulating film 220 provided with the through-hole 220x on the second drain-electrode 35. The average film thickness of the interlayered insulating film 220 formed in such a way was approximately 3 μm.

Next, the lower-electrode 231, which was a pixel-electrode, was formed. Specifically, an Ag—Pd—Cu thin-film and an ITO thin-film were continually formed by means of a DC sputtering method, so that each of the average film thickness was approximately 100 nm. Subsequently, the Ag—Pd—Cu thin-film and the ITO thin-film were coated by photoresist, and then prebaked, exposed by an exposure device, and developed, so as to obtain a desired resist-pattern. Then, a part of the ITO thin-film and a part of the Ag—Pd—Cu thin-film that were not covered by the resist-pattern were removed in order by means of RIE. Then, the resist-pattern was removed as well, in order to form the lower-electrode 231.

Next, the partition-walls 240 were formed. Specifically, positive type photosensitive polyimide resin (DL-1000; product of Toray Industries, Inc.) was applied by means of a spin-coating method, and then prebaked, exposed by an exposure device, and developed, so as to form a desired pattern. Then, a postbaking process was performed in the temperature of 230° C. for 30 mins, in order to form the partition-walls 240.

Then, by means of an inkjet apparatus, the organic EL layer 232 was formed on the lower-electrode 231, using high-molecular organic luminescence material.

Then, the upper-electrode 233 was formed. Specifically, by means of vacuum deposition of MgAg, the upper-electrode 233 was formed on the organic EL layer 232 and the partition-walls 240.

Then, the sealing layer 250 was formed. Specifically, film formation of a SiN film was performed by means of a plasma CVD method, so that the average film thickness was approximately 2 μm, in order to form the sealing layer 250 on the upper-electrode 233.

Then, attachment of opposed insulating substrate 270 was performed. Specifically, the adhesive layer 260 was formed on the sealing layer 250, and then the opposed insulating substrate 270, which was alkali-free glass substrate, was attached.

The organic EL display element 200 manufactured through the above steps exhibited a quality of low energy consumption and high reliability.

As described above, usage of the first oxide for the first insulating layer and the passivation layer and usage of a low-cost patterning process, in which wet-etching is performed on the first oxide, enable producing a high quality organic EL display element.

Practical Example 21

In the practical example 21, the organic EL display element 200A illustrated in FIG. 7 was manufactured. Specifically, the organic EL display element 200A was manufactured in exactly the same method as used in the practical example 20, except that the first passivation layer 27 and the second passivation layer 37 (see FIG. 6) in the practical example 20 was changed into the integrated passivation layer 27A.

The manufactured organic EL display element 200A exhibited a quality of low energy consumption and high reliability.

As described above, usage of the first oxide for the gate-insulating layer and the passivation layer and usage of a low-cost patterning process, in which wet-etching is performed on the first oxide, enable producing a high quality organic EL display element.

Practical Example 22

In the practical example 22, the FET 50 (i.e. MOS-FET) illustrated in FIG. 8 was manufactured. First, coating liquid for forming a gate-insulating layer was prepared, in order to form the gate-insulating layer 53 on the substrate 51 (8 inches), which contains p-type Si. Specifically, the coating liquid for forming a gate-insulating layer was prepared by mixing 4.0 mL of cyclohexylbenzene, 1.95 mL of lanthanum 2-ethylhexanoate toluene solution (i.e. Wako 122-03371), 0.57 mL of strontium 2-ethylhexanoate toluene solution (i.e. Wako 195-09561), and 0.09 mL of zirconium 2-ethylhexanoate oxide mineral spirit solution (i.e. Wako 269-01116).

Next, the coating liquid for forming a gate-insulating layer was dripped onto the substrate 51, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 10 nm), which was paraelectric and amorphous.

Next, a polycrystalline silicon film was formed by means of a CVD method, and then patterning was performed on the polycrystalline silicon film by means of photolithography, in order to form the gate-electrode 52. Then, utilizing the gate-electrode 52 as a mask, a part of the Sr—La—Zr oxide that was not covered by the gate-electrode 52 was etched, by being soaked in 0.1 mol/L of hydrochloric acid (Wako 083-01115) for 5 seconds, in order to form the gate-insulating layer 53.

Next, SiON was a deposited by means of a CVD method, and then dry-etching was performed on the whole surface, in order to form the gate-sidewall-insulating film 54. Then, utilizing the gate-electrode 52 and the gate-sidewall-insulating film 54 as a self-alignment mask, phosphorus-ion implantation was performed on the substrate 51 for the purpose of ionic diffusion, in order to form the source-region 55 and the drain-region 56.

Next, $SiO_2$ was a deposited by means of a CVD method, and then photolithography was performed for forming the interlayered insulating film 57 having openings as throughholes. Lastly, an Al layer was deposited by means of a sputtering method to bury the through-holes, and patterning was performed by means of photolithography, in order to form the source-electrode 58 and the drain-electrode 59.

Lastly, the passivation layer 111 was formed. Specifically, a SiON film was formed by means of a plasma CVD method, so that the average film thickness was approximately 300 nm. Subsequently, the SiON film was coated by photoresist, and then prebaked, exposed by an exposure device, and developed, so as to form a resist-pattern having a pattern that corresponded to the passivation layer 111 to be formed. Then, a part of the SiON film that was not covered by the resist-pattern was removed by means of RIE. Then, the resist-pattern was removed as well, in order to form the passivation layer 111. Through the above steps, the FET 50 was manufactured.

The FET 50 manufactured in the practical example 22 exhibited a quality of low energy consumption. Furthermore, dielectric constant of the gate-insulating layer 53 was 13.3, and therefore energy consumption of the FET was considered to be low.

As described above, usage of the first oxide for the gate-insulating layer and usage of a low-cost patterning process, in which wet-etching is performed on the first oxide, enable producing a high quality FET.

Practical Example 23

In the practical example 23, the volatile semiconductor memory element 60 illustrated in FIG. 9 was manufactured. First, the gate-electrode 62 and the second capacitor-electrode 69 were formed on the substrate 61, which was made of alkali-free glass. Specifically, an Mo film was formed on the substrate 61 by means of a DC sputtering method, so that the average film thickness was approximately 100 nm. Subsequently, the Mo film was coated by photoresist, and then prebaked, exposed by an exposure device, and developed, so as to form a resist-pattern having a pattern that corresponded to the gate-electrode 62 and the second capacitor-electrode 69 to be formed. Then, a part of the Mo film that was not covered by the resist-pattern was removed by means of RIE. Then, the resist-pattern was removed as well, in order to form the gate-electrode 62 and the second capacitor-electrode 69.

Next, the gate-insulating layer 63 was formed. First, coating liquid for forming a gate-insulating layer was prepared. Specifically, the coating liquid for forming a gate-insulating layer was prepared by mixing 1.2 mL of cyclohexylbenzene, 1.95 mL of lanthanum 2-ethylhexanoate toluene solution (i.e. Wako 122-03371), 0.57 mL of strontium 2-ethylhexanoate toluene solution (i.e. Wako 195-09561), and 0.09 mL of zirconium 2-ethylhexanoate oxide mineral spirit solution (i.e. Wako 269-01116).

Next, the coating liquid for forming a gate-insulating layer was dripped onto the substrate 61, the gate-electrode 62, and the second capacitor-electrode 69, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 135 nm), which was paraelectric and amorphous. Then, the Sr—La—Zr oxide was coated by photoresist (i.e. TSMR8800-BE), and then prebaked, exposed by an exposure device, and developed, so as to form a resist-pattern having a pattern that corresponded to the gate-insulating layer 63 to be formed.

Next, a part of the Sr—La—Zr oxide that was not covered by the resist-pattern was etched, by being soaked in 0.1 mol/L of hydrochloric acid (Wako 083-01115) for 30 seconds, and then the resist-pattern was removed as well, by being soaked in resist-peeling agent (i.e. STRIPPER 104) for two minutes, in order to form the gate-insulating layer 63.

Next, the capacitor-dielectric layer 68 was formed. The aforementioned coating liquid for forming a gate-insulating layer was dripped onto the substrate 61, the gate-electrode 62, the second capacitor-electrode 69, and the gate-insulating layer 63, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 30 nm), which was paraelectric and amorphous. Then, the Sr—La—Zr oxide was coated by photoresist (i.e. TSMR8800-BE), and then prebaked, exposed by an exposure device, and developed, so as to form a resist-pattern having a pattern that corresponded to the capacitor-dielectric layer 68 to be formed.

Next, a part of the Sr—La—Zr oxide that was not covered by the resist-pattern was etched, by being soaked in 0.1 mol/L of hydrochloric acid (Wako 083-01115) for 5 seconds, and then the resist-pattern was removed as well, by being soaked in resist-peeling agent (i.e. STRIPPER 104) for two minutes, in order to form the capacitor-dielectric layer 68.

Next, the source-electrode 64 and the drain-electrode 65 were formed. In the practical example 23, the drain-electrode 65 constitutes a capacitor, together with the capacitor-dielectric layer 68 and the second capacitor-electrode 69.

Specifically, an ITO film, which was a transparent and conductive film, was formed over the gate-insulating layer 63 and the capacitor-dielectric layer 68 by means of a DC sputtering method, so that the average film thickness was approximately 100 nm. Subsequently, the ITO film was coated by photoresist, and then prebaked, exposed by an exposure device, and developed, so as to form a resist-pattern having a pattern that corresponded to the source-electrode 64 and the drain-electrode 65 be formed. Then, a part of the ITO film that was not covered by the resist-pattern was removed by means of RIE. Then, the resist-pattern was removed as well, in order to form the source-electrode 64 and the drain-electrode 65.

Next, the active layer 66 was formed. Specifically, an Mg—In-based oxide film was formed by means of a DC sputtering method, so that the average film thickness was approximately 100 nm. Subsequently, the Mg—In-based oxide film was coated by photoresist, and then prebaked, exposed by an exposure device, and developed, so as to form a resist-pattern having a pattern that corresponds to the active layer 66 to be formed. Then, a part of the Mg—In-based oxide film that was not covered by the resist-pattern was removed by means of RIE. Then, the resist-pattern was removed as well, in order to form the active layer 66. In such a way, the active layer 66 was formed, so that a channel was formed between the source-electrode 64 and the drain-electrode 65.

Lastly, the passivation layer 112 was formed. Specifically, an SiON film was formed by means of a plasma CVD method, so that the average film thickness was approximately 300 nm. Subsequently, the SiON film was coated by photoresist, and then prebaked, exposed by an exposure device, and developed, so as to form a resist-pattern having a pattern that corresponds to the passivation layer 112 to be formed. Then, a part of the SiON film that was not covered by the resist-pattern was removed by means of RIE. Then, the resist-pattern was removed as well, in order to form the passivation layer 112. Through the above steps, the volatile semiconductor memory element 60 was manufactured.

The volatile semiconductor memory element 60 manufactured in the above steps exhibited a quality of low energy consumption.

As described above, usage of the first oxide for the gate-insulating layer and capacitor-dielectric layer and usage of a low-cost patterning process, in which wet-etching is performed on the first oxide, enable producing a high quality volatile semiconductor memory element.

Practical Example 24

In the practical example 24, the volatile semiconductor memory element 70 illustrated in FIG. 10 was manufactured. First, coating liquid for forming a gate-insulating layer was prepared, in order to form the gate-insulating layer 73 on the substrate 71 (8 inches), which contained p-type Si. Specifically, the coating liquid for forming a gate-insulating layer was prepared by mixing 4.0 mL of cyclohexylbenzene, 1.95 mL of lanthanum 2-ethylhexanoate toluene solution (i.e. Wako 122-03371), 0.57 mL of strontium 2-ethylhexanoate toluene solution (i.e. Wako 195-09561), and 0.09 mL of zirconium 2-ethylhexanoate oxide mineral spirit solution (i.e. Wako 269-01116).

Next, the coating liquid for forming a gate-insulating layer was dripped onto the substrate 71, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 10 nm), which was paraelectric and amorphous.

Next, a polycrystalline silicon film was formed by means of a CVD method, and then patterning was performed on the polycrystalline silicon film by means of photolithography, in order to form the gate-electrode 72. Then, utilizing the gate-electrode 72 as a mask, a part of the Sr—La—Zr oxide that was not covered by the gate-electrode 72 was etched, by being soaked in 0.1 mol/L of hydrochloric acid (Wako 083-01115) for 5 seconds, in order to form the gate-insulating layer 73.

Next, SiON was a deposited by means of a CVD method, and then dry-etching was performed on the whole surface, in order to form the gate-sidewall-insulating film 74. Then, utilizing the gate-electrode 72 and the gate-sidewall-insulating film 74 as a self-alignment mask, phosphorus-ion implantation was performed on the substrate 71 for the purpose of ionic diffusion, in order to form the source-region 75 and the drain-region 76.

Next, $SiO_2$ was a deposited by means of a CVD method, and then photolithography was performed for forming the first interlayered insulating film 77 having openings as through-holes. Then, a polycrystalline silicon film was deposited by means of a CVD to bury the through-holes, and the bit-line-electrode 78 was formed by means of photolithography.

Next, $SiO_2$ was a deposited by means of a CVD method, and then photolithography was performed for forming the second interlayered insulating film 79 having an opening as a through-hole on the drain-region 76. Then, a polycrystalline silicon film was formed by means of a CVD, and the second capacitor-electrode 80 was formed by means of photolithography.

Next, the capacitor-dielectric layer 81 was formed. The coating liquid for forming a gate-insulating layer was dripped onto the second interlayered insulating film 79 and the second capacitor-electrode 80, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 30 nm), which was paraelectric and amorphous. Then, the Sr—La—Zr oxide was coated by photoresist (i.e. TSMR8800-BE), and then prebaked, exposed by an exposure device, and developed, so as to form a resist-pattern having a pattern that corresponded to the capacitor-dielectric layer 81 to be formed.

Next, a part of the Sr—La—Zr oxide that was not covered by the resist-pattern was etched, by being soaked in 0.1 mol/L of hydrochloric acid (Wako 083-01115) for 5 seconds, and then the resist-pattern was removed as well, by being soaked in resist-peeling agent (i.e. STRIPPER 104) for two minutes, in order to form the capacitor-dielectric layer 81.

Next, a polycrystalline silicon film was formed by means of a CVD method, and the first capacitor-electrode 82 was formed by means of photolithography. Lastly, the passivation layer 113 was formed. Specifically, a SiON film was formed by means of a plasma CVD method, so that the average film thickness was approximately 300 nm. Subsequently, the SiON film was coated by photoresist, and then prebaked, exposed by an exposure device, and developed, so as to form a resist-pattern having a pattern that corresponded to the passivation layer 113 to be formed. Then, a part of the SiON film that was not covered by the resist-pattern was removed by means of RIE. Then, the resist-pattern was removed as well, in order to form the passivation layer 113. Through the above steps, the volatile semiconductor memory element 70 was manufactured.

The volatile semiconductor memory element 70 manufactured in the above steps exhibited a quality of low energy consumption.

As described above, usage of the first oxide for the gate-insulating layer and capacitor-dielectric layer and usage of a low-cost patterning process, in which wet-etching is performed on the first oxide, enable producing a high quality volatile semiconductor memory element.

Practical Example 25

In the practical example 25, the non-volatile semiconductor memory element 90 illustrated in FIG. 11 was manufactured. First, the gate-electrode 92 was formed on the substrate 91, which was made of alkali-free glass. Specifically, an Mo film was formed on the substrate 91 by means of a DC sputtering method, so that the average film thickness was approximately 30 nm. Subsequently, the Mo film was coated by photoresist, and then prebaked, exposed by an exposure device, and developed, so as to form a resist-pattern having a pattern that corresponded to the gate-electrode 92 to be formed. Then, a part of the Mo film that was not covered by the resist-pattern was removed by means of RIE. Then, the resist-pattern was removed as well, in order to form the gate-electrode 92.

Next, the first gate-insulating layer 93 was formed. First, coating liquid for forming a gate-insulating layer was prepared. Specifically, the coating liquid for forming a gate-insulating layer was prepared by mixing 1.2 mL of cyclohexylbenzene, 1.95 mL of lanthanum 2-ethylhexanoate toluene solution (i.e. Wako 122-03371), 0.57 mL of strontium 2-ethylhexanoate toluene solution (i.e. Wako 195-09561), and 0.09 mL of zirconium 2-ethylhexanoate oxide mineral spirit solution (i.e. Wako 269-01116).

Next, the coating liquid for forming a gate-insulating layer was dripped onto the substrate 91 and the gate-electrode 92, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 135 nm), which was paraelectric and amorphous. Then, the Sr—La—Zr oxide was coated by photoresist (i.e. TSMR8800-BE), and then prebaked, exposed by an exposure device, and developed, so as to form a resist-pattern having a pattern that corresponded to the first gate-insulating layer 93 to be formed.

Next, a part of the Sr—La—Zr oxide that was not covered by the resist-pattern was etched, by being soaked in 0.1 mol/L of hydrochloric acid (Wako 083-01115) for 30 seconds, and then the resist-pattern was removed as well, by being soaked in resist-peeling agent (i.e. STRIPPER 104) for two minutes, in order to form the first gate-insulating layer 93.

Next, the floating gate-electrode 94 was formed. Specifically, an Mo film was formed on the first gate-insulating layer 93 by means of a DC sputtering method, so that the average film thickness was approximately 15 nm. Subsequently, the Mo film was coated by photoresist, and then prebaked, exposed by an exposure device, and developed, so as to form a resist-pattern having a pattern that corresponded to the floating gate-electrode 94 to be formed. Then, a part of the Mo film that was not covered by the resist-pattern was removed by means of RIE. Then, the resist-pattern was removed as well, in order to form the floating gate-electrode 94.

Next, the second gate-insulating layer 95 was formed. Specifically, a $SiO_2$ film was formed on the first gate-insulating layer 93 and the floating gate-electrode 94 by means of a CVD method, so that the average film thickness was approximately 50 nm. Subsequently, the $SiO_2$ film was coated by photoresist, and then prebaked, exposed by an exposure device, and developed, so as to form a resist-pattern having a pattern that corresponded to the second gate-insulating layer 95 to be formed. Then, a part of the $SiO_2$ film that was not covered by the resist-pattern was removed by means of RIE. Then, the resist-pattern was removed as well, in order to form the second gate-insulating layer 95.

Next, the source-electrode 96 and the drain-electrode 97 were formed. Specifically, an ITO film, which was a transparent and conductive film, was formed on the second gate-insulating layer 95 by means of a DC sputtering method, so that the average film thickness was approximately 100 nm. Subsequently, the ITO film was coated by photoresist, and then prebaked, exposed by an exposure device, and developed, so as to form a resist-pattern having a pattern that corresponded to the source-electrode 96 and the drain-electrode 97. Then, a part of the ITO film that was not covered by the resist-pattern was removed by means of RIE. Then, the resist-pattern was removed as well, in order to form the source-electrode 96 and the drain-electrode 97 by the ITO film.

Then, the active layer 98 was formed. Specifically, an Mg—In-based oxide film was formed by means of a DC sputtering method, so that the average film thickness was approximately 100 nm. Subsequently, the Mg—In-based oxide film was coated by photoresist, and then prebaked, exposed by an exposure device, and developed, so as to form a resist-pattern having a pattern that corresponded to the active layer 98 to be formed. Then, a part of the Mg—In-based oxide film that was not covered by the resist-pattern was removed by means of RIE. Then, the resist-pattern was removed as well, in order to form the active layer 98.

In such a way, the active layer 98 was formed, so that a channel was formed between the source-electrode 96 and the drain-electrode 97.

Lastly, the passivation layer 114 was formed. Specifically, a SiON film was formed by means of a plasma CVD method, so that the average film thickness was approximately 300 nm. Subsequently, the SiON film was coated by photoresist, and then prebaked, exposed by an exposure device, and developed, so as to form a resist-pattern having a pattern that corresponded to the passivation layer 114 to be formed. Then, a part of the SiON film that was not covered by the resist-pattern was removed by means of RIE. Then, the resist-pattern was removed as well, in order to form the passivation layer 114. Through the above steps, the non-volatile semiconductor memory element 90 was manufactured.

The non-volatile semiconductor memory element 90 manufactured in the above steps exhibited a quality of low energy consumption.

As described above, usage of the first oxide for the first gate-insulating layer and usage of a low-cost patterning process, in which wet-etching is performed on the first oxide, enable producing a high quality non-volatile semiconductor memory element.

Practical Example 26

In the practical example 26, the non-volatile semiconductor memory element 100 illustrated in FIG. 12 was manufactured. First, thermal oxidation was performed on the surface of the substrate 101, which contains p-type Si, in order to form a $SiO_2$ film with film-thickness of 5 nm, which was ultimately formed into the second gate-insulating layer 104. Then, a polycrystalline silicon film, which was ultimately formed into the floating gate-electrode 105, was formed by means of a CVD method.

Next, coating liquid for forming a gate-insulating layer was prepared, in order to form the first gate-insulating layer 102. Specifically, the coating liquid for forming a gate-insulating layer was prepared by mixing 4.0 mL of cyclohexylbenzene, 1.95 mL of lanthanum 2-ethylhexanoate toluene solution (i.e. Wako 122-03371), 0.57 mL of strontium 2-ethylhexanoate toluene solution (i.e. Wako 195-09561), and 0.09 mL of zirconium 2-ethylhexanoate oxide mineral spirit solution (i.e. Wako 269-01116).

Next, the coating liquid for forming a passivation layer was dripped onto the substrate 101, and then a spin-coating process was performed in predetermined conditions. Then, after a drying process that was performed in the atmosphere of 120° C. for an hour, a burning process was performed in an environment filled with $O_2$ in the temperature of 400° C. for three hours, so as to obtain Sr—La—Zr oxide (with film thickness of 10 nm), which was paraelectric and amorphous.

Next, a polycrystalline silicon film was formed by means of a CVD method, and then patterning was performed on the polycrystalline silicon film by means of photolithography, in order to form the gate-electrode 103. Then, utilizing the gate-electrode 103 as a mask, a part of the Sr—La—Zr oxide that was not covered by the gate-electrode 103 was etched, by being soaked in 0.1 mol/L of hydrochloric acid (Wako 083-01115) for 5 seconds, in order to form the first gate-insulating layer 102. Furthermore, the polycrystalline silicon film and the $SiO_2$ film below the first gate-insulating layer 102 were etched, in order, by dry-etching, in order to form the floating gate-electrode 105 and the second gate-insulating layer 104 (i.e. tunnel-insulating layer).

Next, SiON was a deposited by means of a CVD method, and then dry-etching was performed on the whole surface, in order to form the gate-sidewall-insulating film 106. Then, utilizing the gate-electrode 103 and the gate-sidewall-insulating film 106 as a self-alignment mask, phosphorus-ion implantation was performed on the substrate 101 for the purpose of ionic diffusion, in order to form the source-region 107 and the drain-region 108.

Lastly, the passivation layer 115 was formed. Specifically, a SiON film was formed by means of a plasma CVD method, so that the average film thickness was approximately 300 nm. Subsequently, the SiON film was coated by photoresist, and then prebaked, exposed by an exposure device, and developed, so as to form a resist-pattern having a pattern that corresponded to the passivation layer 115 to be formed. Then, a part of the SiON film that was not covered by the resist-pattern was removed by means of RIE. Then, the resist-pattern was removed as well, in order to form the passivation layer 115. Through the above steps, the non-volatile semiconductor memory element 100 was manufactured.

The non-volatile semiconductor memory element 100 manufactured in the above steps exhibited a quality of low energy consumption.

As described above, usage of the first oxide for the first gate-insulating layer and usage of a low-cost patterning process, in which wet-etching is performed on the first oxide, enable producing a high quality non-volatile semiconductor memory element.

Practical Example 27

<Manufacturing of the FET>
—Preparation of the Coating Liquid for Forming a First Passivation Layer—

The coating liquid for forming a first passivation layer was prepared by mixing 1 mL of toluene, 0.14 mL of HMDS, and 0.37 mL of calcium 2-ethylhexanoate 2-ethylhexanoic acid solution (3 to 8% Ca; Alfa36657; product of Alfa Aesar). Composition of the second oxide formed by use of the coating liquid for forming a first passivation layer is as shown on Table 3.

—Preparation of the Coating Liquid for Forming a Second Passivation Layer—

The coating liquid for forming a second passivation layer was prepared by mixing 1.2 mL of cyclohexylbenzene, 2.17 mL of lanthanum 2-ethylhexanoate toluene solution (i.e. Wako 122-03371), and 0.63 mL of strontium 2-ethylhexanoate toluene solution (i.e. Wako 195-09561). Composition of the first oxide formed by use of the coating liquid for forming a second passivation layer is as shown on Table 3.

TABLE 3

| | OXIDE | PRACTICAL EXAMPLE 27 MOLE PERCENTAGE OF OXIDE mol % | PRACTICAL EXAMPLE 28 MOLE PERCENTAGE OF OXIDE mol % | PRACTICAL EXAMPLE 29 MOLE PERCENTAGE OF OXIDE mol % | PRACTICAL EXAMPLE 30 MOLE PERCENTAGE OF OXIDE mol % |
|---|---|---|---|---|---|
| FIRST OXIDE | $SiO_2$ | 75.3 | 66.8 | 62.0 | 63.2 |
| | $Al_2O_3$ | | | 12.7 | |
| | $B_2O_3$ | | | 11.0 | |
| | MgO | | 20.5 | | 25.8 |
| | CaO | 24.7 | | | |
| | SrO | | | 25.3 | |
| | BaO | | 12.7 | | |
| | TOTAL | 100.0 | 100.0 | 100.0 | 100.0 |
| PARAELECTRIC AMORPHOUS OXIDE | $Sc_2O_3$ | | 65.8 | | |
| | $Y_2O_3$ | | | | |
| | $La_2O_3$ | 80.0 | | | |
| | $Nd_2O_3$ | | | | 41.6 |
| | $Sm_2O_3$ | | | 30.2 | |
| | $Eu_2O_3$ | | | | 36.7 |
| | $Gd_2O_3$ | | | 30.2 | |
| | $Dy_2O_3$ | | | | |
| | $Yb_2O_3$ | | | | |
| | MgO | | 20.1 | | 21.7 |
| | CaO | | 14.1 | | |
| | SrO | 20.0 | | | |
| | BaO | | | 39.6 | |
| | $ZrO_2$ | | | | |
| | $HfO_2$ | | | | |
| | TOTAL | 100.0 | 100.0 | 100.0 | 100.0 |

Then, a bottom-contact/top-gate FET, such as one illustrated in FIG. 16B, was manufactured.

—Formation of the Source-Electrode and the Drain-Electrode—

First, the source-electrode 14 and the drain-electrode 15 were formed on the substrate 11, which was made of glass. Specifically, Al alloy film was formed on the substrate 11, by means of a DC sputtering method, so that the average film thickness was approximately 100 nm. Subsequently, the Al alloy film was coated by photoresist, and then prebaked, exposed by an exposure device, and developed, so as to create a resist-pattern having the same pattern as the source-electrode 14 and the drain-electrode 15 to be formed. Then, a part of the Al film that was not covered by the resist-pattern was removed in an etching process. Then, the resist-pattern was removed as well, in order to obtain the source-electrode 14 and the drain-electrode 15 formed by Al alloy film.

—Formation of the Active Layer—

Next, the active layer 16 was formed. Specifically, Mg—In-based oxide ($In_2MgO_4$) film was formed, by means of a DC sputtering method, so that the average film thickness was approximately 100 nm. Subsequently, the Mg—In-based oxide film was coated by photoresist, and then prebaked, exposed by an exposure device, and developed, so as to create a resist-pattern having the same pattern as the active layer 16 to be formed. Then, a part of the Mg—In-based oxide film that was not covered by the resist-pattern was removed in an etching process. Then, the resist-pattern was removed as well, in order to obtain the active layer 16, so as to form a channel between the source-electrode 14 and the drain-electrode 15.

—Formation of the Gate-Insulating Layer—

Next, the gate-insulating layer 13 was formed over the substrate 11, the source-electrode 14, the drain-electrode 15, and the active layer 16. Specifically, an $Al_2O_3$ film was formed over the substrate 11, the source-electrode 14, the drain-electrode 15, and the active layer 16, by means of a radio-frequency (RF) sputtering method, so that the average film thickness was approximately 300 nm.

—Formation of the Gate-Electrode—

Next, the gate-electrode 12 was formed on the gate-insulating layer 13. Specifically, an Mo film was formed on the gate-insulating layer 13, by means of a DC sputtering method, so that the average film thickness was approximately 100 nm. Subsequently, the Mo film was coated by photoresist, and then prebaked, exposed by an exposure device, and developed, so as to create a resist-pattern having the same pattern as the gate-electrode 12 to be formed. Then, a part of the Mo film that was not covered by the resist-pattern was removed in an etching process. Then, the resist-pattern was removed as well, in order to obtain the gate-electrode 12 formed by the Mo film.

—Formation of the First Passivation Layer 170a—

Next, 0.4 mL of the coating liquid for forming a first passivation layer was dripped onto the gate-insulating layer 13 and the gate-electrode 12, and then a spin-coating process was performed in predetermined conditions: performing rotation in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a second oxide film used as the first passivation layer 170a. Here, the average film thickness of the first passivation layer 170a was approximately 25 nm.

—Formation of the Second Passivation Layer 170b—

Next, 0.6 mL of the coating liquid for forming a second passivation layer was dripped onto the first passivation layer 170a, and then a spin-coating process was performed in predetermined conditions: performing rotation in a speed of 500 rpm for 5 seconds and then in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a first oxide film used as the second passivation layer 170b. Here, the average film-thickness of the second passivation layer 170b was approximately 135 nm.

—Formation of the Mask—

Next, the second passivation layer 170b (i.e. a first oxide film) was coated by photoresist (i.e. TSMR-8800BE), and then prebaked, exposed by an exposure device, and then developed, so as to create a resist-pattern having the same pattern as the second passivation layer 17b to be formed.

—Etching Process for the Second Passivation Layer 170b—

Next, the second passivation layer 170b was soaked in 0.36 wt % hydrochloric acid (i.e. Wako 083-01115) for 20 seconds as an etching process, in order to remove a part of the first oxide film that was not covered by the resist pattern, so as to obtain the second passivation layer 17b.

—Etching Process for the First Passivation Layer 170a—

Next, the first passivation layer 170a was soaked in 2.5 wt % hydrofluoric acid for 15 seconds as an etching process, in order to remove a part of the second oxide film that was not covered by the resist pattern, so as to obtain the first passivation layer 17a.

—Removal of the Mask—

Next, the resist-pattern was removed as well, by being soaked in resist-peeling agent (i.e. STRIPPER 104; product of TOKYO OHKA KOGYO Co., Ltd.) for two minutes.

Practical Example 28

<Manufacturing of the FET>

—Preparation of the Coating Liquid for Forming a First Passivation Layer—

The coating liquid for forming a first passivation layer was prepared by mixing 1 mL of toluene, 0.13 mL of HMDS, 0.32 mL of magnesium 2-ethylhexanoate toluene solution (3% Mg; Strem 12-1260; product of Strem Chemicals Inc.), and 0.40 mL of 2-ethylhexanoic acid barium toluene solution (8% Ba; Wako 021-09471; product of WAKO CHEMICAL, LTD.). Composition of the second oxide formed by use of the coating liquid for forming a first passivation layer is as shown on Table 3.

—Preparation of the Coating Liquid for Forming a Second Passivation Layer—

The coating liquid for forming a second passivation layer was prepared by mixing 1.2 mL of cyclohexylbenzene, 0.54 g of scandium(III)tris(2,2,6,6-tetramethyl-3,5-heptanedionate)hydrate (SIGMA-ALDRICH 517607; product of Sigma-Aldrich Co. LLC), 0.12 mL of magnesium 2-ethylhexanoate toluene solution (i.e. Strem 12-1260), and 0.08 mL of calcium 2-ethylhexanoate 2-ethylhexanoic acid solution (i.e. Alfa36657). Composition of the first oxide formed by use of the coating liquid for forming a second passivation layer is as shown on Table 3.

Next, a bottom-contact/top-gate FET, as described in the practical example 27, was manufactured. However, the layering order of the first passivation layer 17a and the second passivation layer 17b was reversed, compared to the practical example 27.

—Formation of the Source-Electrode and the Drain-Electrode—

First, the source-electrode 14 and the drain-electrode 15 were formed on the substrate 11, which was made of glass. Specifically, an Al alloy film was formed on the substrate 11, by means of a DC sputtering method, so that the average film thickness was approximately 100 nm. Subsequently, the Al alloy film was coated by photoresist, and then prebaked, exposed by an exposure device, and developed, so as to create a resist-pattern having the same pattern as the source-electrode 14 and the drain-electrode 15 to be formed. Then, a part of the Al film that was not covered by the resist-pattern was removed in an etching process. Then, the resist-pattern was removed as well, in order to obtain the source-electrode 14 and the drain-electrode 15 formed by the Al alloy film.

—Formation of the Active Layer—

Next, the active layer 16 was formed. Specifically, an Mg—In-based oxide ($In_2MgO_4$) film was formed, by means of a DC sputtering method, so that the average film thickness was approximately 100 nm. Subsequently, the Mg—In-based oxide film was coated by photoresist, and then prebaked, exposed by an exposure device, and developed, so as to create a resist-pattern having the same pattern as the active layer 16 to be formed. Then, a part of the Mg—In-based oxide film that was not covered by the resist-pattern was removed in an etching process. Then, the resist-pattern was removed as well, in order to obtain the active layer 16, so that a channel was formed between the source-electrode 14 and the drain-electrode 15.

—Formation of the Gate-Insulating Layer—

Next, the gate-insulating layer 13 was formed over the substrate 11, the source-electrode 14, the drain-electrode 15, and the active layer 16. Specifically, an $Al_2O_3$ film was formed over the substrate 11, the source-electrode 14, the drain-electrode 15, and the active layer 16, by means of a RF sputtering method, so that the average film thickness was approximately 300 nm.

—Formation of the Gate-Electrode—

Next, the gate-electrode 12 was formed on the gate-insulating layer 13. Specifically, an Mo film was formed on the gate-insulating layer 13, by means of a DC sputtering method, so that the average film thickness was approximately 100 nm. Subsequently, the Mo film was coated by photoresist, and then prebaked, exposed by an exposure device, and developed, so as to create a resist-pattern having the same pattern as the gate-electrode 12 to be formed. Then, a part of the Mo film that was not covered by the resist-pattern was removed in an etching process. Then, the resist-pattern was removed as well, in order to obtain the gate-electrode 12 formed by the Mo film.

—Formation of the Second Passivation Layer 170b—

Next, 0.6 mL of the coating liquid for forming a second passivation layer was dripped onto the gate-insulating layer 13 and the gate-electrode 12, and then a spin-coating process was performed in predetermined conditions: performing rotation in a speed of 500 rpm for 5 seconds and then in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain the first oxide film used as the second passivation layer 170b. Here, the average film thickness of the second passivation layer 170b was approximately 135 nm.

—Formation of the First Passivation Layer 170a—

Next, 0.4 mL of the coating liquid for forming a first passivation layer was dripped onto the second passivation layer 170b, and then a spin-coating process was performed in predetermined conditions: performing rotation in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a second oxide film used as the first passivation layer 170a. Here, the average film thickness of the first passivation layer 170a is approximately 25 nm.

Next, the first passivation layer 170a (i.e. the first oxide film) was coated by photoresist (i.e. TSMR-8800BE), and then prebaked, exposed by an exposure device, and then developed, so as to create a resist-pattern having the same pattern as the first passivation layer 17a to be formed.

—Etching Process for the First Passivation Layer 170a—

Next, the first passivation layer 170a was soaked in mixed solution containing 19 wt % of ammonium fluoride and 18 wt % of ammonium hydrogen fluoride for 15 seconds as an etching process, in order to remove a part of the second oxide film that was not covered by the resist pattern, so as to obtain the first passivation layer 17a.

—Etching Process for the Second Passivation Layer 170b—

Next, the second passivation layer 170b was soaked in 5 wt % oxalic acid heated to 30° C. for four minutes as an etching process, in order to remove a part of the first oxide film that was not covered by the resist pattern, so as to obtain the second passivation layer 17b.

—Removal of the Mask—

Next, the resist-pattern was removed as well, by being soaked in resist-peeling agent (i.e. STRIPPER 104) for two minutes.

Practical Example 29

<Manufacturing of the FET>

—Preparation of the Coating Liquid for Forming a First Passivation Layer—

The coating liquid for forming a first passivation layer was prepared by mixing 1 mL of toluene, 0.11 mL of HMDS, 0.13 mL of aluminum di(s-butoxide)acetoacetic ester chelate (8.4% Al; Alfa89349; product of Alfa Aesar), and 2.02 mL of strontium 2-ethylhexanoate toluene solution (i.e. Wako 195-09561). Composition of the second oxide formed by use of the coating liquid for forming a first passivation layer is as shown on Table 3.

—Preparation of the Coating Liquid for Forming a Second Passivation Layer—

The coating liquid for forming a second-passivation layer was prepared by mixing 1.2 mL of cyclohexylbenzene, 0.19 g of samarium acetylacetonate trihydrate (Strem 93-6226; product of Strem Chemicals, Inc.), 0.27 mL of gadolinium 2-ethylhexanoate toluene solution (25% Gd; Strem 64-3500; product of Strem Chemicals, Inc.), and 0.49 mL of 2-ethylhexanoic acid barium toluene solution (i.e. Wako 021-09471). Composition of the first oxide formed by use of the coating liquid for forming a second passivation layer is as shown on Table 3.

Then, a bottom-contact/top-gate FET, as illustrated in FIG. 16B, was manufactured. The source-electrode 14, the drain-electrode 15, the active layer 16, the gate-insulating layer 13, and the gate-electrode 12 were formed in the same method as in the practical example 27.

—Formation of the First Passivation Layer 170*a*—

Then, 0.4 mL of the coating liquid for forming a first passivation layer was dripped onto the gate-insulating layer 13 and the gate-electrode 12, and then a spin-coating process was performed in predetermined conditions: performing rotation in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain the second oxide film used as the first passivation layer 170*a*. Here, the average film thickness of the first passivation layer 170*a* was approximately 25 nm.

—Formation of the Second Passivation Layer 170*b*—

Then, 0.6 mL of the coating liquid for forming a second passivation layer was dripped onto the first passivation layer 170*a*, and then a spin-coating process was performed in predetermined conditions: performing rotation in a speed of 500 rpm for 5 seconds and then in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain the first oxide film used as the second passivation layer 170*b*. Here, the average film thickness of the second passivation layer 170*b* was approximately 135 nm.

—Formation of the Mask—

Then, the second passivation layer 170*b* (i.e. the first oxide film) was coated by photoresist (i.e. TSMR-8800BE), and then prebaked, exposed by an exposure device, and developed, so as to create a resist-pattern having the same pattern as the second passivation layer 17*b* to be formed.

—Etching Process for the Second Passivation Layer 170*b*—

Then, the second passivation layer 170*b* is soaked in mixed solution containing 57.9 wt % of phosphoric acid and 21.1 wt % of nitric acid for 30 seconds as an etching process, in order to remove a part of the first oxide film that was not covered by the resist pattern, so as to obtain the second passivation layer 17*b*.

—Etching Process for the First Passivation Layer 170*a*—

Then, the first passivation layer 170*a* was soaked in 4 wt % tetramethylammonium hydroxide (TMAH) for one minute as an etching process, in order to remove a part of the second oxide that was not covered by the resist pattern, so as to obtain the first passivation layer 17*a*.

—Removal of the Mask—

Then, the resist-pattern was removed as well, by being soaked in resist-peeling agent (i.e. STRIPPER 104) for two minutes.

Practical Example 30

<Manufacturing of the FET>

—Preparation of the Coating Liquid for Forming a First Passivation Layer—

The coating liquid for forming a first passivation layer was prepared by mixing 1 mL of toluene, 0.11 mL of HMDS, 0.08 g of (4,4,5,5-tetramethyl-1,3,2-dioxaborolan-2-yl)benzene (Wako 325-59912; product of WAKO CHEMICAL, LTD.), and 0.37 mL of magnesium 2-ethylhexanoate toluene solution (i.e. Strem 12-1260). Composition of the second oxide formed by use of the coating liquid for forming a first passivation layer is as shown on Table 3.

—Preparation of the Coating Liquid for Forming a Second Passivation Layer—

The coating liquid for forming a second passivation layer was prepared by mixing 1.2 mL of cyclohexylbenzene, 0.57 mL of neodymium 2-ethylhexanoate 2-ethylhexanoic acid solution (12% Nd; Strem 60-2400; product of Strem Chemicals Inc.), 0.28 g of europium 2-ethylhexanoate (Strem 93-6311; product of Strem Chemicals Inc.), and 0.12 mL of magnesium 2-ethylhexanoate toluene solution (i.e. Strem 12-1260). Composition of the first oxide formed by use of the coating liquid for forming a second passivation layer is as shown on Table 3.

Then, a bottom-contact/top-gate FET, as described in the practical example 28, was manufactured. However, the layering order of the first passivation layer 17*a* and the second passivation layer 17*b* was reversed, compared to the practical example 27.

—Formation of the Second Passivation Layer 170*b*—

Then, 0.6 mL of the coating liquid for forming a second passivation layer is dripped onto the gate-insulating layer 13 and the gate-electrode 12, and then a spin-coating process was performed in predetermined conditions: performing rotation in a speed of 500 rpm for 5 seconds and then in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a first oxide film used as the second passivation layer 170*b*. Here, the average film thickness of the second passivation layer 170*b* was approximately 135 nm.

—Formation of the First Passivation Layer 170*a*—

Then, 0.4 mL of the coating liquid for forming a first passivation layer was dripped onto the second passivation layer 170*b*, and then a spin-coating process was performed in predetermined conditions: performing rotation in a speed of 3,000 rpm for 20 seconds, and then taking 5 seconds to decrease the speed down to 0 rpm and stop the rotation. Then, after a drying process that was performed in the atmosphere of 120° C. for an hour, burning process was performed in an environment filled with $O_2$ in the temperature of 400° C. for three hours, in order to obtain a second oxide film used as the first passivation layer 170*a*. Here, the average film thickness of the first passivation layer 170*a* was approximately 25 nm.

—Formation of the Mask—

Then, the first passivation layer 170*a* (i.e. a first oxide film) was coated by photoresist (i.e. TSMR-8800BE), and then prebaked, exposed by an exposure device, and developed, so as to create a resist-pattern having the same pattern as the first passivation layer 17*a* to be formed.

—Etching Process for the First Passivation Layer—

Then, the first passivation layer 170*a* was soaked in mixed solution containing 14 wt % of ammonium fluoride and 12 wt % of ammonium hydrogen fluoride for 15 seconds as an etching process, in order to remove a part of the second oxide film that was not covered by the resist pattern, so as to obtain the first passivation layer 17*a*.

—Etching Process for the Second Passivation Layer—

Then, the second passivation layer 170*b* was soaked in 6 wt % hydrogen peroxide water for two minutes as an etching process, in order to remove a part of the first oxide film that was not covered by the resist pattern, so as to obtain the second passivation layer 17*b*.

—Removal of the Mask—

Then, the resist-pattern was removed as well, by being soaked in resist-peeling agent (i.e. STRIPPER 104) for two minutes.

Practical Example 31

<Manufacturing of the FET>

—Preparation of the Coating Liquid for Forming a First Passivation Layer—

The coating liquid for forming a first passivation layer was prepared by mixing 1 mL of toluene, 0.17 mL of HMDS, 0.47 mL of strontium 2-ethylhexanoate toluene solution (i.e. Wako 195-09561), and 0.21 mL of 2-ethylhexanoic acid barium toluene solution (i.e. Wako 021-09471). Composition of the second oxide formed by use of the coating liquid for forming a first passivation layer is as shown on Table 4.

—Preparation of the Coating Liquid for Forming a Second Passivation Layer—

The coating liquid for forming a second passivation layer prepared by mixing 1.2 mL of cyclohexylbenzene, 0.16 g of scandium(III)tris(2,2,6,6-tetramethyl-3,5-heptanedionate) hydrate (i.e. SIGMA-ALDRICH 517607), 1.46 mL of lanthanum 2-ethylhexanoate toluene solution (i.e. Wako 122-03371), 0.03 mL of calcium 2-ethylhexanoate 2-ethylhexanoic acid solution (i.e. Alfa36657), 0.34 mL of strontium 2-ethylhexanoate toluene solution (i.e. Wako 195-09561), and 0.07 mL of zirconium 2-ethylhexanoate oxide mineral spirit solution (i.e. Wako 269-01116). Composition of the first oxide formed by use of the coating liquid for forming a second passivation layer is as shown on Table 4.

Then, a bottom-contact/top-gate FET, as illustrated in FIG. 16B, was manufactured. The source-electrode 14, the drain-electrode 15, the active layer 16, the gate-insulating layer 13, and the gate-electrode 12 were formed in the same method as in the practical example 27.

—Formation of the First Passivation Layer 170a—

Then, 0.4 mL of the coating liquid for forming a first passivation layer was dripped onto the gate-insulating layer 13 and the gate-electrode 12, and then a spin-coating process was performed in predetermined conditions: performing rotation in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a second oxide film used as the first passivation layer 170a. Here, the average film thickness of the first passivation layer 170a was approximately 25 nm.

—Formation of the Second Passivation Layer 170b—

Then, 0.6 mL of the coating liquid for forming a second passivation layer was dripped onto the first passivation layer 170a, and then a spin-coating process was performed in predetermined conditions: performing rotation in a speed of 500 rpm for 5 seconds and then in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a first oxide film used as the second passivation layer 170b. Here, the average film thickness of the second passivation layer 170b was approximately 135 nm.

TABLE 4

| | OXIDE | PRACTICAL EXAMPLE 31 MOLE PERCENTAGE OF OXIDE mol % | PRACTICAL EXAMPLE 32 MOLE PERCENTAGE OF OXIDE mol % | PRACTICAL EXAMPLE 33 MOLE PERCENTAGE OF OXIDE mol % | PRACTICAL EXAMPLE 34 MOLE PERCENTAGE OF OXIDE mol % |
|---|---|---|---|---|---|
| FIRST OXIDE | $SiO_2$ | 88.2 | 79.1 | 55.9 | 67.5 |
| | $Al_2O_3$ | | | 18.2 | 10.7 |
| | $B_2O_3$ | | | | 11.8 |
| | MgO | | | | |
| | CaO | | 20.9 | | 7.4 |
| | SrO | 5.2 | | | 2.6 |
| | BaO | 6.6 | | 25.9 | |
| | TOTAL | 100.0 | 100.0 | 100.0 | 100.0 |
| PARAELECTRIC AMORPHOUS OXIDE | $Sc_2O_3$ | 20.3 | | | |
| | $Y_2O_3$ | | | 75.3 | |
| | $La_2O_3$ | 51.2 | | | 66.6 |
| | $Nd_2O_3$ | | | | |
| | $Sm_2O_3$ | | | | |
| | $Eu_2O_3$ | | | | |
| | $Gd_2O_3$ | | | | |
| | $Dy_2O_3$ | | 20.5 | | |
| | $Yb_2O_3$ | | 40.9 | | |
| | MgO | | 20.3 | | |
| | CaO | 5.5 | | 10.3 | |
| | SrO | 10.2 | | | 16.7 |
| | BaO | | | | |
| | $ZrO_2$ | 12.8 | | | 16.7 |
| | $HfO_2$ | | 18.3 | 14.4 | |
| | TOTAL | 100.0 | 100.0 | 100.0 | 100.0 |

—Formation of the Mask—

Then, the second passivation layer 170b (i.e. a first oxide film) was coated by photoresist (i.e. TSMR-8800BE), and then prebaked, exposed by an exposure device, and developed, so as to create a resist-pattern having the same pattern as the second passivation layer 17b to be formed.

—Etching Process for the Second Passivation Layer 170b—

Then, the second passivation layer 170b was soaked in 0.36 wt % hydrochloric acid for 20 seconds as an etching process, in order to remove a part of the first oxide film that was not covered by the resist pattern, so as to obtain the second passivation layer 17b.

—Etching Process for the First Passivation Layer 170a—

Then, the first passivation layer 170a was soaked in mixed solution containing 14 wt % of ammonium fluoride and 3.2 wt % of ammonium hydrogen fluoride for one minute as an etching process, in order to remove a part of the second oxide film that was not covered by the resist pattern, so as to obtain the first passivation layer 17a.

—Removal of the Mask—

Then, the resist-pattern was removed as well, by being soaked in resist-peeling agent (i.e. STRIPPER 104) for two minutes.

Practical Example 32

<Manufacturing of the FET>

—Preparation of the Coating Liquid For Forming a First Passivation Layer—

The coating liquid for forming a first passivation layer was prepared by mixing 1 mL of toluene, 0.15 mL of HMDS, and 0.31 mL of calcium 2-ethylhexanoate 2-ethylhexanoic acid solution (i.e. Alfa36657). Composition of the second oxide formed by use of the coating liquid for forming a first passivation layer is as shown on Table 4.

—Preparation of the Coating Liquid for Forming a Second Passivation Layer—

The coating liquid for forming a second passivation layer was prepared by mixing 1.2 mL of cyclohexylbenzene, 0.13 g of dysprosium acetylacetonate trihydrate (Strem 66-2002; product of Strem Chemicals Inc.), 0.27 g of ytterbium acetylacetonate trihydrate (Strem 70-2202; product of Strem Chemicals Inc.), 0.12 mL of magnesium 2-ethylhexanoate toluene solution (i.e. Strem 12-1260), and 0.10 mL of hafnium 2-ethylhexanoate 2-ethylhexanoic acid solution (Gelest AKH332; product of Gelest, Inc.). Composition of the first oxide formed by use of the coating liquid for forming a second passivation layer is as shown on Table 4.

Then, a bottom-contact/top-gate FET, as illustrated in FIG. 16B, was manufactured. The source-electrode 14, the drain-electrode 15, the active layer 16, the gate-insulating layer 13, and the gate-electrode 12 were formed in the same method as in the practical example 27.

—Formation of the First Passivation Layer 170a—

Then, 0.4 mL of the coating liquid for forming a first passivation layer was dripped onto the gate-insulating layer 13 and the gate-electrode 12, and then a spin-coating process was performed in predetermined conditions: performing rotation in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a second oxide film used as the first passivation layer 170a. Here, the average film thickness of the first passivation layer 170a was approximately 25 nm.

—Formation of the Second Passivation Layer 170b—

Then, 0.6 mL of the coating liquid for forming a second passivation layer was dripped onto the first passivation layer 170a, and then a spin-coating process was performed in predetermined conditions: performing rotation in a speed of 500 rpm for 5 seconds and then in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a first oxide film used as the second passivation layer 170b. Here, the average film thickness of the second passivation layer 170b was approximately 135 nm.

—Formation of the Mask—

Then, the second passivation layer 170b (i.e. a first oxide film) was coated by photoresist (i.e. TSMR-8800BE), and then prebaked, exposed by an exposure device, and developed, so as to create a resist-pattern having the same pattern as the second passivation layer 17b to be formed.

—Etching Process for the Second Passivation Layer 170b—

Then, the second passivation layer 170b was soaked in mixed solution containing 55 wt % of phosphoric acid, 30 wt % of acetic acid, and 5 wt % of nitric acid for 30 seconds as an etching process, in order to remove a part of the first oxide film that was not covered by the resist pattern, so as to obtain the second passivation layer 17b.

—Etching Process for the First Passivation Layer 170a—

Then, the first passivation layer 170a was soaked in 6 wt % TMAH for one minute as an etching process, in order to remove a part of the second oxide film that was not covered by the resist pattern, so as to obtain the first passivation layer 17a.

—Removal of the Mask—

Then, the resist-pattern was removed as well, by being soaked in resist-peeling agent (i.e. STRIPPER 104) for two minutes.

Practical Example 33

<Manufacturing of the FET>

—Preparation of the Coating Liquid for Forming a First Passivation Layer—

The coating liquid for forming a first passivation layer was prepared by mixing 1 mL of toluene, 0.09 mL of HMDS, 0.18 mL of aluminum di(s-butoxide)acetoacetic ester chelate (i.e. Alfa89349), and 0.69 mL of 2-ethylhexanoic acid barium toluene solution (i.e. Wako 021-09471). Composition of the second oxides formed by use of the coating liquid for forming a first passivation layer is as shown on Table 4.

—Preparation of the Coating Liquid for Forming a Second Passivation Layer—

The coating liquid for forming a second passivation layer was prepared by mixing 1.2 mL of cyclohexylbenzene, 0.51 g of yttrium 2-ethylhexanoate (Strem 39-2400; product of Strem Chemicals Inc.), 0.06 mL of magnesium 2-ethylhexanoate toluene solution (i.e. Strem 12-1260), and 0.07 mL of hafnium 2-ethylhexanoate 2-ethylhexanoic acid solution (i.e. Gelest AKH332). Composition of the first oxide formed by use of the coating liquid for forming a second passivation layer was as shown on Table 4.

Then, a bottom-contact/top-gate FET, as described in the practical example 28, was manufactured. However, the layering order of the first passivation layer 17a and the second passivation layer 17b was reversed, compared to the practical example 27.

—Formation of the Second Passivation Layer 170b—

Then, 0.6 mL of the coating liquid for forming a second passivation layer was dripped onto the gate-insulating layer 13 and the gate-electrode 12, and then a spin-coating process was performed in predetermined conditions: performing rotation in a speed of 500 rpm for 5 seconds and then in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a first oxide film used as the second passivation layer 170b. Here, the average film thickness of the second passivation layer 170b was approximately 135 nm.

—Formation of the First Passivation Layer 170a—

Then, 0.4 mL of the coating liquid for forming a first passivation layer was dripped onto the second passivation layer 170b, and then a spin-coating process was performed in predetermined conditions: performing rotation in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a second oxide film used as the first passivation layer 170a. Here, the average film thickness of the first passivation layer 170a was approximately 25 nm.

—Formation of the Mask—

Then, the first passivation layer 170a (i.e. a first oxide film) was coated by photoresist (i.e. TSMR-8800BE), and then prebaked, exposed by an exposure device, and developed, so as to create a resist-pattern having the same pattern as the first passivation layer 17a to be formed.

—Etching Process for the First Passivation Layer 170a—

Then, the first passivation layer 170a was soaked in 5 wt % hydrofluoric acid for 15 seconds as an etching process, in order to remove a part of the second oxide film that was not covered by the resist pattern, so as to obtain the first passivation layer 17a.

—Etching Process for the Second Passivation Layer 170b—

Then, the second passivation layer 170b was soaked in mixed solution containing 80 wt % of phosphoric acid, 10 wt % of acetic acid, and 5 wt % of nitric acid for 30 seconds as an etching process, in order to remove a part of the first oxide film that was not covered by the resist pattern, so as to obtain the second passivation layer 17b.

—Removal of the Mask—

Then, the resist-pattern was removed as well, by being soaked in resist-peeling agent (i.e. STRIPPER 104) for two minutes.

Practical Example 34

<Manufacturing of the FET>

—Preparation of the Coating Liquid for Forming a First Passivation Layer—

The coating liquid for forming a first passivation layer was prepared by mixing 1 mL of toluene, 0.11 mL of HMDS, 0.10 mL of aluminum di(s-butoxide)acetoacetic ester chelate (i.e. Alfa89349), 0.07 g of (4,4,5,5-tetramethyl-1,3,2-dioxaborolan-2-yl)benzene (i.e. Wako 325-59912), 0.09 mL of calcium 2-ethylhexanoate 2-ethylhexanoic acid solution (i.e. Alfa36657), and 0.19 mL of strontium 2-ethylhexanoate toluene solution (i.e. Wako 195-09561). Composition of the second oxides formed by use of the coating liquid for forming a first passivation layer is as shown on Table 4.

—Preparation of the Coating Liquid for Forming a Second Passivation Layer—

The coating liquid for forming a second passivation layer was prepared by mixing 1.2 mL of cyclohexylbenzene, 1.95 mL of lanthanum 2-ethylhexanoate toluene solution (i.e. Wako 122-03371), 0.57 mL of strontium 2-ethylhexanoate toluene solution (i.e. Wako 195-09561), and 0.09 mL of zirconium 2-ethylhexanoate oxide mineral spirit solution (i.e. Wako 269-01116). Composition of the first oxide formed by use of the coating liquid for forming a second passivation layer is as shown on Table 4.

Then, a bottom-contact/top-gate FET, as illustrated in FIG. 16B, was manufactured. The source-electrode 14, the drain-electrode 15, the active layer 16, the gate-insulating layer 13, and the gate-electrode 12 were formed in the same method as in the practical example 27.

—Formation of the First Passivation Layer 170a—

Then, 0.4 mL of the coating liquid for forming a first passivation layer was dripped onto the gate-insulating layer 13 and the gate-electrode 12, and then a spin-coating process was performed in predetermined conditions: performing rotation in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a second oxide film used as the first passivation layer 170a. Here, the average film thickness of the first passivation layer 170a was approximately 25 nm.

—Formation of the Second Passivation Layer 170b—

Then, 0.6 mL of the coating liquid for forming a second passivation layer was dripped onto the first passivation layer 170a, and then a spin-coating process was performed in predetermined conditions: performing rotation in a speed of 500 rpm for 5 seconds and then in a speed of 3,000 rpm for 20 seconds, and then taking 5 seconds to decrease the speed down to 0 rpm and stop the rotation. Then, after a drying process that was performed in the atmosphere of 120° C. for an hour, a burning process was performed in an environment filled with $O_2$ in the temperature of 400° C. for three hours, in order to obtain a first oxide film used as the second passivation layer 170b. Here, the average film thickness of the second passivation layer 170b was approximately 135 nm.

—Formation of the Mask—

Then, the second passivation layer 170b (i.e. a first oxide film) was coated by photoresist (i.e. TSMR-8800BE), and then prebaked, exposed by an exposure device, and developed, so as to create a resist-pattern having the same pattern as the second passivation layer 17b to be formed.

—Etching Process for the Second Passivation Layer 170b—

Then, the second passivation layer 170b was soaked in 0.36 wt % hydrochloric acid (i.e. Wako 083-01115) for 20 seconds as an etching process, in order to remove a part of the first oxide film that was not covered by the resist pattern, so as to obtain the second passivation layer 17b.

—Etching Process for the First Passivation Layer 170a—

Then, the first passivation layer 170a was soaked in mixed solution containing 14 wt % of ammonium fluoride and 12 wt % of ammonium hydrogen fluoride for 15 seconds as an etching process, in order to remove a part of the second oxide film that was not covered by the resist pattern, so as to obtain the first passivation layer 17a.

—Removal of the Mask—

Then, the resist-pattern was removed as well, by being soaked in resist-peeling agent (i.e. STRIPPER 104) for two minutes.

(Evaluation of a Transistor-Property)

Evaluation of a transistor-property was performed with respect to each of the FETs manufactured in practical examples 27 through 34. Evaluation of a transistor-property according to each of practical examples 27 through 34 was based on measurement of a relation (Vgs-Ids) of voltage (Vgs) between the source-electrode 14 and the drain-electrode 15 and current (Ids) between the source-electrode 14 and the drain-electrode 15, provided that the voltage (Vds) between the source-electrode 14 and the drain-electrode 15 was +10 V.

Furthermore, field-effect mobility in the saturation region was calculated, based on the evaluation result of a transistor-property (Vgs-Ids). Further, a ratio (i.e. ON/OFF ratio) of Ids in "ON" state (e.g. Vgs=+10 V) of a transistor to Ids in "OFF" state (e.g. Vgs=−10 V) of the transistor was calculated. Further, S-value was calculated, as an indicator for rise-sharpness of Ids in response to application of Vgs. Further, a threshold-voltage (Vth), which is a value of voltage corresponding to rise of Ids in response to application of Vgs, was calculated.

Mobility, ON/OFF ratio, S-value, and Vth, which were calculated from the transistor-properties of the FETs manufactured in the practical examples 27 through 34, are shown in Table 5. In the following description, with regard to results of transistor-properties, preferable transistor-properties are: high mobility; high ON/OFF ratio; low S-value; and Vts in proximity of 0 V. Specifically, preferable transistor-properties are: mobility of 3 cm$^2$/Vs or more; ON/OFF ratio of 1.0×10$^8$ or more; S-value of 0.7 or less; and Vth in a range of ±5 V.

As shown in FIG. 5, it is confirmed that the FETs manufactured in the practical examples 27 through 34 have preferable transistor-properties, having high mobility, high ON/OFF ratio, low S-value, and Vts in proximity of 0 V.

TABLE 5

| | TFT CHARACTERISTICS | | | |
|---|---|---|---|---|
| | MOBILITY [cm$^2$/Vs] | ON/OFF RATIO [×10$^8$] | S-VALUE [V/decade] | Vth [V] |
| PRACTICAL EXAMPLE 27 | 5.3 | 5.9 | 0.34 | 4.4 |
| PRACTICAL EXAMPLE 28 | 6.0 | 6.3 | 0.38 | 3.2 |
| PRACTICAL EXAMPLE 29 | 5.8 | 5.5 | 0.31 | 3.5 |
| PRACTICAL EXAMPLE 30 | 6.5 | 6.8 | 0.35 | 3.8 |
| PRACTICAL EXAMPLE 31 | 7.2 | 8.0 | 0.38 | 2.9 |
| PRACTICAL EXAMPLE 32 | 7.0 | 7.9 | 0.28 | 4.2 |
| PRACTICAL EXAMPLE 33 | 7.5 | 8.3 | 0.25 | 3.8 |
| PRACTICAL EXAMPLE 34 | 7.8 | 8.8 | 0.22 | 3.3 |

(Evaluation of a Transistor-Property)

With respect to each of the FETs manufactured in practical examples 27 through 34, 100-hours-long BTS test was executed, in the atmosphere (temperature: 50° C.; relative humidity: 50%).

The following four conditions were provided as stress-conditions:
(1) Vgs=+10 V, and Vds=0 V
(2) Vgs=+10 V, and Vds=+10 V
(3) Vgs=−10 V, and Vds=0 V
(4) Vgs=−10 V, and Vds=+10 V.

Furthermore, every time a predetermined amount of time passes in the BTS test, the relation (Vgs-Ids) of Vgs and Ids under condition of Vds=+10 V, was measured.

Figure 32:
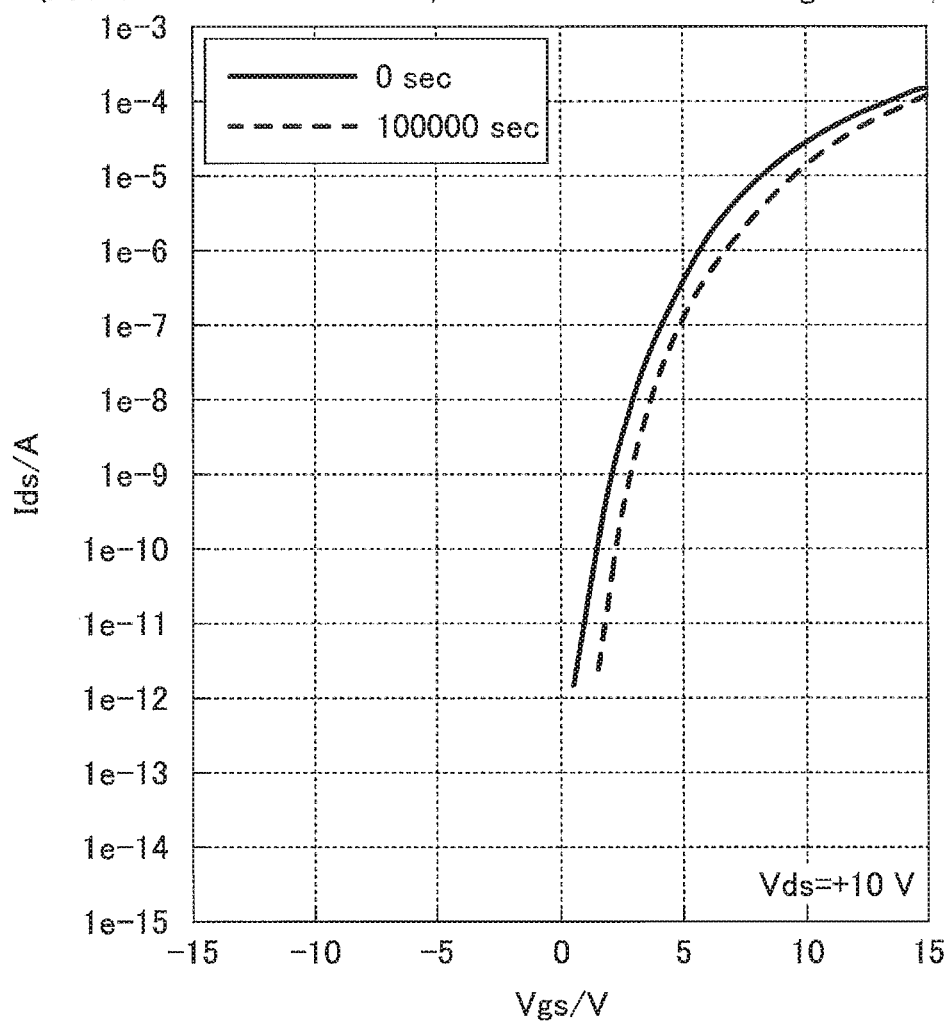
FIG. 32 is a drawing illustrating a change with respect to Vgs-Ids property before and after a bias temperature stress (BTS) test.

With respect to the FET manufactured in the practical example 34, the result of Vgs-Ids in the BTS test under a stress-condition of Vgs=+10 V and Vds=0 V is illustrated in FIG. 32. Furthermore, with respect to the FET manufactured in the practical example 34, shift (ΔVth) of threshold-voltage in relation with stressing-time under the stress-condition of Vgs=+10 V and Vds=0 V is illustrated in FIG. 33.

Furthermore, with respect to the FETs manufactured in the practical examples 27 through 34, values of ΔVth under stressing-time of 100 hours in the BTS test are shown in Table 6. Here, ΔVth is shift of Vth from stressing-time of 0 to an arbitrary time.

Figure 33:
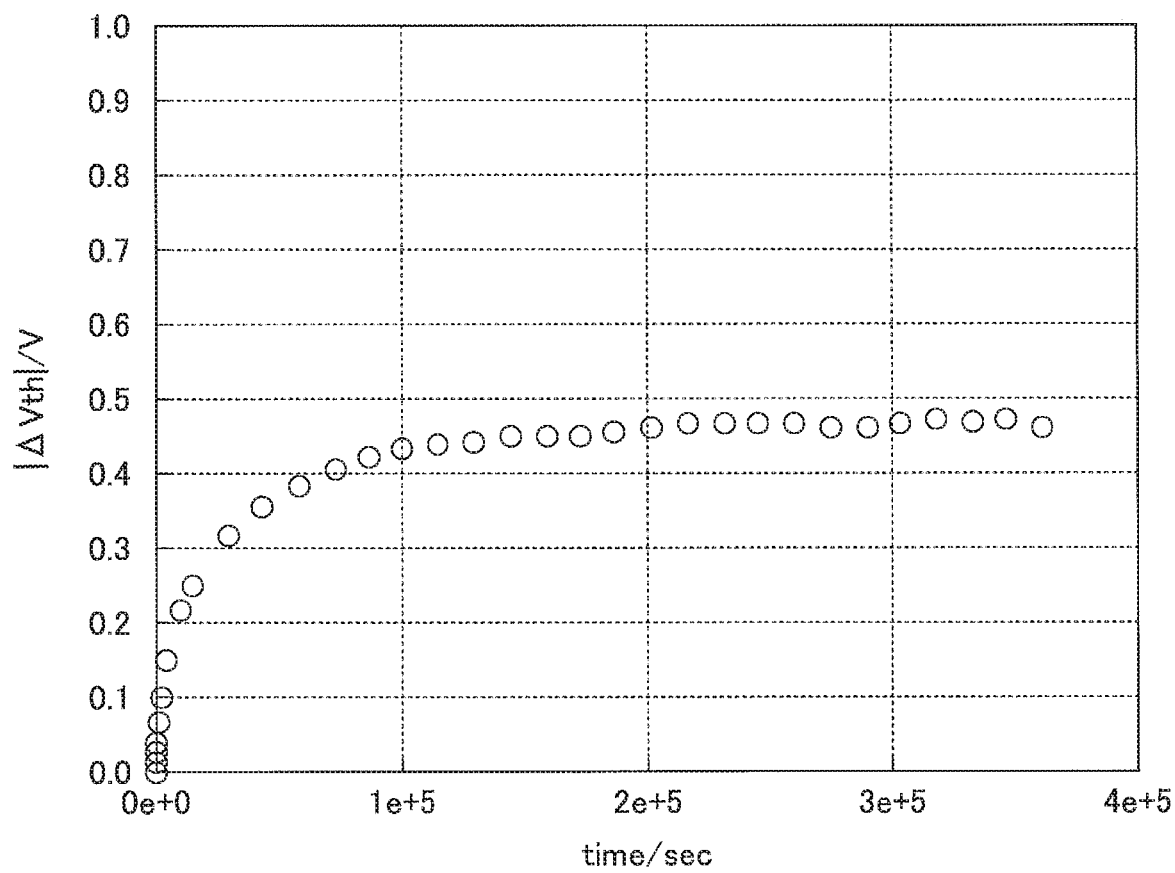
FIG. 33 is a drawing illustrating shift ($\Delta$Vth) of threshold-voltage in relation with stressing-time.

According to FIGS. 32 and 33, as well as Table 6, the FET manufactured in the practical example 34 is preferably reliable with respect to the BTS test, having small ΔVth shift. According to Table 6, the FETs manufactured in the practical examples 27 through 33 are preferably reliable with respect to the BTS test, having small ΔVth shifts.

TABLE 6

| | AFTER APPLICATION OF STRESS FOR 100 HOURS | | | |
|---|---|---|---|---|
| | STRESS CONDITION Vgs = +10 V Vds = 0 V Δ Vth [V] | STRESS CONDITION Vgs = +10 V Vds = +10 V Δ Vth [V] | STRESS CONDITION Vgs = −10 V Vds = 0 V Δ Vth [V] | STRESS CONDITION Vgs = −10 V Vds = +10 V Δ Vth [V] |
| PRACTICAL EXAMPLE 27 | +0.78 | +0.80 | −0.75 | −0.68 |
| PRACTICAL EXAMPLE 28 | +0.75 | +0.66 | −0.89 | −0.74 |
| PRACTICAL EXAMPLE 29 | +0.68 | +0.59 | −0.64 | −0.73 |
| PRACTICAL EXAMPLE 30 | +0.62 | +0.55 | −0.72 | −0.64 |
| PRACTICAL EXAMPLE 31 | +0.58 | +0.50 | −0.49 | −0.56 |
| PRACTICAL EXAMPLE 32 | +0.55 | +0.59 | −0.60 | −0.66 |
| PRACTICAL EXAMPLE 33 | +0.50 | +0.48 | −0.55 | −0.44 |
| PRACTICAL EXAMPLE 34 | +0.46 | +0.41 | −0.56 | −0.52 |

Further, the present invention is not limited to these embodiments, but various variations and modifications may be made without departing from the scope of the present invention.

What is claimed is:

1. A method for manufacturing a field effect transistor including a gate-insulating layer, an active layer, and a passivation layer, the method comprising:
   a first process of forming the gate-insulating layer; and
   a second process of forming the passivation layer,
   wherein at least one of the first process and the second process includes:
      forming a first oxide containing an alkaline earth metal and at least one of gallium, scandium, yttrium, and a lanthanoid; and
      etching the first oxide by use of a first solution containing at least one of hydrochloric acid, oxalic acid, nitric acid, phosphoric acid, acetic acid, sulfuric acid, and hydrogen peroxide water,
   wherein the passivation layer includes a first passivation layer and a second passivation layer, and
   wherein the second process includes:
      forming the first passivation layer containing a second oxide, the second oxide containing silicon and an alkaline earth metal;
      forming the second passivation layer containing the first oxide, the second passivation layer being arranged in contact with the first passivation layer;
      bringing the first passivation layer into contact with a second solution containing at least one of hydrofluoric acid, ammonium fluoride, ammonium hydrogen fluoride, and organic alkali, in order to etch the first passivation layer; and
      bringing the second passivation layer into contact with the first solution in order to etch the second passivation layer.

2. The method for manufacturing the field effect transistor according to claim 1, wherein the second process includes:
   forming the first passivation layer on the second passivation layer;
   forming a mask on the first passivation layer;
   after forming the mask, bringing the first passivation layer into contact with the second solution, in order to etch the first passivation layer;
   after etching the first passivation layer, bringing the second passivation layer into contact with the first solution, in order to etch the second passivation layer; and
   removing the mask.

3. The method for manufacturing the field effect transistor according to claim 1, wherein the second process includes:
   forming the second passivation layer on the first passivation layer;
   forming a mask on the second passivation layer;
   after forming the mask, bringing the second passivation layer into contact with the first solution, in order to etch the second passivation layer;
   after etching the second passivation layer, bringing the first passivation layer into contact with the second solution, in order to etch the first passivation layer; and
   removing the mask.

4. The method for manufacturing the field effect transistor according to claim 1, wherein the gate-insulating layer includes a first gate-insulating layer and a second gate-insulating layer, and
   wherein the first process includes:
      forming the first gate-insulating layer containing the second oxide, the second oxide containing silicon and an alkaline earth metal;
      forming the second gate-insulating layer containing the first oxide, the second gate-insulating layer being arranged in contact with the first gate-insulating layer;
      bringing the first gate-insulating layer into contact with the second solution containing at least one of hydrofluoric acid, ammonium fluoride, ammonium hydrogen fluoride, and organic alkali, in order to etch the first gate-insulating layer; and
      bringing the second gate-insulating layer into contact with the first solution in order to etch the second gate-insulating layer.

5. The method for manufacturing the field effect transistor according to claim 4, wherein the first process includes:
   forming the first gate-insulating layer on the second gate-insulating layer;
   forming a mask on the first gate-insulating layer; after forming the mask, bringing the first gate-insulating layer into contact with the second solution, in order to etch the first gate-insulating layer;
   after etching the first gate-insulating layer, bringing the second gate-insulating layer into contact with the first solution, in order to etch the second gate-insulating layer; and
   removing the mask.

6. The method for manufacturing the field effect transistor according to claim 4, wherein the first process includes:
   forming the second gate-insulating layer on the first gate-insulating layer;
   forming a mask on the second gate-insulating layer;
   after forming the mask, bringing the second gate-insulating layer into contact with the first solution, in order to etch the second gate-insulating layer;
   after etching the second gate-insulating layer, bringing the first gate-insulating layer into contact with the second solution, in order to etch the first gate-insulating layer; and
   removing the mask.

7. The method for manufacturing the field effect transistor according to claim 1, wherein the second oxide contains at least one of aluminum and boron.

8. The method for manufacturing the field effect transistor according to claim 1, wherein the first oxide is a paraelectric amorphous oxide.

9. The method for manufacturing the field effect transistor according to claim 1, wherein the first oxide contains at least one of aluminum, titanium, zirconium, hafnium, niobium, and tantalum.

10. The method for manufacturing the field effect transistor according to claim 1, wherein the active layer is made of an oxide semiconductor.

11. The method for manufacturing the field effect transistor according to claim 1, wherein the gate-insulating layer, the active layer, and the passivation layer are formed on an insulating substrate.

12. The method for manufacturing the field effect transistor according to claim 1, wherein the active layer is a semiconductor substrate, and wherein the gate-insulating layer and the passivation layer are formed on the semiconductor substrate.

13. A method for manufacturing a volatile semiconductor memory element, the method comprising:
   a) forming a field effect transistor according to the method of claim 1;

b) forming a first capacitor-electrode connected with a drain-electrode of the field effect transistor;

c) forming a second capacitor-electrode; and d) forming a capacitor-dielectric layer between the first capacitor-electrode the second capacitor-electrode.

14. The method for manufacturing the volatile semiconductor memory element according to claim 13, wherein the d) forming the capacitor-dielectric layer includes:

forming the first oxide; and bringing the first oxide into contact with the first solution in order to etch the oxide.

15. A method for manufacturing a non-volatile semiconductor memory element, the method comprising:

forming a field effect transistor according to the method of claim 1; and forming a second gate-insulating layer and a floating gate-electrode between the active layer and the gate-insulating layer.

16. A method for manufacturing a display element, the method comprising:

a) forming a drive-circuit including a field effect transistor; and b) forming a light-control element for controlling output of light in accordance with a driving signal obtained from the drive-circuit, wherein the a) forming the drive-circuit includes forming the field effect transistor according to the method of claim 1.

17. The method for manufacturing the display element according to claim 16, wherein the light-control element is any one of an electro luminescence element, an electrochromic element, a liquid crystal element, an electrophoretic element, or an electrowetting element.

18. A method for manufacturing an image display device including a screen and a display-controlling device, the screen including a plurality of display elements arranged in a matrix, the display-controlling device being configured to specifically control each of the plurality of display elements, the method comprising a process of forming the plurality of display elements, wherein the process of forming the plurality of display elements includes forming a display element according to the method of claim 16.

19. A method for manufacturing a system including an image display device and an image-data-generating unit, the image-data-generating unit being configured to provide image data to the image display device, the method comprising a process of forming the image display device, wherein the process of forming the image display device includes forming the image display device according to the method of claim 18.

20. A method for manufacturing a field effect transistor including a gate-insulating layer, an active layer, and a passivation layer, the method comprising:

a first process of forming the gate-insulating layer; and a second process of forming the passivation layer, wherein at least one of the first process and the second process includes:

forming a first oxide containing an alkaline earth metal and at least one of gallium, scandium, yttrium, and a lanthanoid; and etching the first oxide by use of a first solution containing at least one of hydrochloric acid, oxalic acid, nitric acid, phosphoric acid, acetic acid, sulfuric acid, and hydrogen peroxide water, wherein the gate-insulating layer includes a first gate-insulating layer and a second gate-insulating layer, and wherein the first process includes:

forming the first gate-insulating layer containing the second oxide, the second oxide containing silicon and an alkaline earth metal;

forming the second gate-insulating layer containing the first oxide, the second gate-insulating layer being arranged in contact with the first gate-insulating layer;

bringing the first gate-insulating layer into contact with the second solution containing at least one of hydrofluoric acid, ammonium fluoride, ammonium hydrogen fluoride, and organic alkali, in order to etch the first gate-insulating layer; and bringing the second gate-insulating layer into contact with the first solution in order to etch the second gate-insulating layer.

* * * * *